US012247270B2

(12) United States Patent
Akai et al.

(10) Patent No.: US 12,247,270 B2
(45) Date of Patent: Mar. 11, 2025

(54) ANISOTROPIC CONDUCTIVE FILM AND METHOD FOR PRODUCING THE ANISOTROPIC CONDUCTIVE FILM INCLUDING A BASE MATERIAL HAVING RECESSES AND SOLDER PARTICLES FORMED INSIDE THE RECESSES

(71) Applicant: Showa Denko Materials Co., Ltd., Tokyo (JP)

(72) Inventors: Kunihiko Akai, Tokyo (JP); Yoshinori Ejiri, Tokyo (JP); Yuuhei Okada, Tokyo (JP); Toshimitsu Moriya, Tokyo (JP); Shinichirou Sukata, Tokyo (JP); Masayuki Miyaji, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 852 days.

(21) Appl. No.: 17/255,980

(22) PCT Filed: Jun. 26, 2019

(86) PCT No.: PCT/JP2019/025496
§ 371 (c)(1),
(2) Date: Dec. 23, 2020

(87) PCT Pub. No.: WO2020/004510
PCT Pub. Date: Jan. 2, 2020

(65) Prior Publication Data
US 2021/0114147 A1    Apr. 22, 2021

(30) Foreign Application Priority Data

Jun. 26, 2018  (JP) .................................. 2018-121088
Jan. 30, 2019  (JP) .................................. 2019-014850

(51) Int. Cl.
*C22C 13/02* (2006.01)
*B22F 1/00* (2022.01)
(Continued)

(52) U.S. Cl.
CPC ................ *C22C 13/02* (2013.01); *B22F 1/00* (2013.01); *B22F 1/102* (2022.01); *B23K 35/262* (2013.01); *C22C 28/00* (2013.01); *H01B 1/22* (2013.01)

(58) Field of Classification Search
CPC ... B22F 1/00; B22F 1/102; H01B 1/02; H01B 1/00; H05K 3/32; B23K 25/40; B23K 35/26; B23K 35/262
See application file for complete search history.

(56) References Cited

U.S. PATENT DOCUMENTS 5,527,628 A   6/1996 Anderson et al.
5,542,174 A   8/1996 Chiu
(Continued)

FOREIGN PATENT DOCUMENTS

CN   1505550   6/2004
CN   1642392   7/2005
(Continued)

OTHER PUBLICATIONS

Derrick Amoabeng et al., "Bulk soldering: Conductive polymer composites filled with copper particles and solder", Colloids and Surfaces A: Physicochemical and Engineering Aspects, Jun. 4, 2018, pp. 624-632, vol. 553.

*Primary Examiner* — Khiem D Nguyen
(74) *Attorney, Agent, or Firm* — JCIPRNET

(57) ABSTRACT

A method for producing an anisotropic conductive film, which includes: a preparation step wherein a base material that has a plurality of recesses and solder fine particles are prepared; an accommodation step wherein at least some of
(Continued)

the solder fine particles are accommodated in the recesses; a fusing step wherein the solder fine particles accommodated in the recesses are fused, thereby forming solder particles within the recesses; a transfer step wherein an insulating resin material is brought into contact with the recess opening side of the base material that includes the solder particles in the recesses, thereby obtaining a first resin layer on which the solder particles have been transferred; and a layering step wherein a second resin layer that is configured from an insulating resin material is formed on the surface of the first resin layer, on which the solder particles have been transferred, thereby obtaining an anisotropic conductive film.

12 Claims, 27 Drawing Sheets

(51) Int. Cl.
*B22F 1/102* (2022.01)
*B23K 35/26* (2006.01)
*C22C 28/00* (2006.01)
*H01B 1/22* (2006.01)

(56) References Cited

U.S. PATENT DOCUMENTS

| | | | |
|---|---|---|---|
| 6,025,258 A | 2/2000 | Ochiai et al. | |
| 6,077,380 A * | 6/2000 | Hayes | H01L 24/11 |
| | | | 156/283 |
| 6,293,456 B1 | 9/2001 | MacKay et al. | |
| 6,660,944 B1 | 12/2003 | Murata et al. | |
| 6,802,446 B2 * | 10/2004 | Chaudhuri | C09J 163/00 |
| | | | 228/175 |
| 7,134,879 B2 * | 11/2006 | Sugimoto | G02F 1/13452 |
| | | | 428/323 |
| 10,199,358 B2 * | 2/2019 | Akutsu | H01L 24/27 |
| 10,624,215 B2 * | 4/2020 | Tanaka | H05K 3/323 |
| 11,001,686 B2 * | 5/2021 | Miyake | B32B 9/005 |
| 2001/0008250 A1 | 7/2001 | Hembree | |
| 2002/0100972 A1 * | 8/2002 | Kitajima | H01L 21/6835 |
| | | | 257/734 |
| 2003/0102101 A1 | 6/2003 | Farnworth | |
| 2004/0016456 A1 * | 1/2004 | Murozono | H01L 31/022425 |
| | | | 136/250 |
| 2004/0110366 A1 | 6/2004 | MacKay et al. | |
| 2008/0173398 A1 * | 7/2008 | Yasuda | H01L 24/84 |
| | | | 156/326 |
| 2008/0284046 A1 * | 11/2008 | Karashima | H01L 24/742 |
| | | | 228/9 |
| 2009/0180914 A1 * | 7/2009 | Tobita | B22F 1/102 |
| | | | 419/5 |
| 2010/0053924 A1 * | 3/2010 | Ueshima | H01R 4/04 |
| | | | 252/514 |
| 2014/0083740 A1 | 3/2014 | Ishizawa et al. | |
| 2014/0191382 A1 * | 7/2014 | Asami | H05K 3/3485 |
| | | | 257/676 |
| 2015/0008022 A1 | 1/2015 | Masui et al. | |
| 2015/0214176 A1 * | 7/2015 | Shinohara | B32B 37/10 |
| | | | 361/767 |
| 2017/0246711 A1 | 8/2017 | Kawasaki et al. | |
| 2017/0309590 A1 * | 10/2017 | Tsukao | H01L 24/32 |
| 2018/0218990 A1 * | 8/2018 | Akutsu | H01L 24/81 |
| 2019/0206587 A1 | 7/2019 | Sou et al. | |
| 2019/0293683 A1 | 9/2019 | Hayashi et al. | |
| 2020/0299474 A1 | 9/2020 | Tsukao | |
| 2021/0082798 A1 | 3/2021 | Lu et al. | |
| 2021/0114147 A1 | 4/2021 | Akai et al. | |
| 2021/0238456 A1 | 8/2021 | Matsubara | |

FOREIGN PATENT DOCUMENTS

| | | |
|---|---|---|
| CN | 1253279 | 4/2006 |
| CN | 102272863 | 12/2011 |
| CN | 102415225 | 4/2012 |
| CN | 103189159 | 7/2013 |
| CN | 104541416 | 4/2015 |
| CN | 105900224 | 8/2016 |
| CN | 106486183 | 3/2017 |
| CN | 106688051 | 5/2017 |
| CN | 107077914 | 8/2017 |
| CN | 107112657 | 8/2017 |
| CN | 107267076 | 10/2017 |
| JP | H01184201 | 7/1989 |
| JP | H0523887 | 2/1993 |
| JP | H0927676 | 1/1997 |
| JP | H0982713 | 3/1997 |
| JP | H09150296 | 6/1997 |
| JP | 3869785 | 1/2007 |
| JP | 2010036234 | 2/2010 |
| JP | 4773685 | 9/2011 |
| JP | 2014017213 | 1/2014 |
| JP | 2014060368 | 4/2014 |
| JP | 2015136735 | 7/2015 |
| JP | 2016076494 | 5/2016 |
| JP | 2016126878 | 7/2016 |
| JP | 6187665 | 8/2017 |
| JP | 2017195180 | 10/2017 |
| JP | 7452419 | 3/2024 |
| TW | 200632134 | 9/2006 |
| TW | 201530562 | 8/2015 |
| TW | 201546828 | 12/2015 |
| TW | 201721660 | 6/2017 |
| WO | 03035308 | 5/2003 |

* cited by examiner (a)

(b)

(a)

(b)

(c)

(d)

(e)

(f)

(g)

(h)

(a)

(b)

(a)

(b)

(a)

(b)

(a)

(b)

(a)

(b)

ANISOTROPIC CONDUCTIVE FILM AND METHOD FOR PRODUCING THE ANISOTROPIC CONDUCTIVE FILM INCLUDING A BASE MATERIAL HAVING RECESSES AND SOLDER PARTICLES FORMED INSIDE THE RECESSES

CROSS-REFERENCE TO RELATED APPLICATION

This application is a 371 application of the International PCT application serial no. PCT/JP2019/025496 filed on Jun. 26, 2019, which claims the priority benefits of Japan Patent Application No. 2018-121088, filed on Jun. 26, 2018 and Japan Patent Application No. 2019-014850, filed on Jan. 30, 2019. The entirety of each of the above-mentioned patent applications is hereby incorporated by reference herein and made a part of this specification.

TECHNICAL FIELD

The present invention relates to an anisotropic conductive film and a method for producing the same, and a method for producing a connection structure.

BACKGROUND ART

Methods of mounting a liquid crystal driving IC on a glass panel for liquid crystal display can be roughly classified into two types: chip-on-glass (COG) mounting and chip-on-flex (COF) mounting. In the COG mounting, a liquid crystal driving IC is directly bonded onto a glass panel using an anisotropic conductive adhesive containing conductive particles. On the other hand, in the COF mounting, a liquid crystal driving IC is bonded to a flexible tape having a metal wiring, and bonded to a glass panel using an anisotropic conductive adhesive containing conductive particles. The term "anisotropic" here means that a material conducts in a pressurization direction and maintains an insulation property in a non-pressurization direction.

Incidentally, with the recent increase in the definition of liquid crystal displays, metal bumps, which are circuit electrodes of the liquid crystal driving IC, have become smaller in pitch and area, and therefore the conductive particles of the anisotropic conductive adhesive flow out between adjacent circuit electrodes, which may cause short circuiting. In particular, this tendency is significant in the COG mounting. When conductive particles flow out between adjacent circuit electrodes, the number of conductive particles captured between the metal bumps and the glass panel decreases, and the connection resistance between circuit electrodes that face each other increases, which may cause a connection failure. Such a tendency becomes more significant when less than 20,000 conductive particles/mm$^2$ are added per unit area.

Regarding a method for solving these problems, a method of attaching a plurality of insulating particles (child particles) to the surfaces of conductive particles (mother particles) and forming composite particles has been proposed. For example, in Patent Literature 1 and 2, a method of attaching spherical resin particles to the surfaces of conductive particles has been proposed. In addition, insulation-coated conductive particles having excellent insulation reliability even if 70,000 conductive particles/mm$^2$ or more are changed per unit area have been proposed. In Patent Literature 3, insulation-coated conductive particles in which first insulating particles and second insulating particles having a lower glass transition temperature than the first insulating particles are attached to the surfaces of conductive particles have been proposed. In addition, in Patent Literature 4, a conductive paste containing solder particles has been proposed in order to make a more firm connection between electrodes.

REFERENCE LIST

Patent Literature

Patent Literature 1: Japanese Patent No. 4773685
Patent Literature 2: Japanese Patent No. 3869785
Patent Literature 3: Japanese Patent Laid-Open No. 2014-17213
Patent Literature 4: Japanese Patent Laid-Open No. 2016-76494

SUMMARY OF INVENTION

Technical Problem

Incidentally, when the connecting parts of the circuit member to be electrically connected to each other are very small (for example, the bump area is less than 2,000 μm$^2$), it is preferable to increase the amount of conductive particles in order to obtain stable conduction reliability. For this reason, there are cases in which 100,000 conductive particles/mm$^2$ or more are added per unit area. However, when the connecting parts are very small in this manner, even if the insulation-coated conductive particles described in Patent Literature 1 to 3 are used, it is difficult to achieve a balance between conduction reliability and insulation reliability, and there is still room for improvement. On the other hand, when a conductive paste containing solder particles described in Patent Literature 4 is used, conduction reliability can be secured, but there is a problem of the insulation reliability being insufficient.

The present invention has been made in view of the above circumstances, and an objective of the present invention is to provide an anisotropic conductive film beneficial for producing a connection structure having both excellent insulation reliability and conduction reliability even if connecting parts of a circuit member to be electrically connected to each other are very small, and a method for producing the same. In addition, an objective of the present invention is to provide a method for producing a connection structure using the anisotropic conductive film.

Solution to Problem

In order to solve the above problems, the inventors have investigated reasons why the insulation resistance value is lowered in conventional methods. As a result, in the invention described in Patent Literature 1 and 2, it was found that a covering property of insulating particles coated on the surface of conductive particles deteriorates and even if the amount of conductive particles added per unit area is about 20,000/mm$^2$ or less, the insulation resistance value tends to be low.

In the invention described in Patent Literature 3, in order to make up for the shortcomings of the invention described in Patent Literature 1 and 2, first insulating particles and second insulating particles having a lower glass transition temperature than the first insulating particles are attached to the surfaces of conductive particles. Thereby, when the amount of conductive particles added per unit area is about 70,000/mm², the sufficiently high insulation resistance value can be maintained. However, it was found that, when the amount of conductive particles added per unit area is 100,000/mm² or more, the insulation resistance value may be insufficient.

In the invention described in Patent Literature 4, it was found that, in the case of a conductive paste containing solder particles is used, compared to the invention described in Patent Literature 1 to 3, although it is recognized that excellent conduction reliability can be achieved, when connecting parts of the circuit member to be electrically connected to each other are very small (for example, a bump area of less than 2,000 μm²), the insulation reliability may be insufficient because solder particles tend to remain in parts other than a part connecting a bump and a bump.

The present invention has been made based on the above findings by the inventors. One aspect of the present invention relates to a method for producing an anisotropic conductive film including a preparation step in which a base material having a plurality of recesses and solder fine particles are prepared; an accommodation step in which at least some of the solder fine particles are accommodated in the recesses; a fusing step in which the solder fine particles accommodated in the recesses are fused and the solder particles are formed inside the recesses; a transfer step in which an insulating resin material is brought into contact with an opening side of the recesses of the base material in which the solder particles are accommodated in the recesses and a first resin layer to which the solder particles are transferred is obtained; and a layering step in which a second resin layer formed of an insulating resin material is formed on a surface of the first resin layer on the side to which the solder particles are transferred and thereby an anisotropic conductive film is obtained.

According to the method for producing an anisotropic conductive film, uniform solder particles having a narrow particle size distribution and a stable shape can be obtained according to the preparation step, the accommodation step and the fusing step. In addition, when the transfer step is performed, it is possible to produce an anisotropic conductive film in which solder particles that are separated from each other are disposed in a predetermined region of the anisotropic conductive film in the thickness direction. For example, when an anisotropic conductive film is produced using a base material having a recess pattern corresponding to the pattern of electrodes to be connected, it is possible to sufficiently control the positions and the number of solder particles in the anisotropic conductive film. When a connection structure using such an anisotropic conductive film is produced, it is possible to secure a sufficient number of solder particles present between a pair of electrodes to be electrically connected to each other, and it is possible to sufficiently reduce the number of solder particles present between adjacent electrodes between which insulation needs to be maintained. Thereby, even if the connecting parts of the circuit member are very small, it is possible to produce a connection structure having both excellent insulation reliability and conduction reliability sufficiently efficiently and stably.

In one aspect, the solder particles formed in the fusing step may have an average particle diameter of 1 μm to 30 μm and a C.V. value of 20% or less.

In one aspect, the C.V value of the solder fine particles prepared in the preparation step may be more than 20%. When such solder fine particles are used, a rate of filling the solder fine particles into the recesses increases, and more uniform solder particles can be easily obtained.

In one aspect, before the fusing step, the solder fine particles accommodated in the recess may be exposed to a reducing atmosphere.

In one aspect, in the fusing step, the solder fine particles accommodated in the recesses may be fused under a reducing atmosphere.

In one aspect, the fusing step may be a step in which the solder fine particles accommodated in the recesses are fused under an atmosphere with a temperature equal to or higher than a melting point of the solder fine particles.

In one aspect, the solder fine particles prepared in the preparation step may include at least one selected from the group consisting of tin, tin alloys, indium and indium alloys.

In one aspect, the solder fine particles prepared in the preparation step may include at least one selected from the group consisting of In—Bi alloys, In—Sn alloys, In—Sn—Ag alloys, Sn—Au alloys, Sn—Bi alloys, Sn—Bi—Ag alloys, Sn—Ag—Cu alloys and Sn—Cu alloys.

In one aspect, the solder particles may be exposed on the surface of the first resin layer obtained in the transfer step and the solder particles may be embedded on the side of the surface. When solder particles are embedded on the side of the surface of the first resin layer, the insulating resin material may be caused to enter the recesses in the transfer step.

In one aspect, the transfer step may include a step in which the insulating resin material is cured after the solder particles are transferred. Thereby, the transferred solder particles can be fixed.

The method for producing an anisotropic conductive film according to one aspect may further include a coating step in which surfaces of the solder particles formed in the fusing step are coated with a flux component.

Another aspect of the present invention relates to an anisotropic conductive film including an insulating film formed of an insulating resin material and a plurality of solder particles disposed in the insulating film. In the anisotropic conductive film, the solder particles have an average particle diameter of 1 μm to 30 μm and a C.V. value of 20% or less. In addition, in a vertical cross section of the anisotropic conductive film, the solder particles that are separated from adjacent solder particles are disposed in a horizontal direction. Here, the term "vertical cross section" used here refers to a cross section orthogonal to a main surface of the anisotropic conductive film and the term "horizontal direction" refers to a direction parallel to the main surface of the anisotropic conductive film.

In one aspect, the solder particles may have a flat portion on a part of the surface.

In one aspect, a ratio (A/B) of a diameter A of the flat portion to a diameter B of the solder particles may satisfy the following formula:

$$0.01 < A/B < 1.0$$

In one aspect, when a quadrangle circumscribing a projected image of the solder particle is created by two pairs of parallel lines, and distances between opposite sides are set as X and Y (where Y<X), X and Y may satisfy the following formula:

$$0.8 < Y/X < 1.0.$$

In one aspect, the solder particles may include at least one selected from the group consisting of tin, tin alloys, indium and indium alloys.

In one aspect, the solder particles may include at least one selected from the group consisting of In—Bi alloys, In—Sn alloys, In—Sn—Ag alloys, Sn—Au alloys, Sn—Bi alloys, Sn—Bi—Ag alloys, Sn—Ag—Cu alloys and Sn—Cu alloys.

Still another aspect of the present invention relates to a method for producing a connection structure using the anisotropic conductive film. The production method includes preparing a first circuit member including a first substrate and a first electrode provided on the first substrate; preparing a second circuit member including a second electrode that is electrically connected to the first electrode; disposing an anisotropic conductive film between a surface of the first circuit member having the first electrode and a surface of the second circuit member having the second electrode; and electrically connecting the first electrode to the second electrode via a solder and adhering the first circuit member to the second circuit member by heating a laminate including the first circuit member, the anisotropic conductive film, and the second circuit member while pressurizing is performed in a thickness direction of the laminate.

According to the method for producing a connection structure, even if a part connecting a first electrode and a second electrode is very small, it is possible to produce a connection structure having both excellent insulation reliability and conduction reliability sufficiently efficiently and stably. That is, when the laminate is heated while pressurizing is performed in a thickness direction of the laminate, the solder particles are melted and gather between the first electrode and the second electrode, and the first electrode and the second electrode are bonded via solder. Thereby, it is possible to obtain favorable conduction reliability between the first electrode and the second electrode. In addition to this, when the solder particles are melted and gather between the first electrode and the second electrode, since the solder particles are unlikely to remain between adjacent electrodes between which insulation needs to be maintained, short circuiting occurs between the electrodes and high insulation reliability can be obtained.

Advantageous Effects of Invention

According to the present invention, there are provided an anisotropic conductive film beneficial for producing a connection structure having both excellent insulation reliability and conduction reliability even if connecting parts of a circuit member to be electrically connected to each other are very small, and a method for producing the same. In addition, according to the present invention, a method for producing a connection structure using the anisotropic conductive film is provided.

Figure 1:
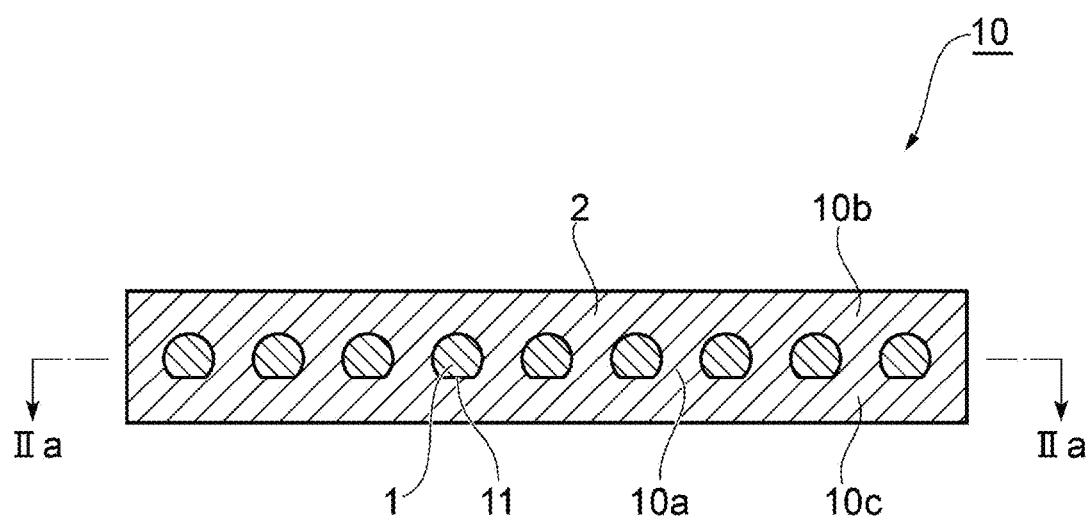
FIG. 1 is a cross-sectional view schematically showing an anisotropic conductive film according to a first embodiment of the present invention.
Figure 2:
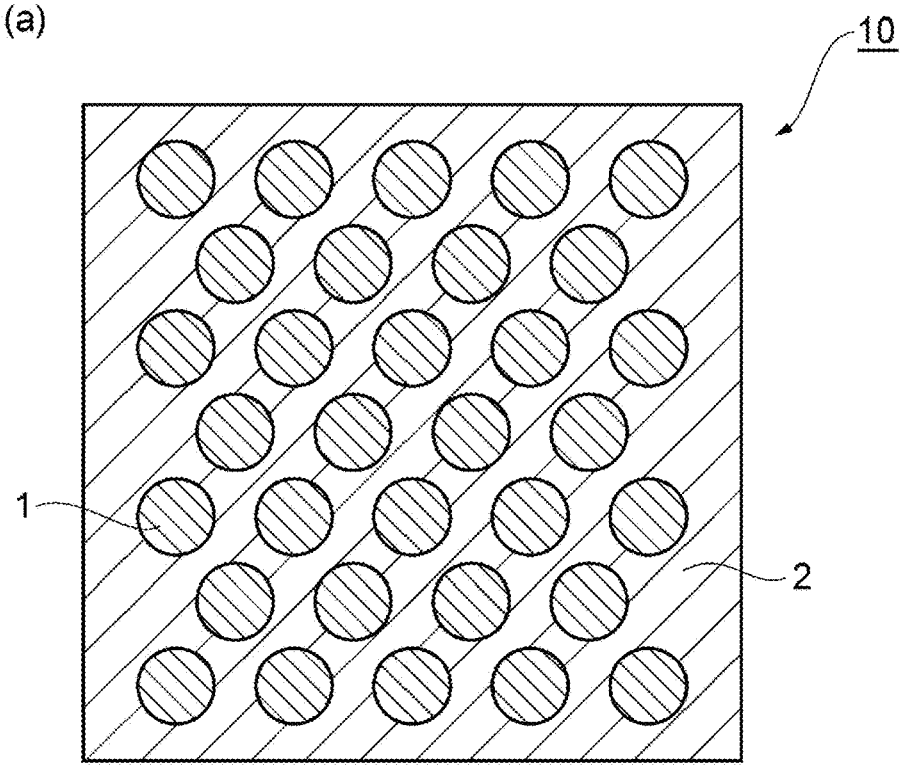
Figure 2:
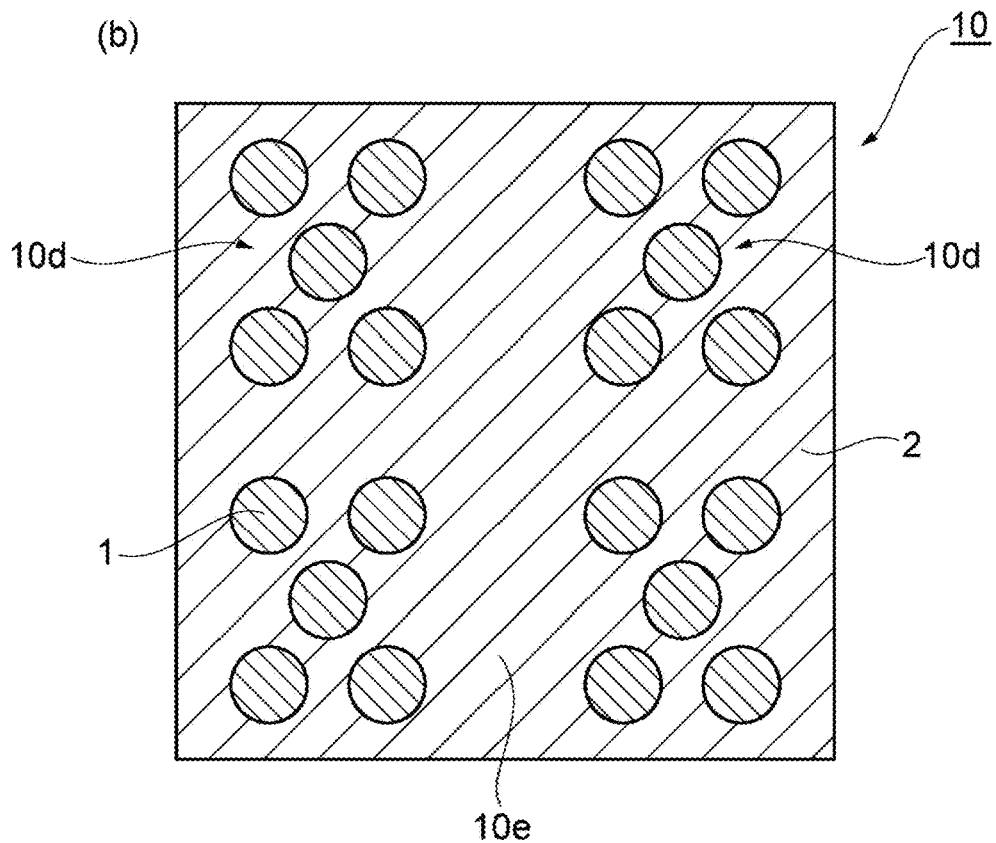

(a) of FIG. 2 is a schematic transverse cross-sectional view taken along the line IIa-IIa shown in FIG. 1, and (b) of FIG. 2 is a transverse cross-sectional view schematically showing a modification example of the first embodiment.

Figure 3:
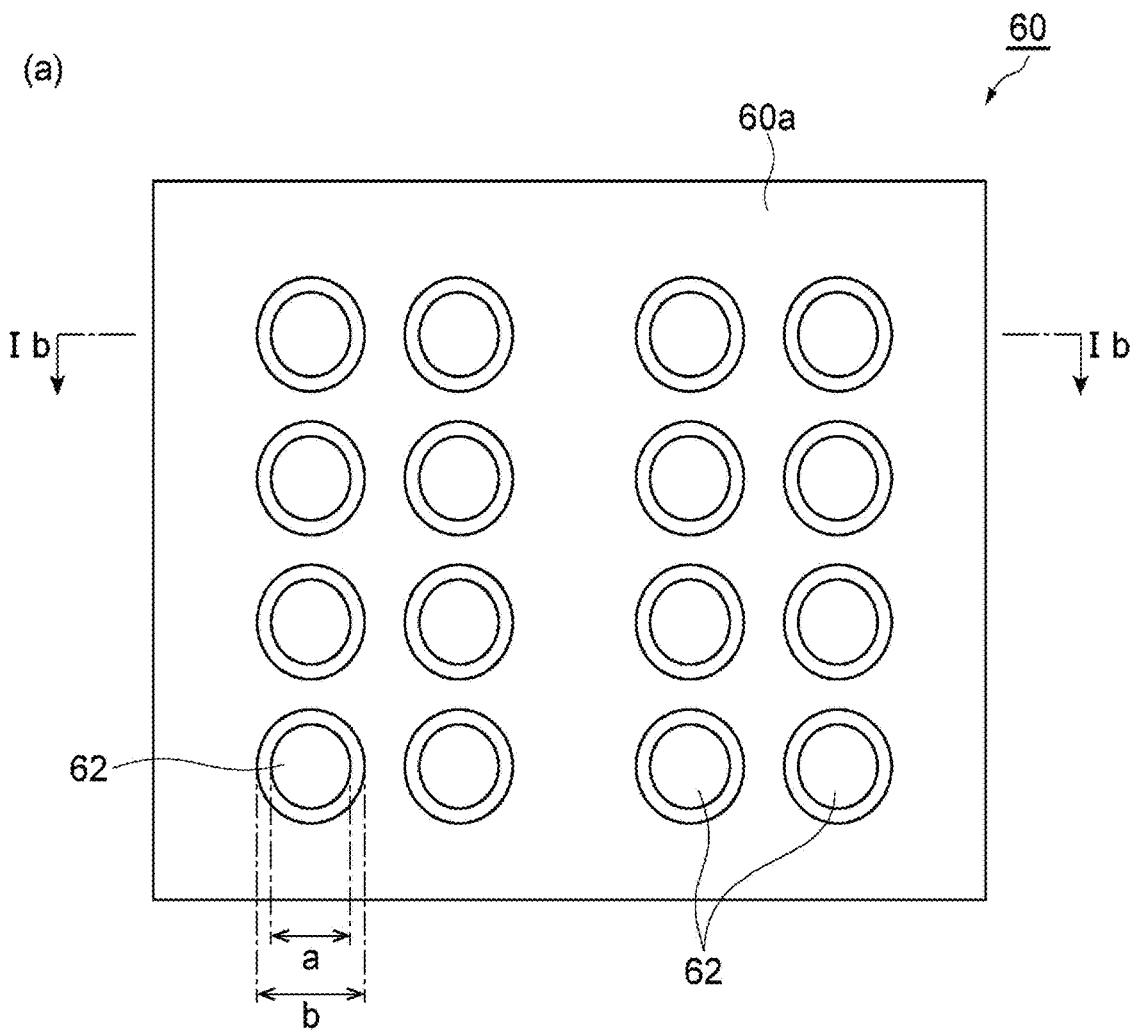
Figure 3:
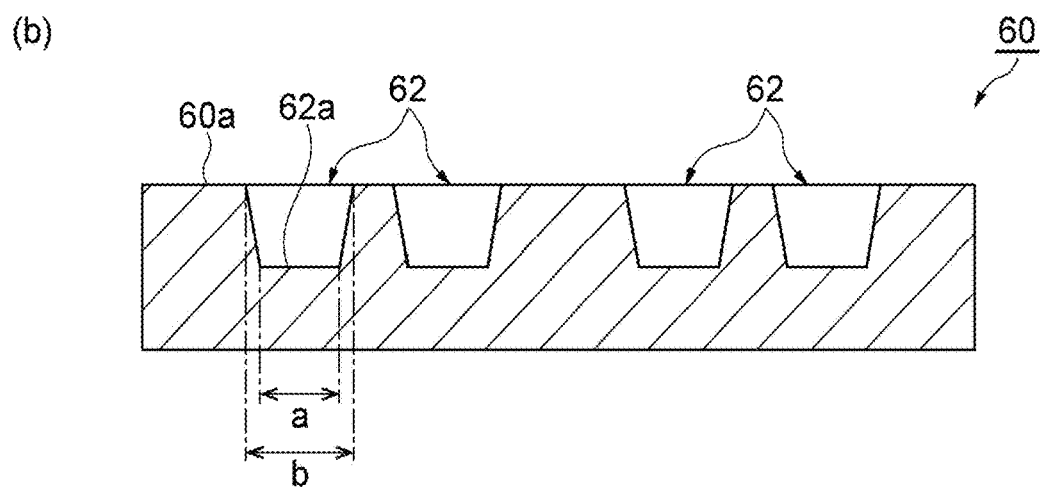

(a) of FIG. 3 is a plan view schematically showing an example of a base material, and (b) of FIG. 3 is a cross-sectional view taken along the line Ib-Ib shown in (a) of FIG. 3.

Figure 4:
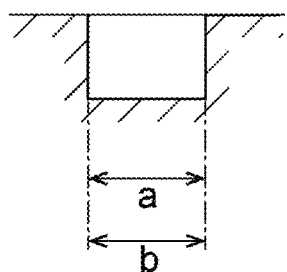
Figure 4:
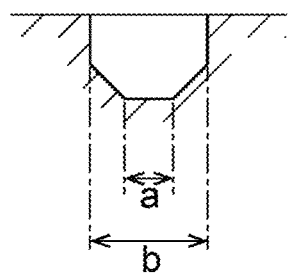
Figure 4:
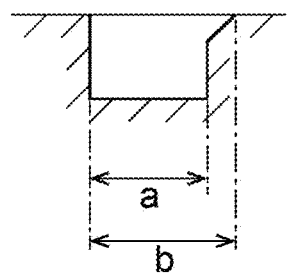
Figure 4:
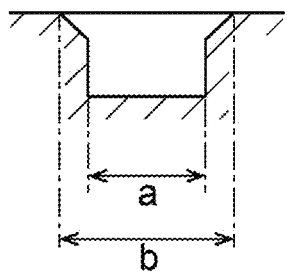
Figure 4:
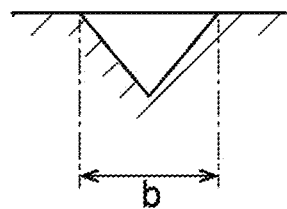
Figure 4:
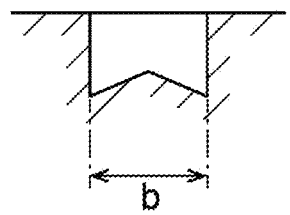
Figure 4:
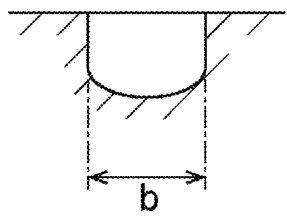
Figure 4:
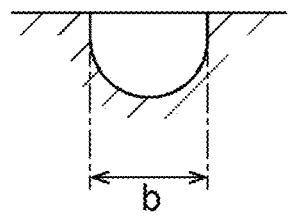

(a) of FIG. 4 to (h) of FIG. 4 are cross-sectional view schematically showing an example of a cross-sectional shape of recesses of the base material.

Figure 5:
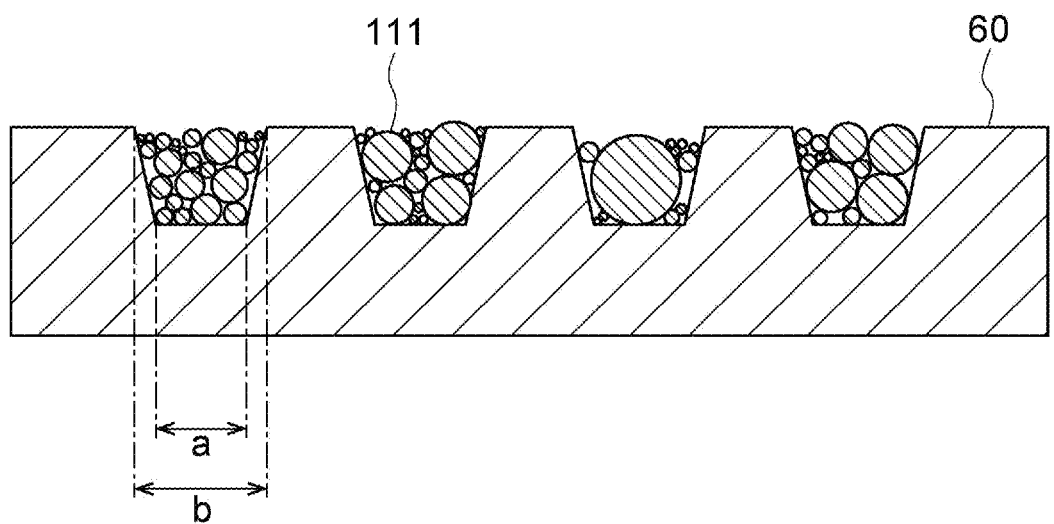

FIG. 5 is a cross-sectional view schematically showing a state in which solder fine particles are accommodated in the recesses of the base material.

Figure 6:
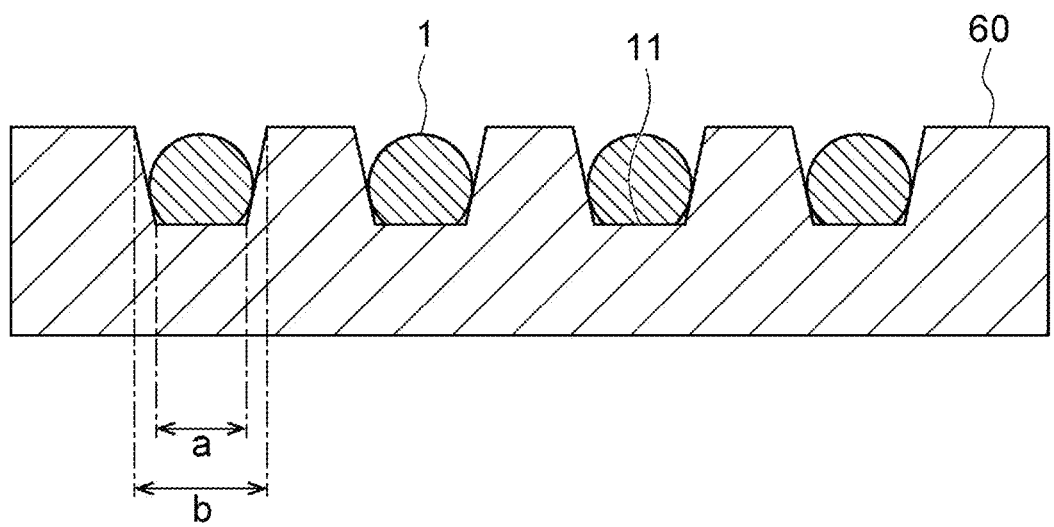

FIG. 6 is a cross-sectional view schematically showing a state in which solder particles are formed in recesses of the base material.

Figure 7:
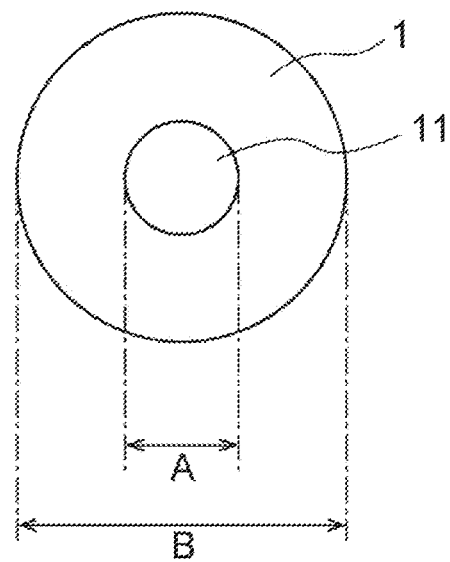
Figure 7:
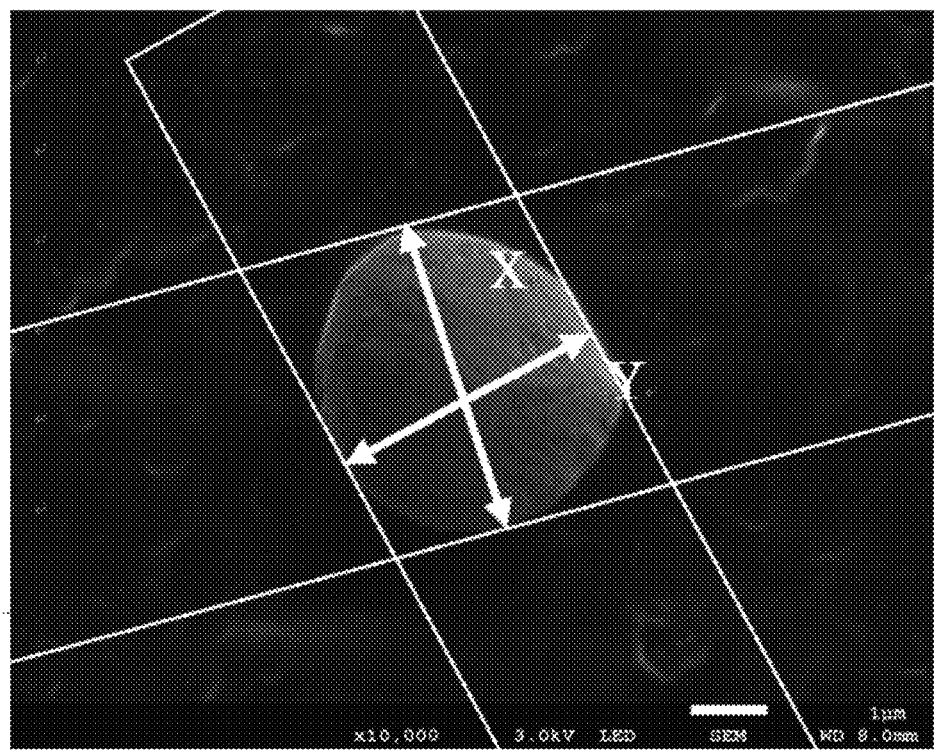

(a) of FIG. 7 is a diagram of solder particles when viewed from the side opposite to an opening part of the recess in FIG. 6, and (b) of FIG. 7 is a diagram showing distances X and Y (where Y≤X) between opposite sides when a quadrangle circumscribing a projected image of a solder particle is created by two pairs of parallel lines.

Figure 8:
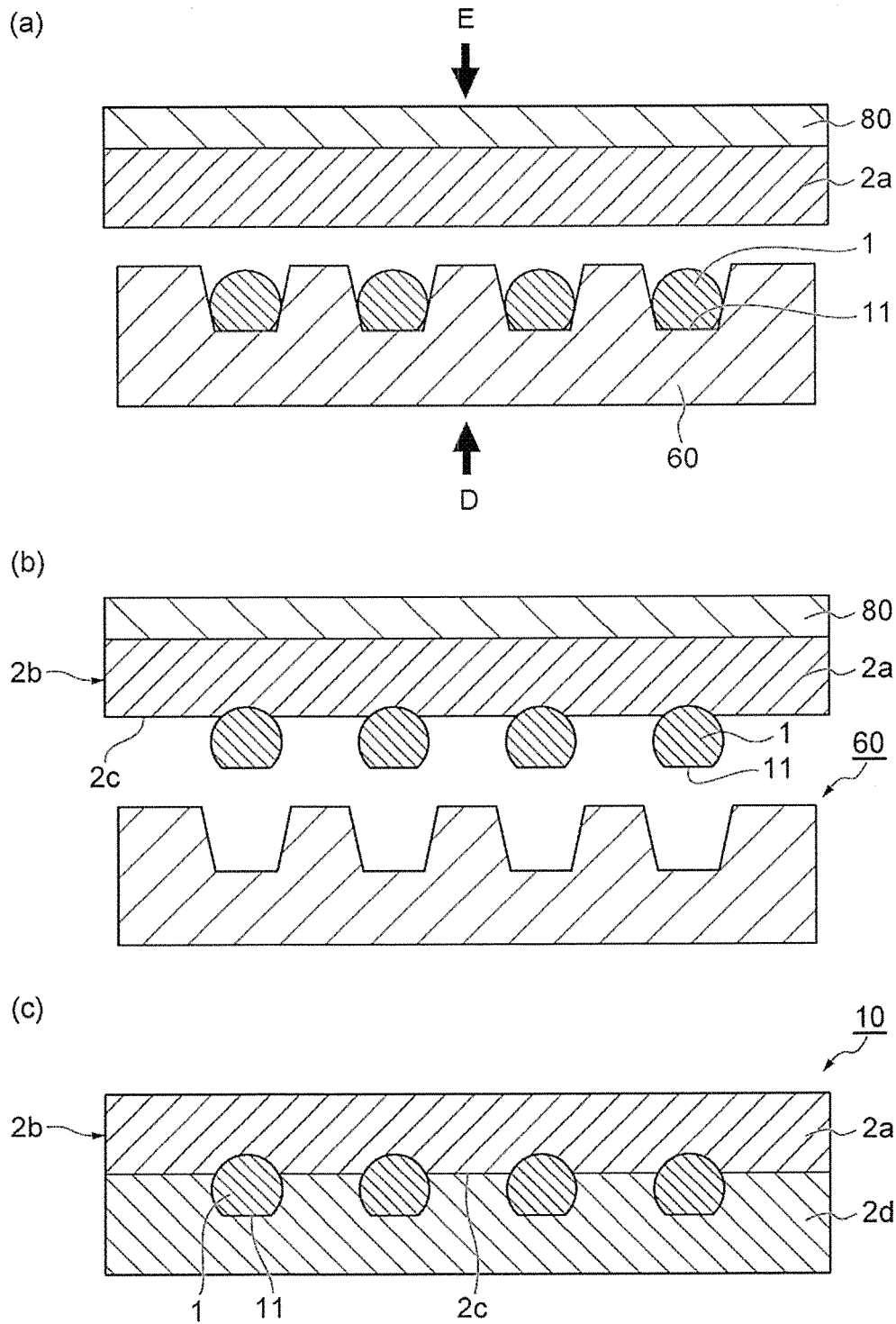

(a) of FIG. 8 to (c) of FIG. 8 are cross-sectional views schematically showing an example of a process of producing the anisotropic conductive film according to the first embodiment.

Figure 9:
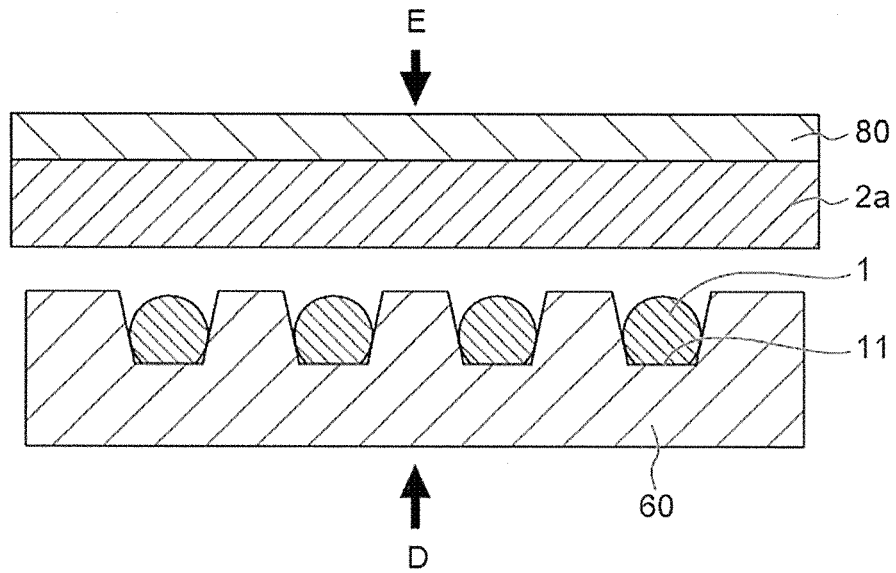
Figure 9:
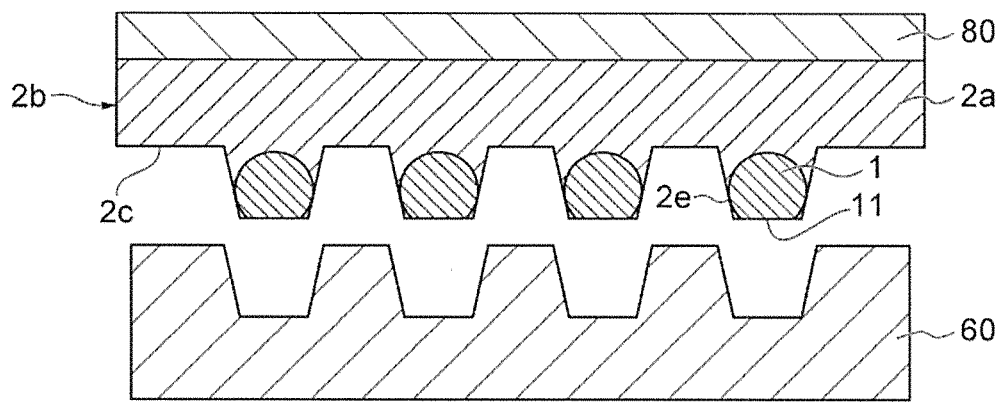
Figure 9:
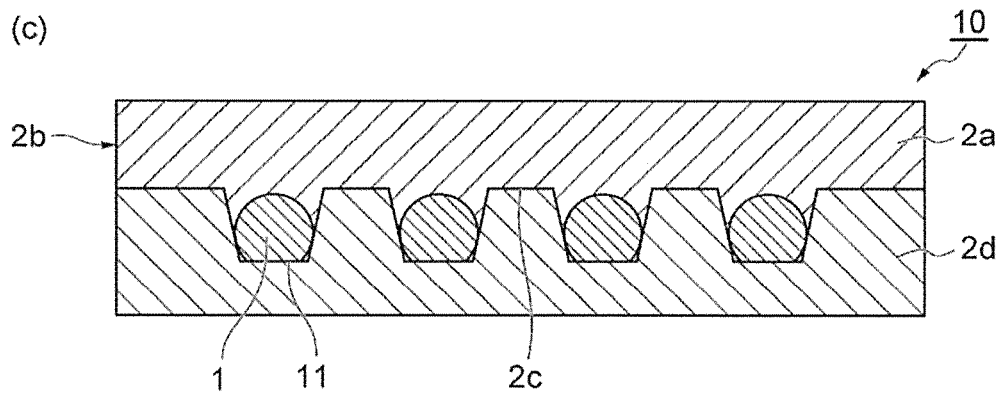

(a) of FIG. 9 to (c) of FIG. 9 are cross-sectional views schematically showing an example of a process of producing an anisotropic conductive film according to a second embodiment.

Figure 10:
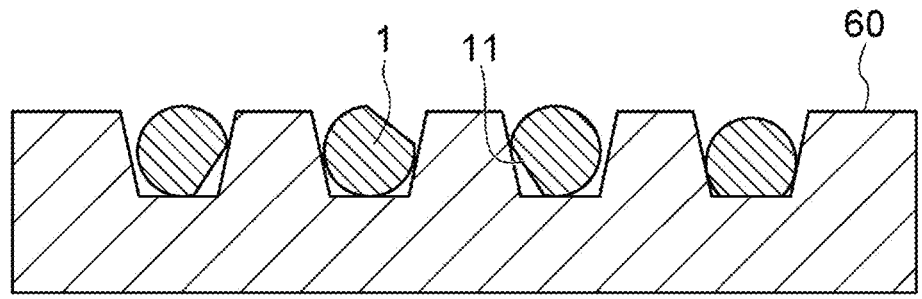
Figure 10:
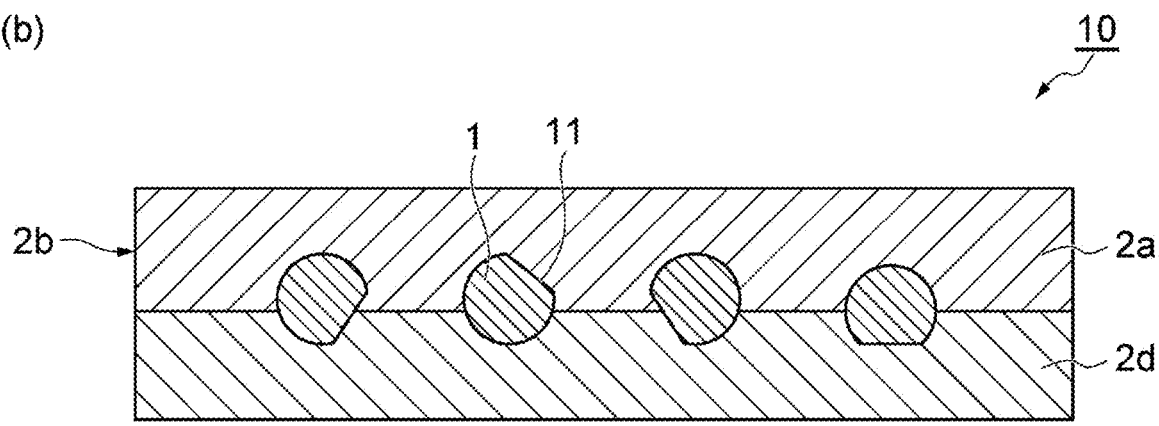

(a) of FIG. 10 and (b) of FIG. 10 are cross-sectional views schematically showing another example of a process of producing an anisotropic conductive film.

Figure 11:
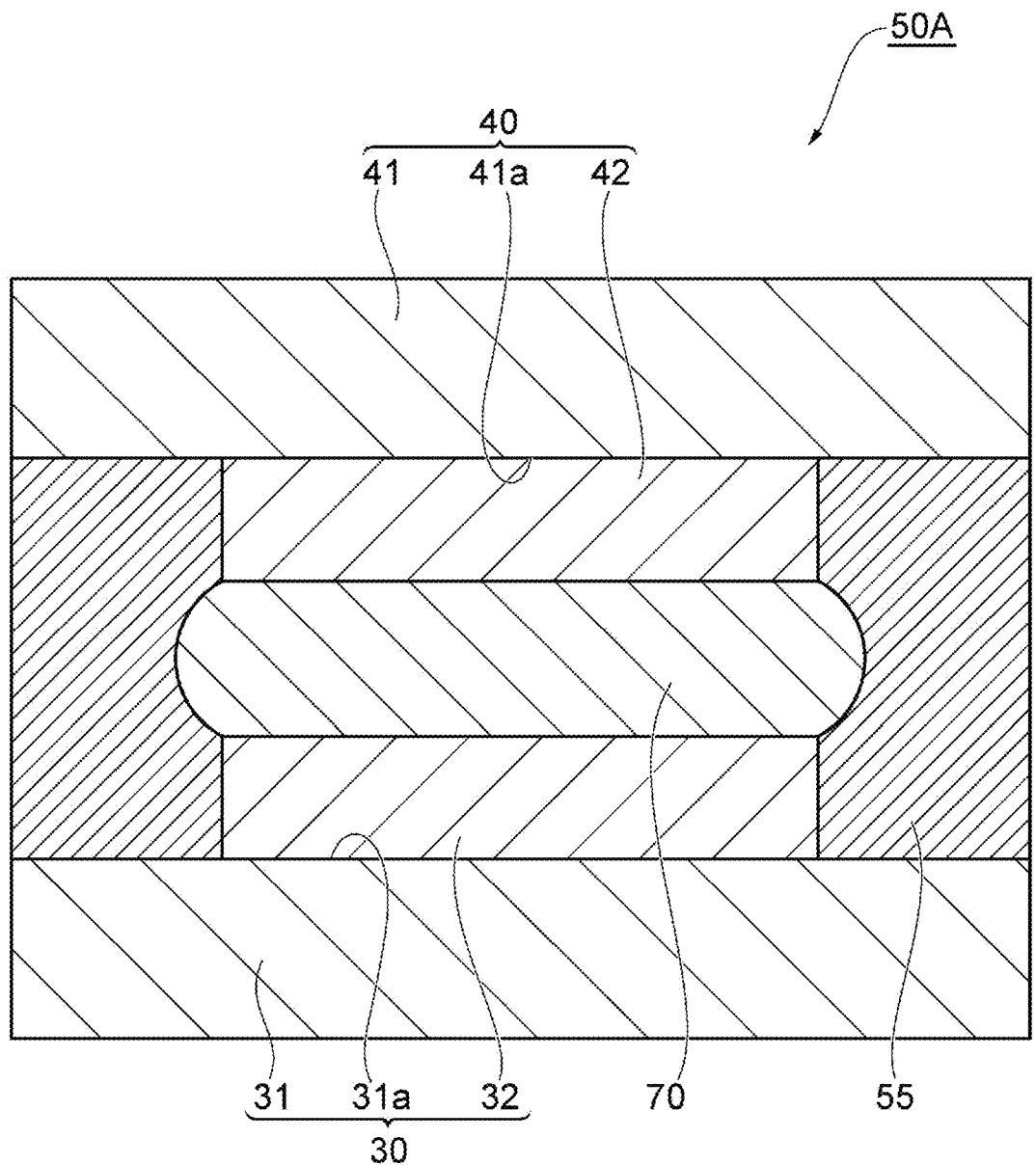

FIG. 11 is a diagram showing an enlarged part of a connection structure according to the present invention and is a cross-sectional view schematically showing a first example of a state in which a first electrode and a second electrode are electrically connected by solder.

Figure 12:
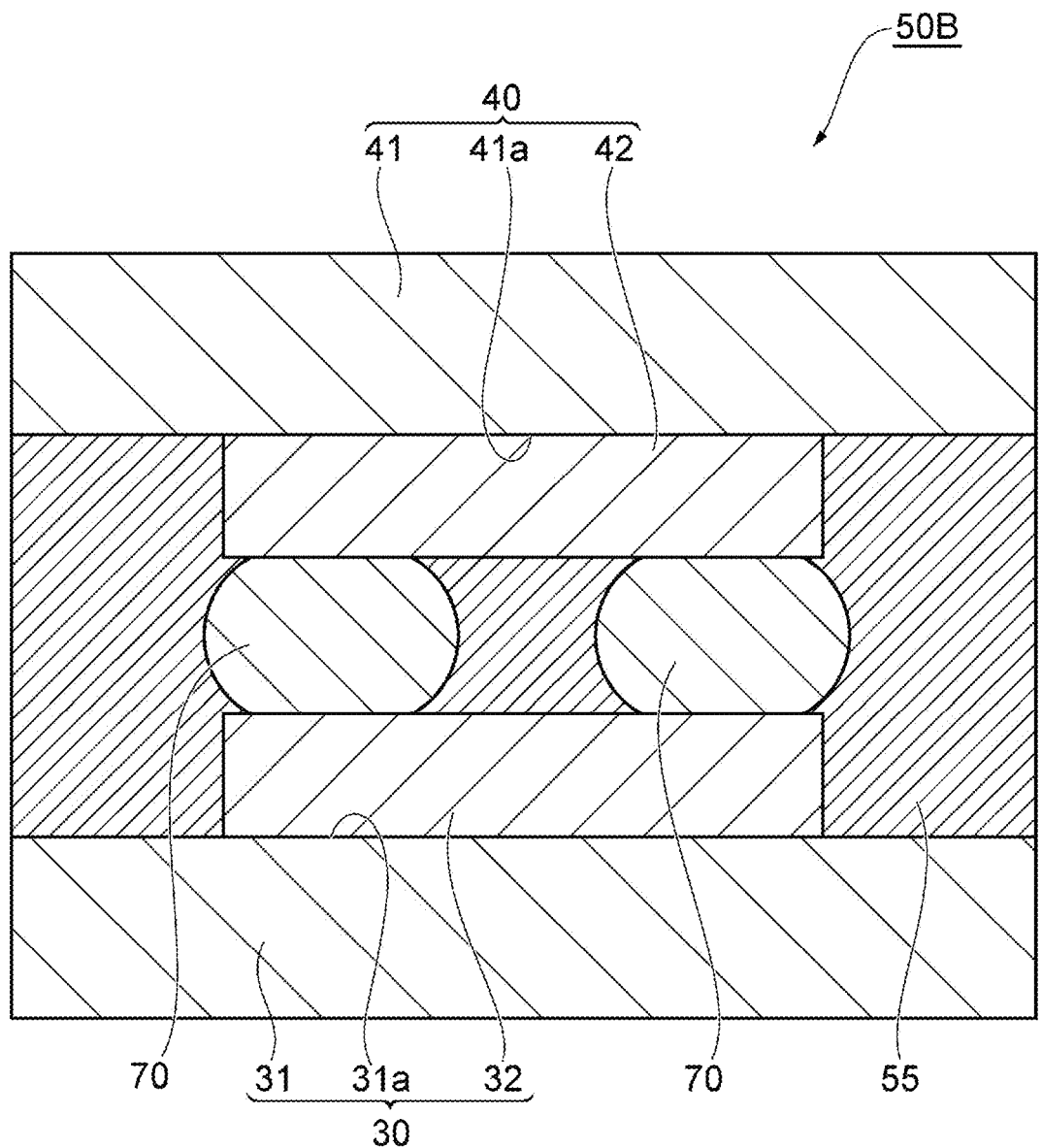

FIG. 12 is a diagram showing an enlarged part of a connection structure according to the present invention and is a cross-sectional view schematically showing a second example of a state in which a first electrode and a second electrode are electrically connected by solder.

Figure 13:
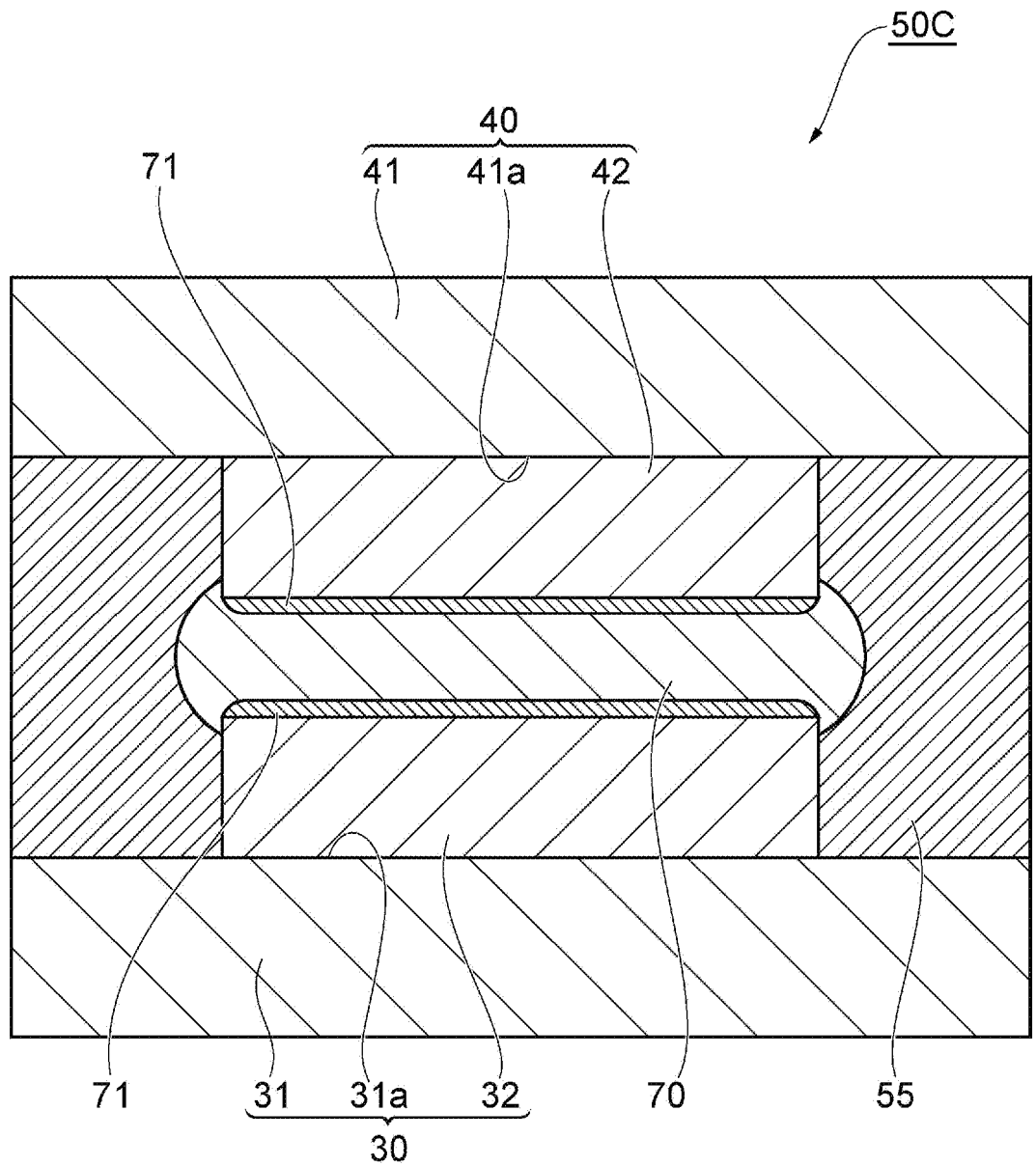

FIG. 13 is a diagram showing an enlarged part of a connection structure according to the present invention and is a cross-sectional view schematically showing a third example of a state in which a first electrode and a second electrode are electrically connected by solder.

Figure 14:
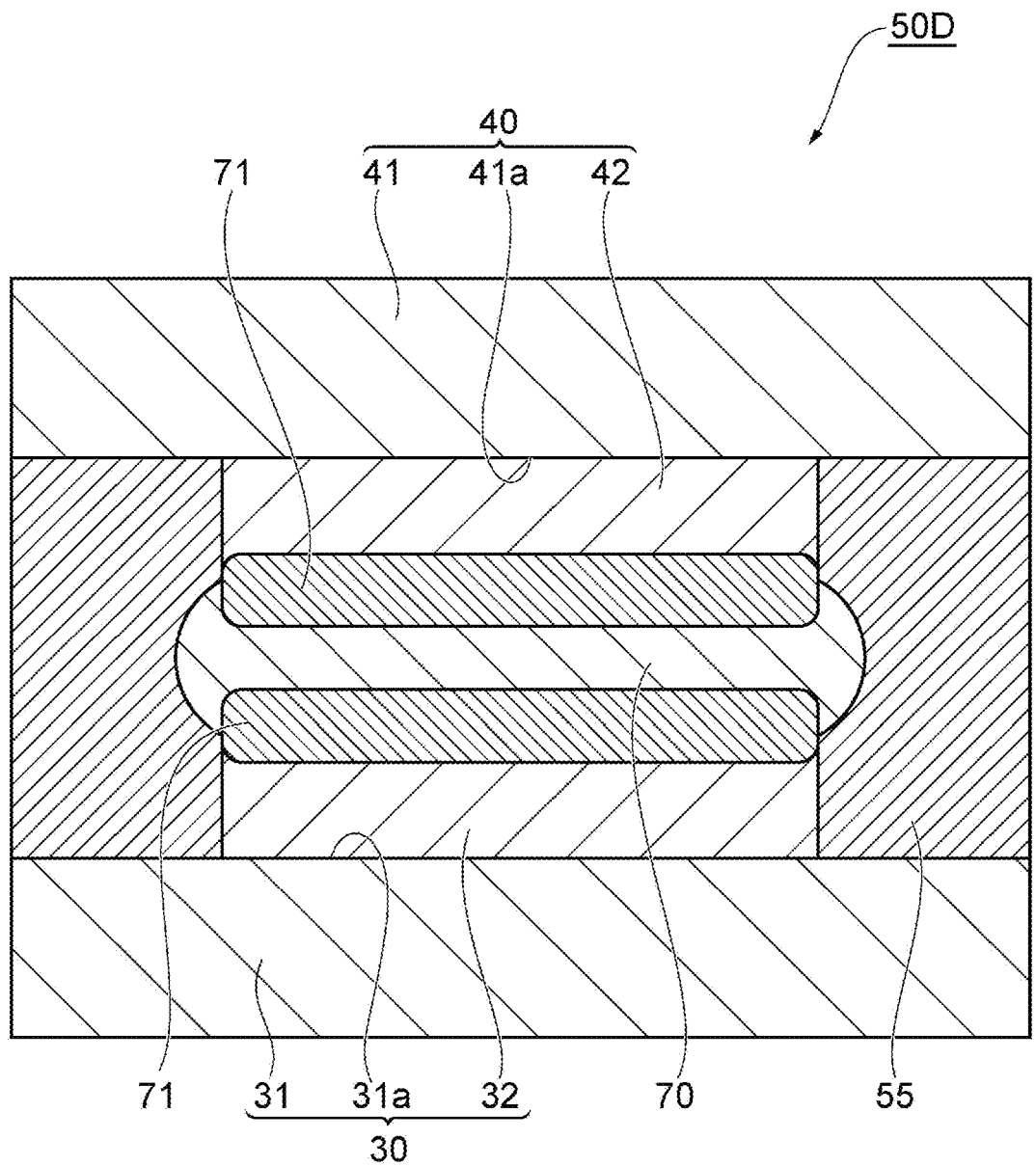

FIG. 14 is a diagram showing an enlarged part of a connection structure according to the present invention and is a cross-sectional view schematically showing a fourth example of a state in which a first electrode and a second electrode are electrically connected by solder.

Figure 15:
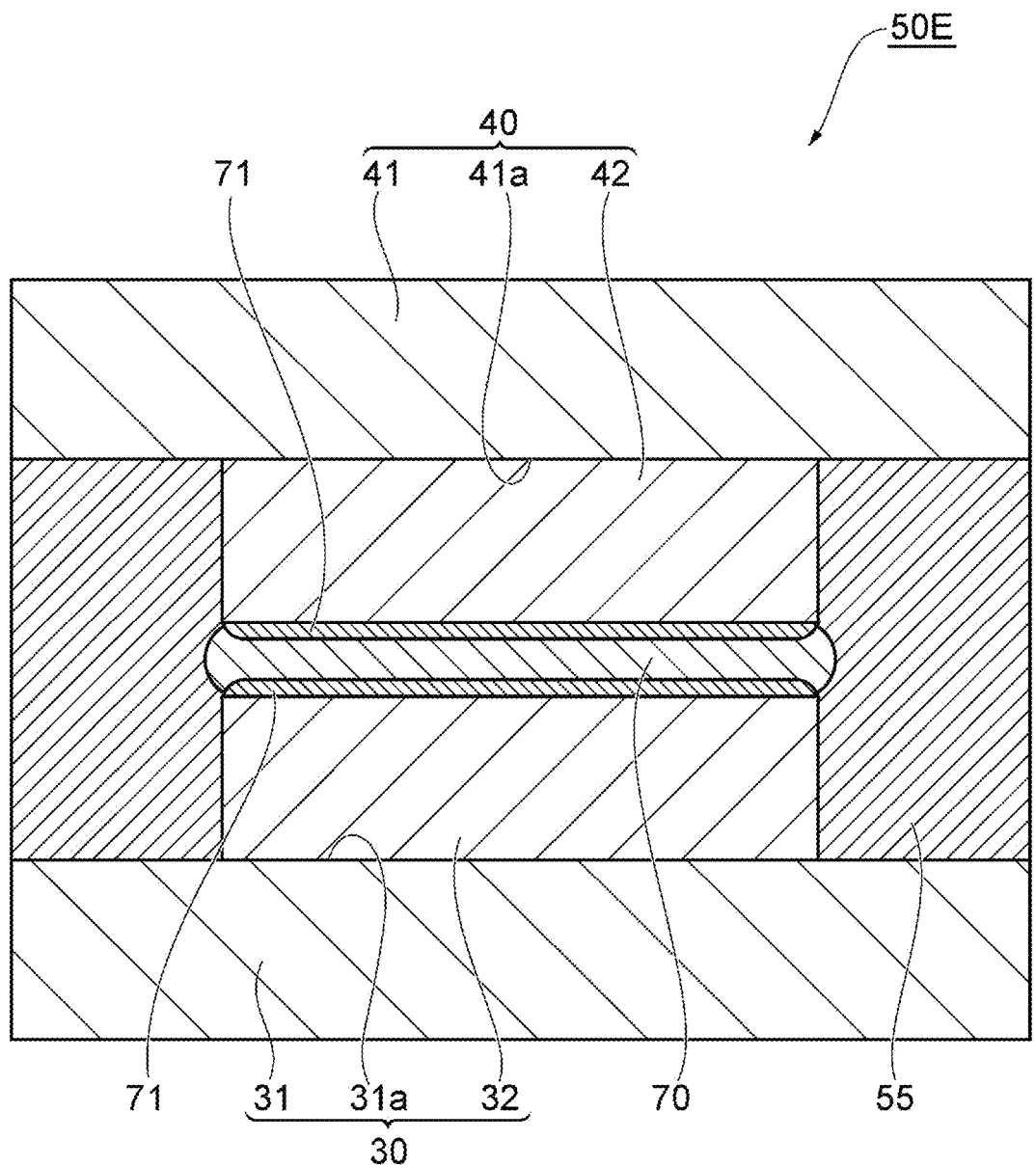

FIG. 15 is a diagram showing an enlarged part of a connection structure according to the present invention and is a cross-sectional view schematically showing a fifth example of a state in which a first electrode and a second electrode are electrically connected by solder.

Figure 16:
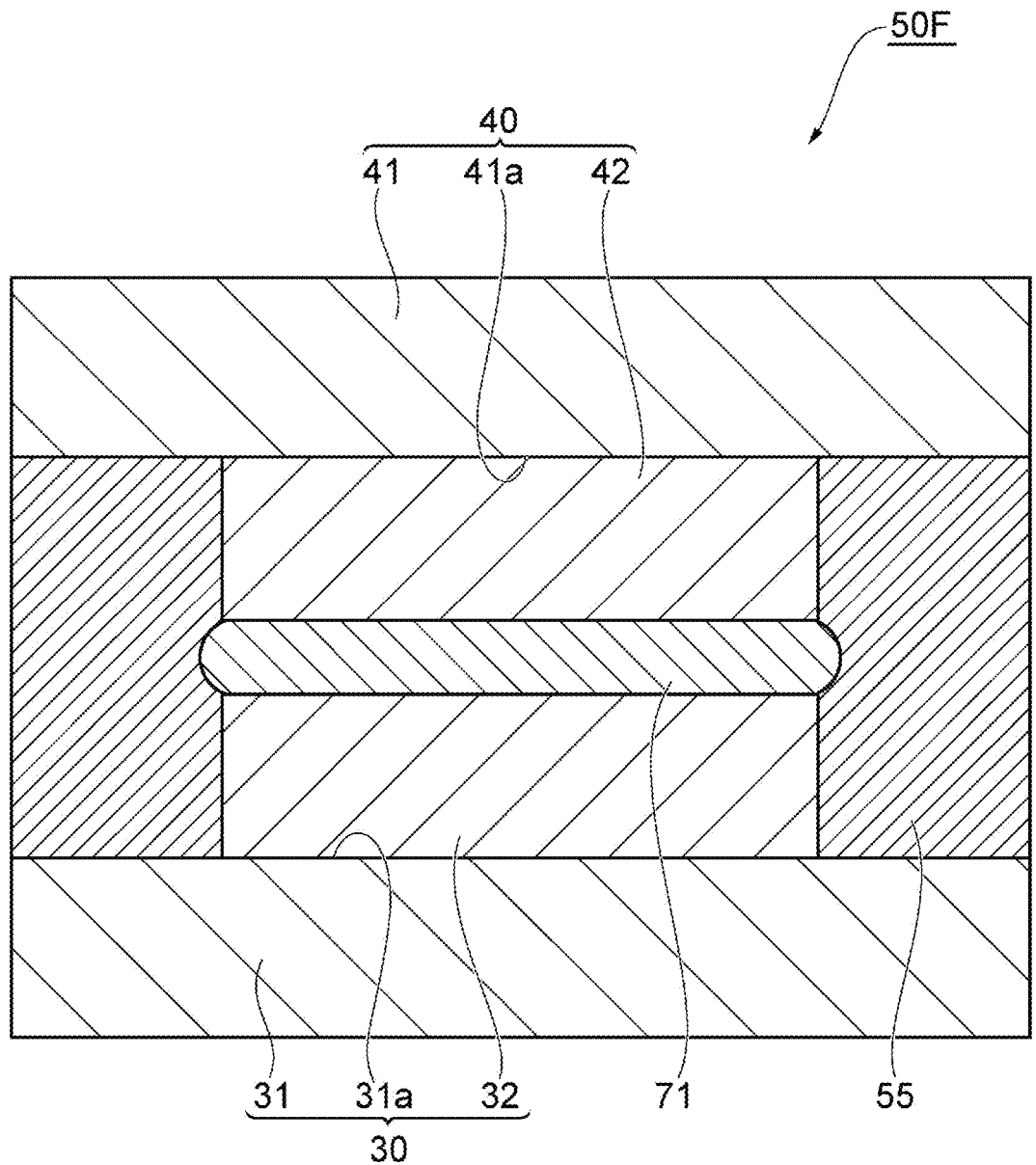

FIG. 16 is a diagram showing an enlarged part of a connection structure according to the present invention and is a cross-sectional view schematically showing a sixth example of a state in which a first electrode and a second electrode are electrically connected by solder.

Figure 17:
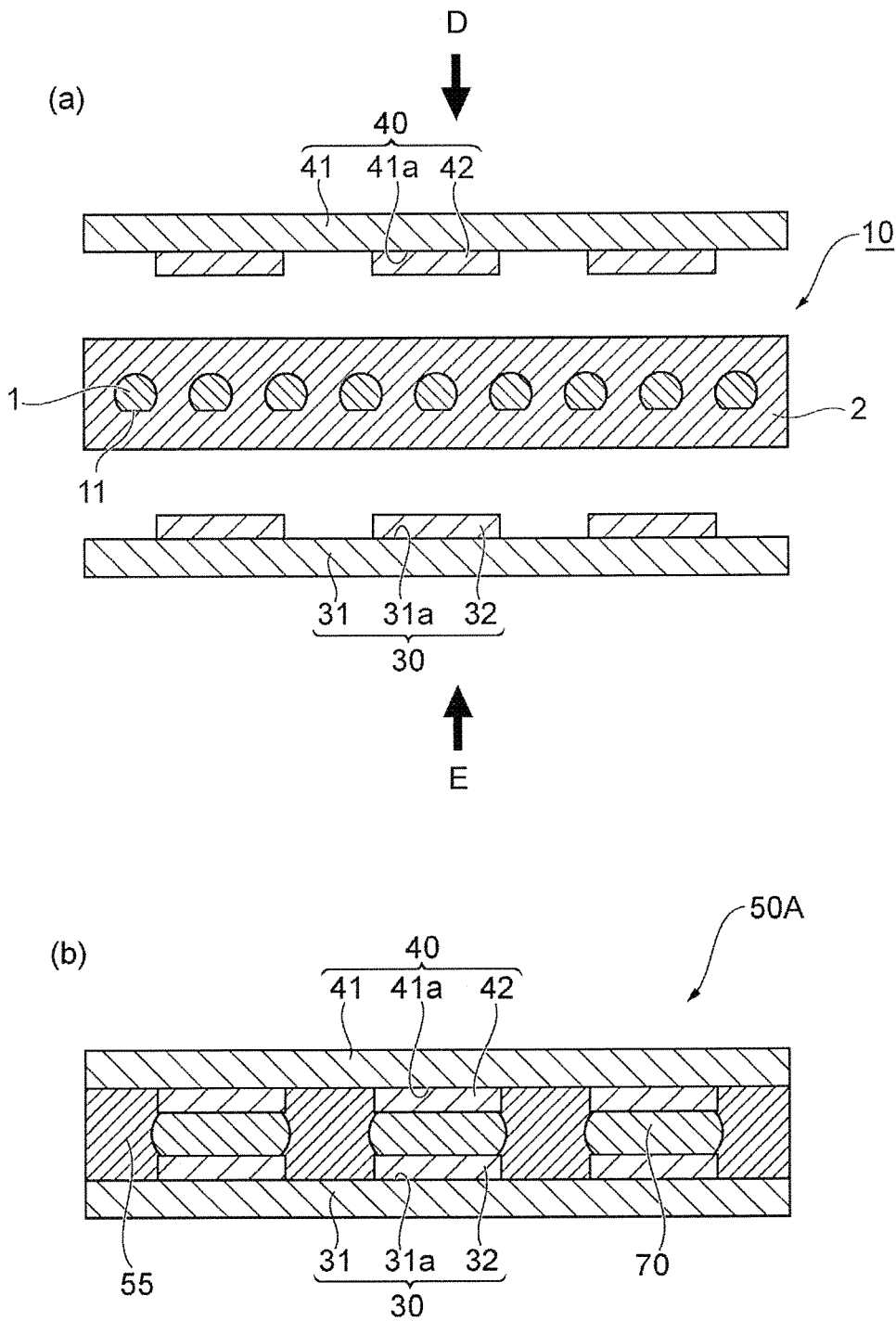

(a) of FIG. 17 and (b) of FIG. 17 are cross-sectional views schematically showing a first example of a process of producing a connection structure according to the present invention.

Figure 18:
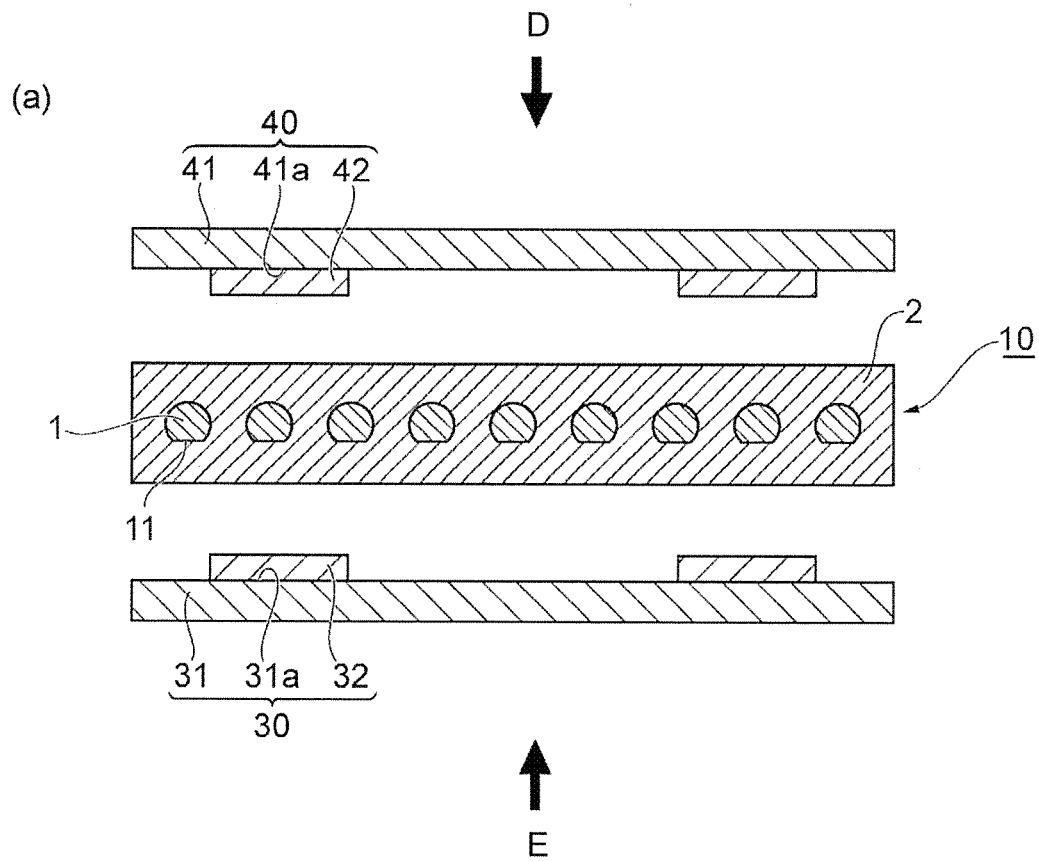
Figure 18:
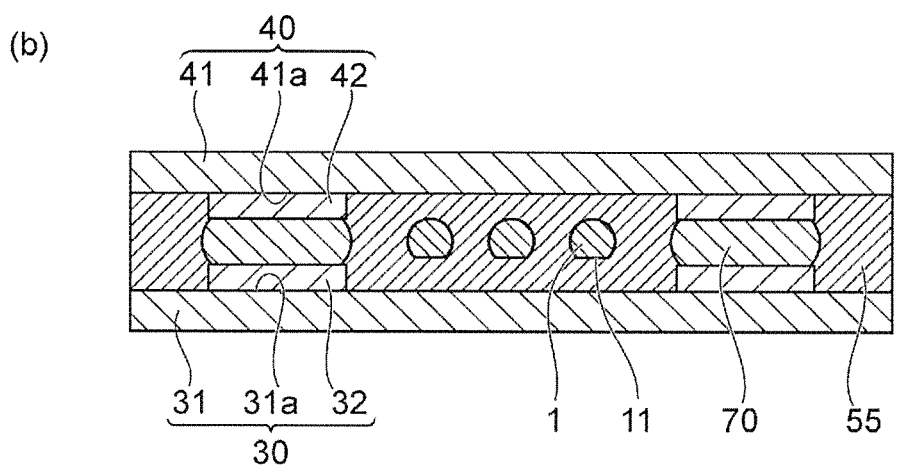

(a) of FIG. 18 and (b) of FIG. 18 are cross-sectional views schematically showing a second example of a process of producing a connection structure according to the present invention.

Figure 19:
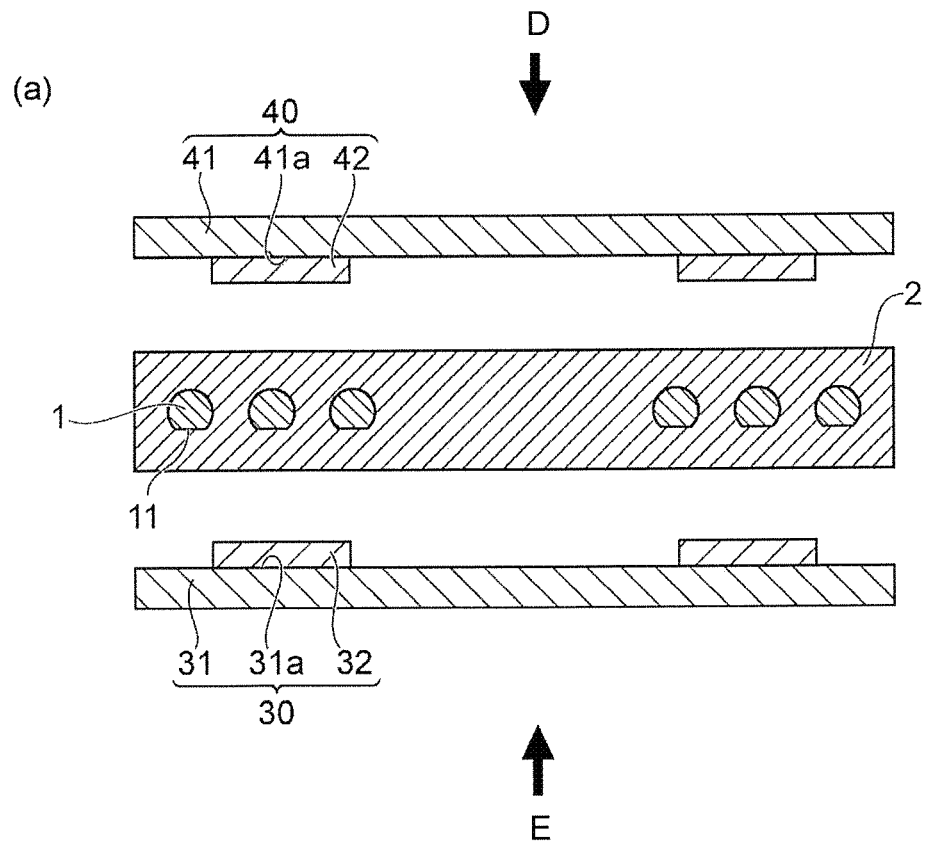
Figure 19:
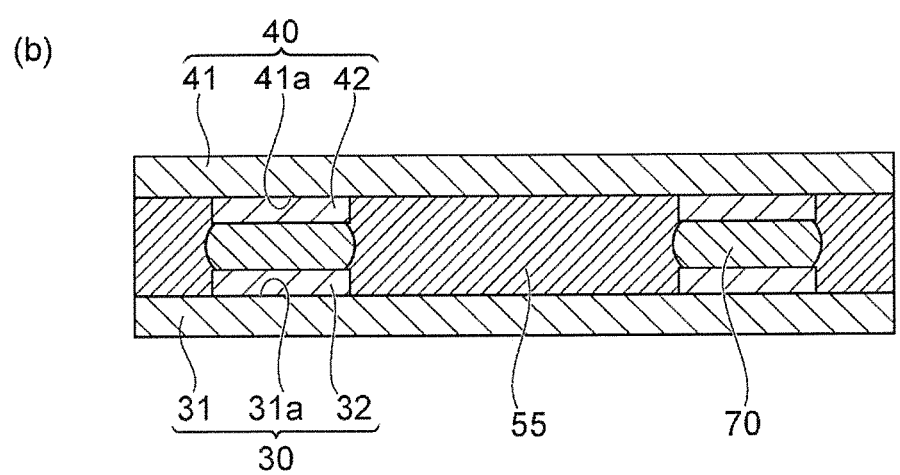

(a) of FIG. 19 and (b) of FIG. 19 are cross-sectional views schematically showing a third example of a process of producing a connection structure according to the present invention.

Figure 20:
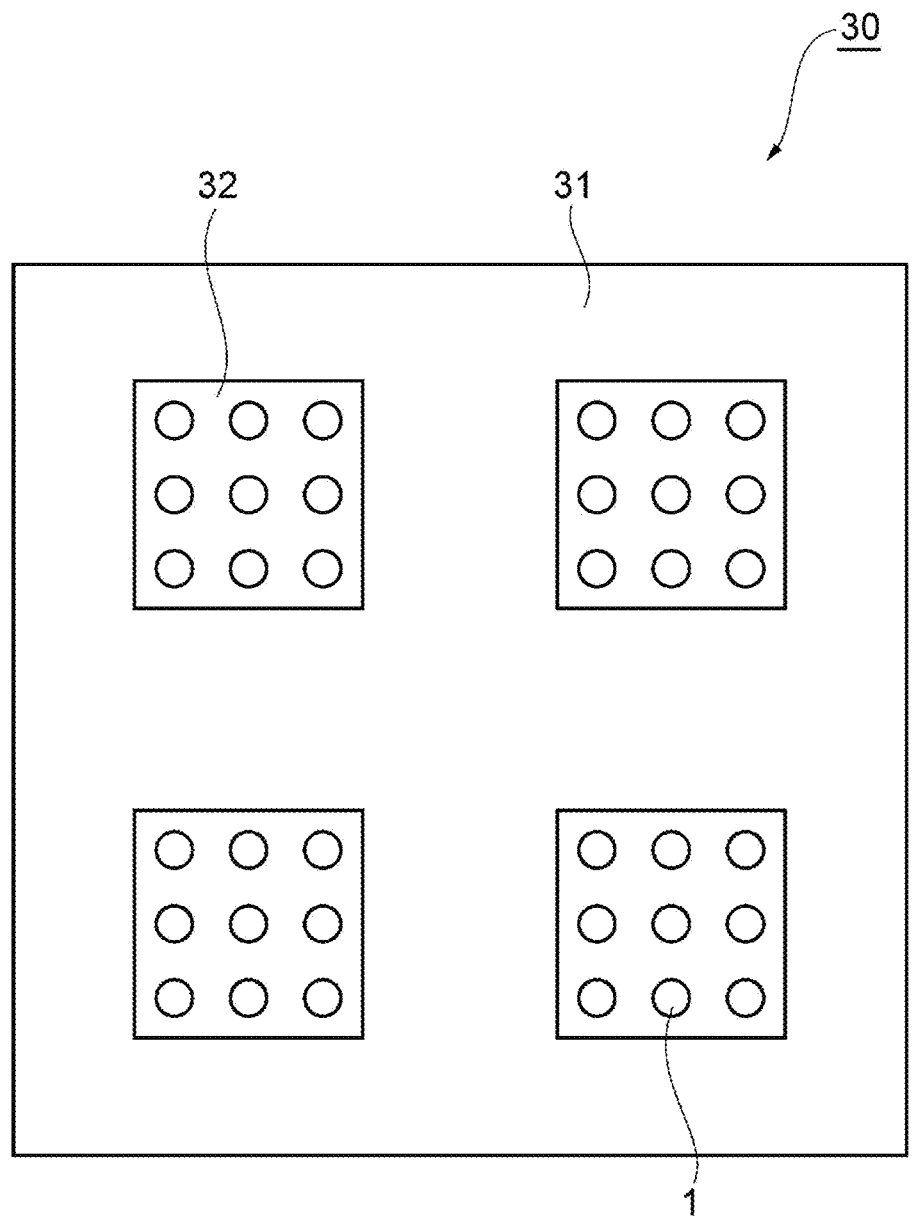

FIG. 20 is a plan view schematically showing a first example of a relationship between positions of solder particles of an anisotropic conductive film and positions of bumps (electrodes) before pressurizing and heating are performed.

Figure 21:
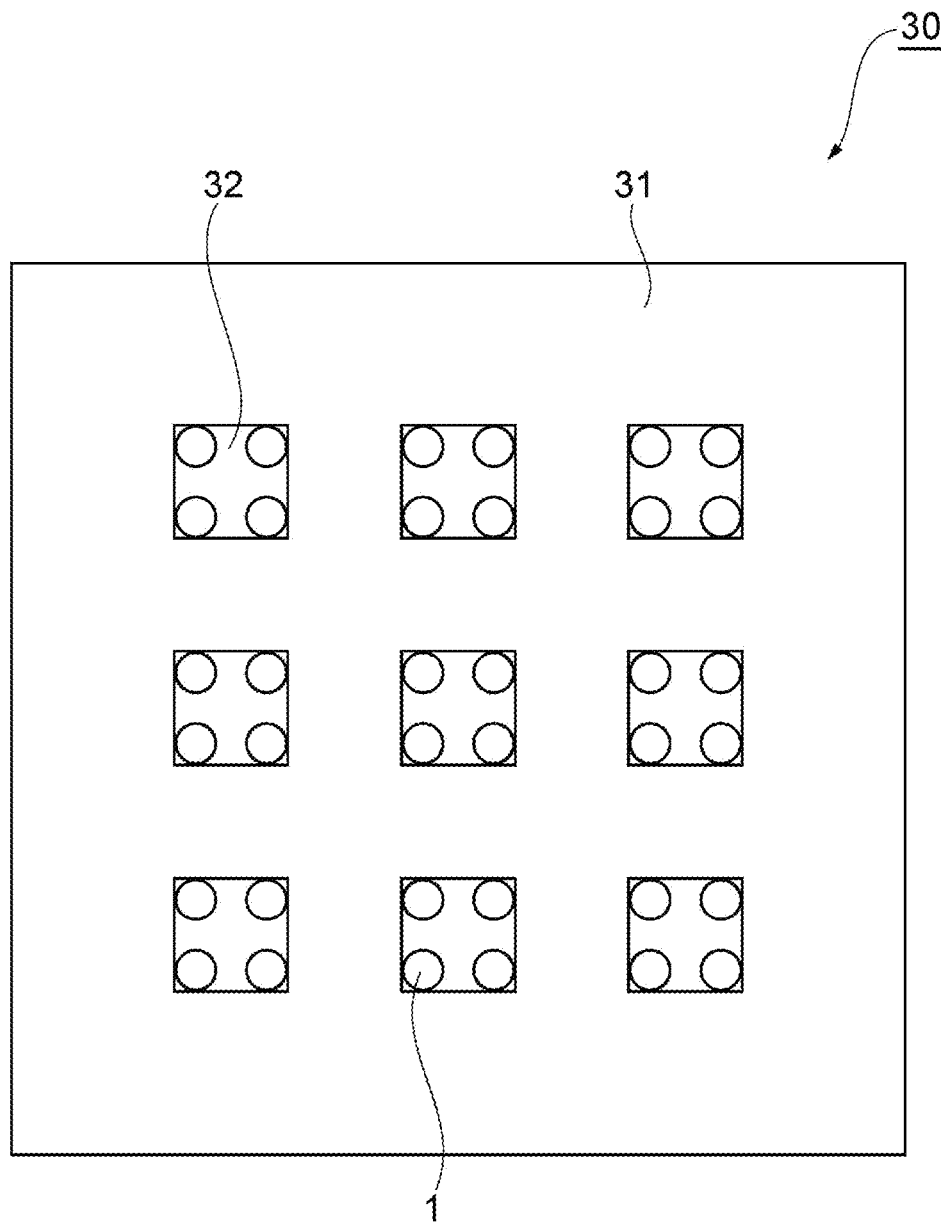

FIG. 21 is a plan view schematically showing a second example of a relationship between positions of solder particles of an anisotropic conductive film and positions of bumps (electrodes) before pressurizing and heating are performed.

Figure 22:
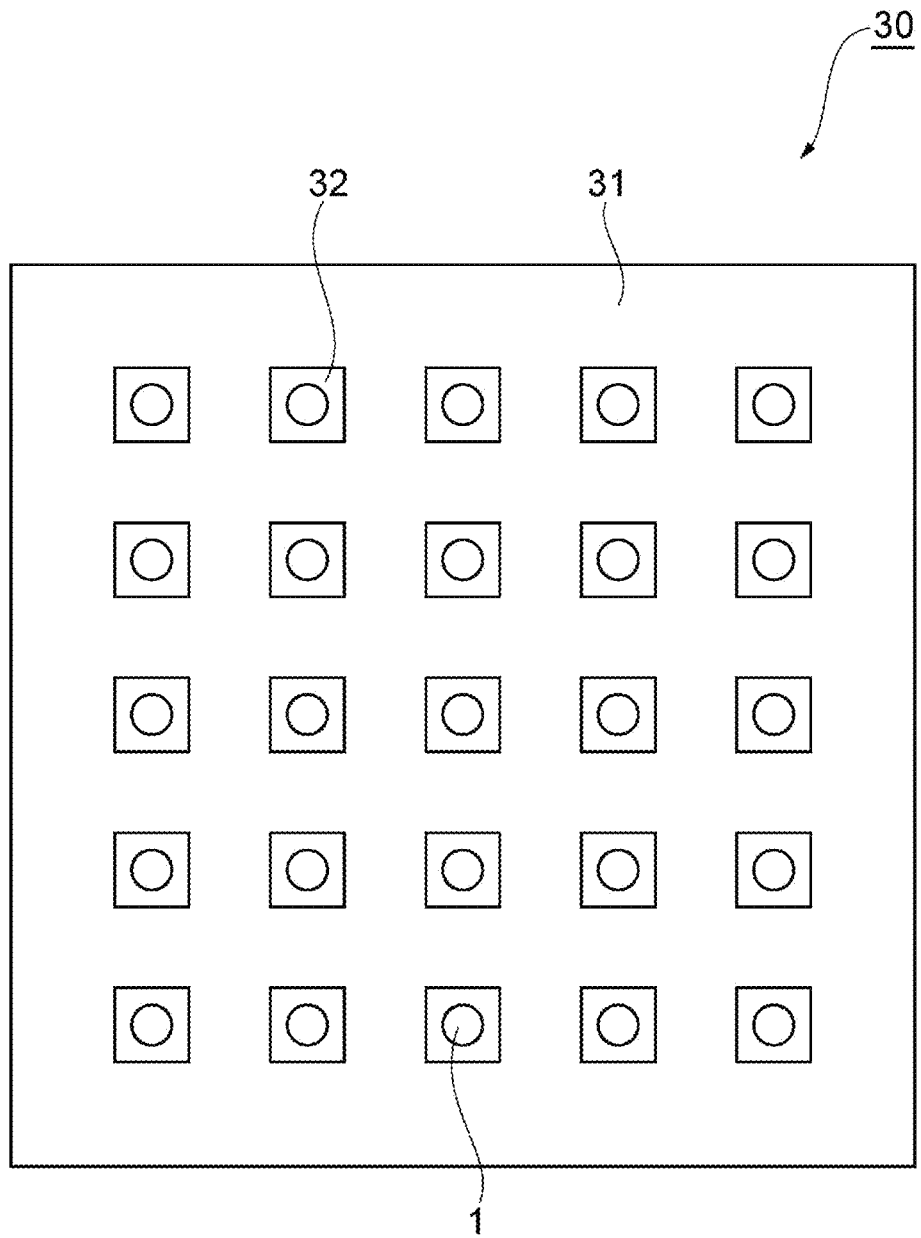

FIG. 22 is a plan view schematically showing a third example of a relationship between positions of solder particles of an anisotropic conductive film and positions of bumps (electrodes) before pressurizing and heating are performed.

Figure 23:
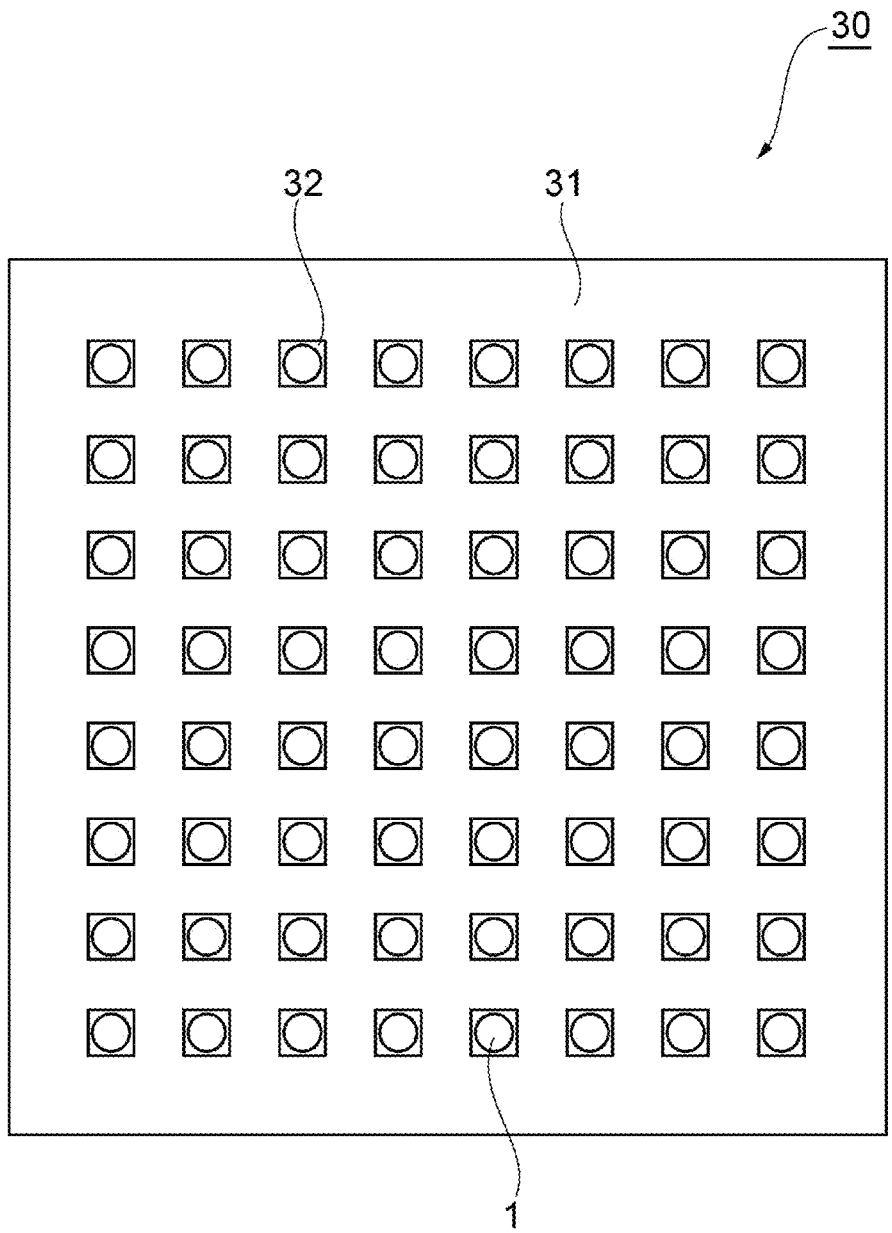

FIG. 23 is a plan view schematically showing a fourth example of a relationship between positions of solder particles of an anisotropic conductive film and positions of bumps (electrodes) before pressurizing and heating are performed.

Figure 24:
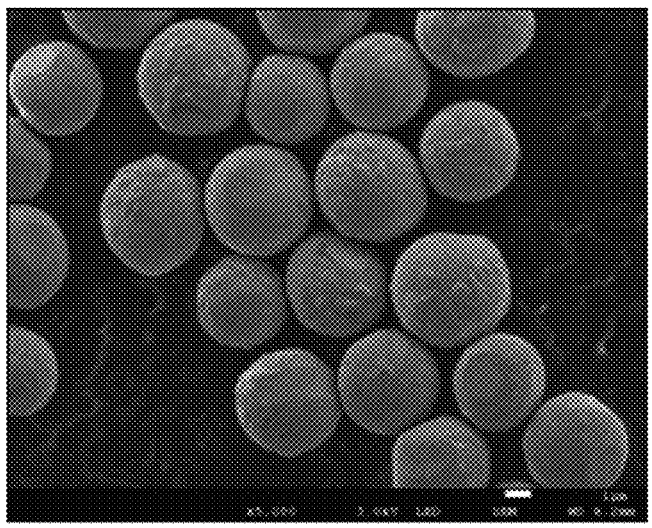
Figure 24:
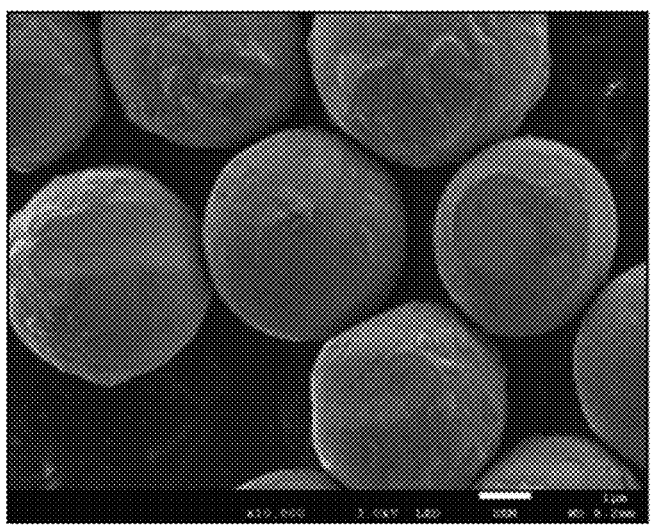

(a) of FIG. 24 and (b) of FIG. 24 are diagrams showing an SEM image of solder particles formed in Production Example 17.

Figure 25:
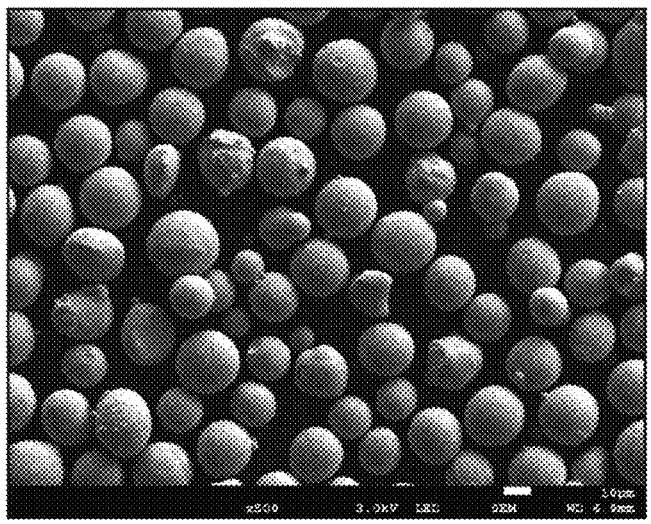
Figure 25:
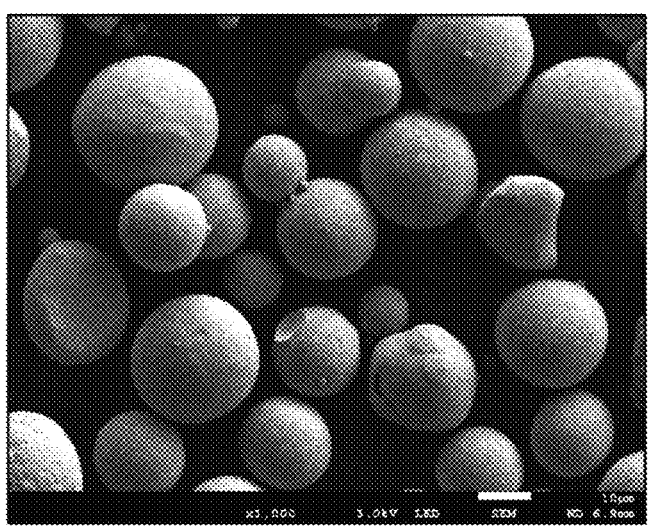

(a) of FIG. 25 and (b) of FIG. 25 are diagrams showing an SEM image of solder particles used in Comparative Example 1.

Figure 26:
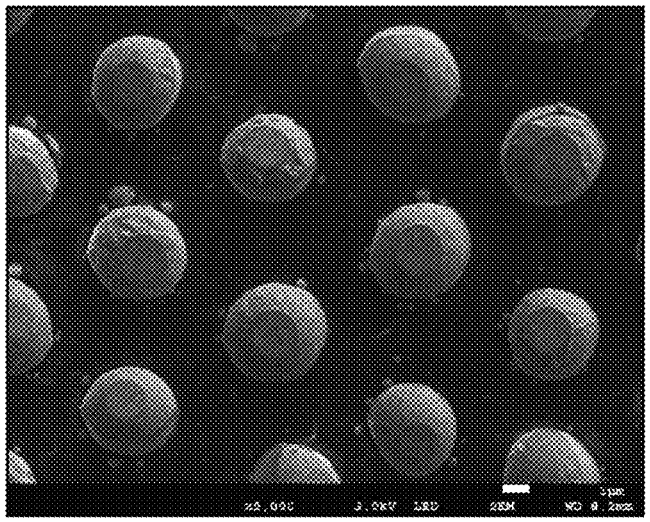
Figure 26:
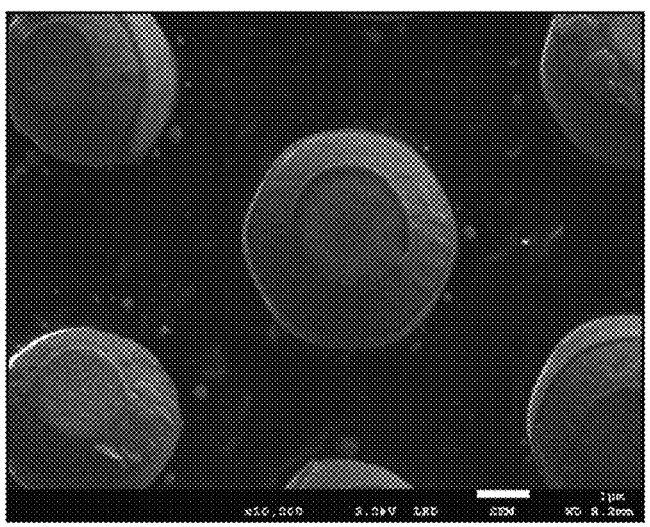

(a) of FIG. 26 and (b) of FIG. 26 are diagrams showing an SEM image of solder particles 1 that are uniformly disposed so that flat portions 11 face the same surface side.

Figure 27:
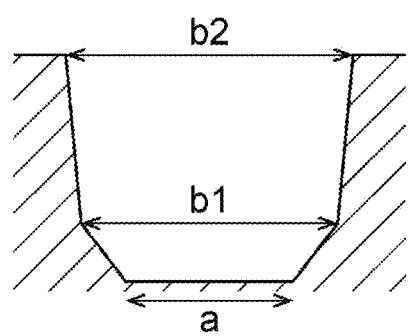

FIG. 27 is a cross-sectional view schematically showing another example of a cross-sectional shape of the recess of the base material.

DESCRIPTION OF EMBODIMENTS

Hereinafter, embodiments of the present invention will be described. The present invention is not limited to the following embodiments. Here, unless otherwise specified, materials exemplified below may be used alone or two or more thereof may be used in combination. When there are a plurality of substances corresponding to components in a composition, the content of the components in the composition means a total amount of the plurality of substances present in the composition unless otherwise specified. A numerical range indicated using "to" means a range including numerical values stated before and after "to" as a minimum value and a maximum value. In the numerical ranges described stepwise in this specification, an upper limit value or a lower limit value of a certain stepwise numerical range may be replaced with an upper limit value or a lower limit value of other stepwise numerical ranges. In the numerical ranges described in this specification, the upper limit value or the lower limit value of the numerical range may be replaced with values shown in examples.

<Anisotropic Conductive Film>

An anisotropic conductive film 10 according to a first embodiment shown in FIG. 1 includes an insulating film 2 made of an insulating resin material and a plurality of solder particles 1 disposed in the insulating film 2. In a predetermined vertical cross section of the anisotropic conductive film 10, one solder particle 1 that is separated from one adjacent solder particle 1 is disposed in the horizontal direction (a left to right direction in FIG. 1). In other words, in the vertical cross section, the anisotropic conductive film 10 is composed of a central region 10a in which a plurality of solder particles 1 are arranged in a row in the horizontal direction and regions 10b and 10c on the surface side on which there are substantially no solder particles 1.

FIG. 2(a) is a schematic transverse cross-sectional view taken along the line IIa-IIa shown in FIG. 1. As shown in FIG. 2, in a horizontal cross section of the anisotropic conductive film 10, the solder particles 1 are regularly disposed. As shown in (a) of FIG. 2, the solder particles 1 may be disposed at regular and substantially uniform interval with respect to the entire region of the anisotropic conductive film 10, and as shown in a modification example shown in (b) of FIG. 2, the solder particles 1 may be disposed so that, in the horizontal cross section of the anisotropic conductive film 10, a region 10d in which a plurality of solder particles 1 are regularly disposed and a region 10e in which the solder particles 1 are not substantially present are regularly formed. For example, the positions and the number of solder particles 1 and the like may be set according to the shape, size, pattern and the like of electrodes to be connected.

(Solder Particles)

The average particle diameter of the solder particles 1 is, for example, 30 μm or less, preferably 25 μm or less, more preferably 20 μm or less, and still more preferably 15 μm or less. In addition, the average particle diameter of the solder particles 1 is, for example, 1 μm or more, preferably 2 μm or more, more preferably 3 μm or more, and still more preferably 5 μm or more.

The average particle diameter of the solder particles 1 can be measured using various methods according to the size. Methods, for example, a dynamic light scattering method, a laser diffraction method, a centrifugal sedimentation method, an electrical detection band method, and a resonance type mass measurement method, can be used. In addition, a method of measuring a particle size from an image obtained by an optical microscope, an electron microscope or the like can be used. Examples of specific devices include a flow type particle image analyzing device, a Microtrac, and a Coulter counter.

In order to realize better conduction reliability and insulation reliability, the C.V. value of the solder particles 1 is preferably 20% or less, more preferably 10% or less, and still more preferably 7% or less. In addition, the lower limit of the C.V. value of the solder particles 1 is not particularly limited. For example, the C.V. value of the solder particles 1 may be 1% or more or 2% or more.

The C.V. value of the solder particles 1 is calculated by multiplying a value obtained by dividing the standard deviation of the particle diameter measured by the above method by the average particle diameter by 100.

As shown in (a) of FIG. 7, in the solder particles 1, a flat portion 11 may be formed on a part of the surface, and in this case, a surface other than the flat portion 11 preferably has a spherical crown shape. That is, the solder particles 1 may have the flat portion 11 and a spherical crown-shaped curved surface. The ratio (A/B) of the diameter A of the flat portion 11 to the diameter B of the solder particles 1 may be, for example, more than 0.01 and less than 1.0 (0.01<A/B<1.0) or may be 0.1 to 0.9. Since the solder particles 1 have the flat portion 11, displacement due to pressurization during connection is unlikely to occur, and better conduction reliability and insulation reliability can be realized.

When a quadrangle circumscribing a projected image of the solder particle 1 is created by two pairs of parallel lines, and distances between opposite sides are set as X and Y (where Y<X), the ratio (Y/X) of Y to X may be more than 0.8 and less than 1.0 (0.8<Y/X<1.0) or may be 0.9 or more and less than 1.0. Such solder particles 1 can be particles closer to true spheres. According to the production method described below, such solder particles 1 can be easily obtained. Since the solder particles 1 are close to true spheres, for example, when a plurality of electrodes that face each other are electrically connected via the solder particles 1, the contact between the solder particles 1 and the electrodes is unlikely to be uneven and a stable connection tends to be obtained. In addition, when a conductive film or resin in which the solder particles 1 are dispersed in a resin material is produced, high dispersibility is obtained and a dispersion stability during production tends to be obtained. In addition, in a case of a film or paste in which the solder particles 1 are dispersed in a resin material is used for connection between electrodes, even if the solder particles 1 rotate in the resin, when the solder particles 1 have a spherical shape, projected areas of the solder particles 1 are close to each other when viewed in a projected image. Therefore, a stable electrical connection with little variation during connection of electrodes tends to be obtained.

FIG. 7(*b*) is a diagram showing distances X and Y between opposite sides (where Y<X) when a quadrangle circumscribing a projected image of a solder particle is created by two pairs of parallel lines. For example, an arbitrary particle is observed under a scanning electron microscope and a projected image is obtained. Two pairs of parallel lines are drawn on the obtained projected image, one pair of parallel lines are arranged at a position at which the distance between the parallel lines is a minimum, the other pair of parallel lines are arranged at a position at which the distance between the parallel lines is a maximum, and Y/X of the particles is obtained. This operation is performed on 300 solder particles, and an average value is calculated and used as Y/X of solder particles.

The solder particles 1 may contain tin or a tin alloy. Regarding the tin alloy, for example, In—Sn alloys, In—Sn—Ag alloys, Sn—Au alloys, Sn—Bi alloys, Sn—Bi—Ag alloys, Sn—Ag—Cu alloys, and Sn—Cu alloys can be used. Specific examples of these tin alloys include the following examples.

In—Sn (In 52 mass %, Sn 48 mass %, melting point of 118° C.)
In—Sn—Ag (In 20 mass %, Sn 77.2 mass %, Ag 2.8 mass %, melting point of 175° C.)
Sn—Bi (Sn 43 mass %, Bi 57 mass %, melting point of 138° C.)
Sn—Bi—Ag (Sn 42 mass %, Bi 57 mass %, Ag 1 mass %, melting point of 139° C.)
Sn—Ag—Cu (Sn 96.5 mass %, Ag 3 mass %, Cu 0.5 mass %, melting point of 217° C.)
Sn—Cu (Sn 99.3 mass %, Cu 0.7 mass %, melting point of 227° C.)
Sn—Au (Sn 21.0 mass %, Au 79.0 mass %, melting point of 278° C.)

The solder particles may contain indium or an indium alloy. Regarding the indium alloy, for example, In—Bi alloys and In—Ag alloys can be used. Specific examples of these indium alloys include the following examples.

In—Bi (In 66.3 mass %, Bi 33.7 mass %, melting point of 72° C.)
In—Bi (In 33.0 mass %, Bi 67.0 mass %, melting point of 109° C.)
In—Ag (In 97.0 mass %, Ag 3.0 mass %, melting point of 145° C.)

The tin alloy or indium alloy can be selected according to applications of the solder particles 1 (temperature during connection). For example, when the solder particles 1 are used for fusion at a low temperature, In—Sn alloys and Sn—Bi alloys may be used, and in this case, the solder particles can be fused at 150° C. or lower. When a material having a high melting point such as Sn—Ag—Cu alloys and Sn—Cu alloys is used, it is possible to maintain high reliability even after being left at a high temperature.

The solder particles 1 may contain at least one selected from among Ag, Cu, Ni, Bi, Zn, Pd, Pb, Au, P and B. Among these elements, Ag or Cu may be contained in consideration of the following aspect. That is, when the solder particles 1 contain Ag or Cu, the melting point of the solder particles 1 can be lowered to about 220° C. and the bond strength with respect to an electrode is further improved, and thus more favorable conduction reliability is easily obtained.

The Cu content of the solder particles 1 is, for example, 0.05 to 10 mass %, and may be 0.1 to 5 mass % or 0.2 to 3 mass %. When the Cu content is 0.05 mass % or more, more favorable solder connection reliability is easily achieved. In addition, when the Cu content is 10 mass % or less, solder particles having a low melting point and excellent wettability are easily obtained, and as a result, the reliability of connection of the bonding part to the solder particles 1 tends to be favorable.

The Ag content of the solder particles 1 is, for example, 0.05 to 10 mass %, and may be 0.1 to 5 mass % or 0.2 to 3 mass %. When the Ag content is 0.05 mass % or more, more favorable solder connection reliability is easily achieved. In addition, when the Ag content is 10 mass % or less, solder particles having a low melting point and excellent wettability are easily obtained, and as a result, the reliability of connection of the bonding part to the solder particles tends to be favorable.

(Insulating Film)

Examples of an insulating resin material constituting the insulating film 2 include a thermosetting compound. Examples of thermosetting compounds include oxetane compounds, epoxy compounds, episulfide compounds, (meth)acrylic compounds, phenolic compounds, amino compounds, unsaturated polyester compounds, polyurethane compounds, silicone compounds and polyimide compounds. Among these, an epoxy compound is preferable because the curability and viscosity of the insulating resin are further improved and the connection reliability is further improved.

The insulating resin material may further contain a thermosetting agent. Examples of thermosetting agents include an imidazole curing agent, an amine curing agent, a phenol curing agent, a polythiol curing agent, an acid anhydride, a thermal cationic initiator and a thermal radical generating agent. These may be used alone or two or more thereof may be used in combination. Among these, an imidazole curing agent, a polythiol curing agent or an amine curing agent is preferable because curing can be performed quickly at a low temperature. In addition, a latent curing agent is preferable because the storage stability is high when a thermosetting compound and a thermosetting agent are mixed. The latent curing agent is preferably a latent imidazole curing agent, a latent polythiol curing agent or a latent amine curing agent. Here, the thermosetting agent may be coated with a polymer substance such as a polyurethane resin or a polyester resin.

The imidazole curing agent is not particularly limited, and examples thereof include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine and a 2,4-diamino-6-[2'-methylimidazolyl-(1')]-ethyl-s-triazine isocyanuric acid adduct.

The polythiol curing agent is not particularly limited, and examples thereof include trimethylolpropane tris-3-mercaptopropionate, pentaerythritol tetrakis-3-mercaptopropionate and dipentaerythritol hexa-3-mercaptopropionate. The solubility parameter of the polythiol curing agent is preferably 9.5 or more, and more preferably 12 or less. The solubility parameter is calculated by a Fedors method. For example, the solubility parameter of trimethylolpropane tris-3-mercaptopropionate is 9.6, and the solubility parameter of dipentaerythritol hexa-3-mercaptopropionate is 11.4.

The amine curing agent is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, metaphenylenediamine and diaminodiphenyl sulfone.

Examples of thermal cationic curing agents include an iodonium-based cationic curing agent, an oxonium-based cationic curing agent and a sulfonium-based cationic curing agent. Examples of iodonium-based cationic curing agents include bis(4-tert-butylphenyl)iodonium hexafluorophosphate. Examples of oxonium-based cationic curing agents include trimethyloxonium tetrafluoroborate. Examples of sulfonium-based cationic curing agents include tri-p-tolylsulfonium hexafluorophosphate.

The thermal radical generating agent is not particularly limited, and examples thereof include an azo compound and an organic peroxide. Examples of azo compounds include azobisisobutyronitrile (AIBN). Examples of organic peroxides include di-tert-butyl peroxide and methyl ethyl ketone peroxide.

(Flux)

The anisotropic conductive film 10 preferably contains a flux. Specifically, it is preferable that an insulating resin material constituting the anisotropic conductive film 10 contain a flux and the surface of the solder particles 1 be covered with a flux. The flux melts an oxide on the surface of the solder, and fusion between the solder particles and the wettability of the solder to the electrodes are improved.

Regarding the flux, those that are generally used for solder bonding or the like can be used. Specific examples include zinc chloride, a mixture of zinc chloride and an inorganic halide, a mixture of zinc chloride and an inorganic acid, a molten salt, phosphoric acid, derivatives of phosphoric acid, organic halides, hydrazine, organic acid and rosin. These may be used alone or two or more thereof may be used in combination.

Examples of molten salts include ammonium chloride. Examples of organic acids include lactic acid, citric acid, stearic acid, glutamic acid and glutaric acid. Examples of rosins include activated rosin and non-activated rosin. The rosin is a rosin containing abietic acid as a main component. When an organic acid or rosin having two or more carboxylic groups is used as the flux, an effect of further improving conduction reliability between electrodes is achieved.

The melting point of the flux is preferably 50° C. or higher, more preferably 70° C. or higher, and still more preferably 80° C. or higher. The melting point of the flux is preferably 200° C. or lower, more preferably 160° C. or lower, and still more preferably 150° C. or lower and particularly preferably 140° C. or lower. When the melting point of the flux is the lower limit or more and the upper limit or less, the flux effect is exhibited more effectively, and the solder particles are disposed on the electrode more efficiently. The range of the melting point of the flux is preferably 80 to 190° C. and more preferably 80 to 140° C. or lower.

Examples of a flux having a melting point in a range of 80 to 190° C. include dicarboxylic acids such as succinic acid (a melting point of 186° C.), glutaric acid (a melting point of 96° C.), adipic acid (a melting point of 152° C.), pimelic acid (a melting point of 104° C.), and suberic acid (a melting point of 142° C.), benzoic acid (a melting point of 122° C.), and malic acid (a melting point of 130° C.).

<Method for Producing Anisotropic Conductive Film>

A method for producing an anisotropic conductive film 10 includes a preparation step in which a base material having a plurality of recesses and solder fine particles are prepared, an accommodation step in which at least some of the solder fine particles are accommodated in the recesses, a fusing step in which the solder fine particles accommodated in the recesses are fused and the solder particles are formed inside the recesses, a transfer step in which an insulating resin material is brought into contact with an opening side of the recesses of the base material in which the solder particles are accommodated in the recesses to obtain a first resin layer to which the solder particles are transferred, and a layering step in which a second resin layer formed of an insulating resin material is formed on a surface of the first resin layer on the side to which the solder particles are transferred to obtain an anisotropic conductive film.

A method for producing an anisotropic conductive film 10 according to the first embodiment will be described with reference to FIGS. 3 to 8.

First, solder fine particles and a base material 60 in which solder fine particles are contained are prepared. (a) of FIG. 3 is a plan view schematically showing an example of the base material 60, and (b) of FIG. 3 is a cross-sectional view taken along the line Ib-Ib shown in (a) of FIG. 3. The base material 60 shown in (a) of FIG. 3 has a plurality of recesses 62. The plurality of recesses 62 may be regularly arranged in a predetermined pattern. In this case, the base material 60 can be directly used in the transfer step described below.

The recesses 62 of the base material 60 are preferably formed in a tapered shape in which an opening area enlarges from the side of a bottom 62a of the recesses 62 toward the side of a surface 60a of the base material 60. That is, as shown in (a) of FIGS. 3(a) and (b) of FIG. 3, the width (a width a in (a) of FIGS. 3(a) and (b) of FIG. 3) of the bottom 62a of the recesses 62 is preferably narrower than the width (a width b in (a) of FIGS. 3(a) and (b) of FIG. 3) of an opening on the surface 60a of the recesses 62. In addition, the size (a width a, a width b, a volume, a taper angle, a depth, etc.) of the recesses 62 may be set according to the size of desired solder particles.

Here, the shape of the recesses 62 may be a shape other than the shape shown in (a) of FIG. 3 and (b) of FIG. 3. For example, the shape of the opening on the surface 60a of the recesses 62 may be an ellipse, a triangle, a quadrangle, a polygon or the like, in addition to a circle as shown in (a) of FIG. 3.

In addition, the shape of the recesses 62 in the cross section perpendicular to the surface 60a may be, for example, a shape shown in FIG. 4. (a) of FIG. 4 to (h) of FIG. 4 are cross-sectional views schematically showing an example of a cross-sectional shape of the recess of the base material. In each of the cross-sectional shapes shown in (a) of FIG. 4 to (h) of FIG. 4, the width (the width b) of the opening on the surface 60a of the recesses 62 is the maximum width in the cross-sectional shape. Thereby, it is easy to remove the solder particles formed in the recesses 62, and thus the workability is improved. In addition, the shape of the recesses 62 in the cross section perpendicular to the surface 60a may be, for example, as shown in FIG. 9, a shape in which the wall surface in the cross-sectional shape shown in (a) of FIG. 4 to (h) of FIG. 4 is inclined. It can be said that FIG. 9 shows a shape in which the wall surface of the cross-sectional shape shown in (b) of FIG. 4 is inclined.

Regarding the material constituting the base material 60, for example, an inorganic material such as silicon, various ceramics, glass, and a metal such as stainless steel, and an organic material such as various resins can be used. Among these, the base material 60 is preferably formed of a heat-resistant material that does not deteriorate at a melting temperature of the solder fine particles. In addition, the recesses 62 of the base material 60 can be formed by a known method such as a photolithography method.

The solder fine particles prepared in the preparation step may include fine particles having a particle diameter smaller than the width (the width b) of the opening on the surface 60a of the recesses 62, and preferably include more fine particles having a particle diameter smaller than the width b. For example, in the solder fine particles, the D10 particle diameter of the particle size distribution is preferably smaller than the width b, the D30 particle diameter of the particle size distribution is more preferably smaller than the width b, and the D50 particle diameter of the particle size distribution is still more preferably smaller than the width b.

The particle size distribution of the solder fine particles can be measured using various methods according to the size. Methods, for example, a dynamic light scattering method, a laser diffraction method, a centrifugal sedimentation method, an electrical detection band method, and a resonance type mass measurement method, can be used. In addition, a method of measuring a particle size from an image obtained by an optical microscope, an electron microscope or the like can be used. Examples of specific devices include a flow type particle image analyzing device, a Microtrac, and a Coulter counter.

The C.V. value of the solder fine particles prepared in the preparation step is not particularly limited, and in order to improve filling into the recesses 62 according to a combination of large and small fine particles, a high C.V. value is preferable. For example, the C.V. value of the solder fine particles may be more than 20%, and is preferably 25% or more and more preferably 30% or more.

The C.V. value of the solder fine particles is calculated by multiplying a value obtained by dividing the standard deviation of particle diameters measured by the above method by the average particle diameter (D50 particle diameter) by 100.

The solder fine particles may contain tin or a tin alloy. Regarding the tin alloy, for example, In—Sn alloys, In—Sn—Ag alloys, Sn—Au alloys, Sn—Bi alloys, Sn—Bi—Ag alloys, Sn—Ag—Cu alloys, and Sn—Cu alloys can be used. Specific examples of these tin alloys include the following examples.

In—Sn (In 52 mass %, Sn 48 mass %, melting point of 118° C.)
In—Sn—Ag (In 20 mass %, Sn 77.2 mass %, Ag 2.8 mass %, melting point of 175° C.)
Sn—Bi (Sn 43 mass %, Bi 57 mass %, melting point of 138° C.)
Sn—Bi—Ag (Sn 42 mass %, Bi 57 mass %, Ag 1 mass %, melting point of 139° C.)
Sn—Ag—Cu (Sn 96.5 mass %, Ag 3 mass %, Cu 0.5 mass %, melting point of 217° C.)
Sn—Cu (Sn 99.3 mass %, Cu 0.7 mass %, melting point of 227° C.)
Sn—Au (Sn 21.0 mass %, Au 79.0 mass %, melting point of 278° C.)

The solder particles may contain indium or an indium alloy. Regarding the indium alloy, for example, In—Bi alloys and In—Ag alloys can be used. Specific examples of these indium alloys include the following examples.

In—Bi (In 66.3 mass %, Bi 33.7 mass %, melting point of 72° C.)
In—Bi (In 33.0 mass %, Bi 67.0 mass %, melting point of 109° C.)
In—Ag (In 97.0 mass %, Ag 3.0 mass %, melting point of 145° C.)

The tin alloy or indium alloy can be selected according to applications of the solder particles (temperature during use). For example, when it is desired to obtain solder particles used for fusion at a low temperature, In—Sn alloys and Sn—Bi alloys may be used, and in this case, solder particles that can be fused at 150° C. or lower are obtained. When a material having a high melting point such as Sn—Ag—Cu alloys and Sn—Cu alloys is used, solder particles that can maintain high reliability even after being left at a high temperature can be obtained.

The solder fine particles may contain at least one selected from among Ag, Cu, Ni, Bi, Zn, Pd, Pb, Au, P and B. Among these elements, Ag or Cu may be contained in consideration of the following aspect. That is, when the solder fine particles contain Ag or Cu, effects in which the melting point of the obtained solder particles can be lowered to about 220° C. and the solder particles having an excellent bond strength with respect to an electrode are obtained, and thus more favorable conduction reliability is obtained are obtained.

The Cu content of the solder fine particles is, for example, 0.05 to 10 mass %, and may be 0.1 to 5 mass % or 0.2 to 3 mass %. When the Cu content is 0.05 mass % or more, it is easy to obtain solder particles that allow favorable solder connection reliability to be achieved. In addition, when the Cu content is 10 mass % or less, solder particles having a low melting point and excellent wettability are easily obtained, and as a result, the reliability of connection of the bonding part to the solder particles tends to be better.

The Ag content of the solder fine particles is, for example, 0.05 to 10 mass %, and may be 0.1 to 5 mass % or 0.2 to 3 mass %. When the Ag content is 0.05 mass % or more, it is easy to obtain solder particles that allow favorable solder connection reliability to be achieved. In addition, when the Ag content is 10 mass % or less, solder particles having a low melting point and excellent wettability are easily obtained, and as a result, the reliability of connection of the bonding part to the solder particles tends to be better.

In the accommodation step, the solder fine particles prepared in the preparation step are accommodated in each of the recesses 62 of the base material 60. The accommodation step may be a step in which all of the solder fine particles prepared in the preparation step are accommodated in the recesses 62 or a step in which some of the solder fine particles prepared in the preparation step (for example, those having a diameter smaller than the width b of the opening of the recesses 62 among the solder fine particles) are accommodated in the recesses 62.

FIG. 5 is a cross-sectional view schematically showing a state in which solder fine particles 111 are accommodated in the recesses 62 of the base material 60. As shown in FIG. 5, the plurality of solder fine particles 111 are accommodated in each of the plurality of recesses 62.

For example, the amount of the solder fine particles 111 accommodated in the recesses 62 is preferably 20% or more, more preferably 30% or more, still more preferably 50% or more, and most preferably 60% or more with respect to the volume of the recesses 62. Thereby, the variation in the accommodation amount is minimized and solder particles having a smaller particle size distribution are easily obtained.

A method of accommodating solder fine particles into the recesses 62 is not particularly limited. The accommodation method may be any of a dry type and a wet type. For example, when the solder fine particles prepared in the preparation step are placed on the base material 60 and the surface 60a of the base material 60 is rubbed with a squeegee, excess solder fine particles can be removed and the recesses 62 can contain sufficient solder fine particles. When the width b of the opening of the recesses 62 is larger than the depth of the recesses 62, the solder fine particles protrude from the opening of the recesses 62. When the squeegee is used, the solder fine particles protruding from the opening of the recesses 62 are removed. Examples of a method of removing excess solder fine particles include a method of spraying compressed air and a method of rubbing the surface 60a of the base material 60 with a non-woven fabric or fiber bundle. These methods are preferable for handling easily deformable solder fine particles because a physical power is weaker than that of the squeegee. In addition, in these methods, solder fine particles protruding from the opening of the recesses 62 can remain in the recess.

The fusing step is a step in which the solder fine particles 111 accommodated in the recesses 62 are fused, and solder particles 1 are formed inside the recesses 62. FIG. 6 is a cross-sectional view schematically showing a state in which the solder particles 1 are formed in the recesses 62 of the base material 60. The solder fine particles 111 accommodated in the recesses 62 are melted and coalesced, and spheroidized due to surface tension. In this case, at a part in contact with the bottom 62a of the recesses 62, the molten solder forms a flat portion 11 conforming to the bottom 62a. Thereby, the formed solder particles 1 have a shape having a flat portion 11 on a part of the surface.

FIG. 7(a) is a diagram of the solder particles 1 when viewed from the side opposite to the opening part of the recesses 62 in FIG. 6. The solder particles 1 have a shape in which a flat portion 11 having a diameter A is formed on a part of the surface of a sphere having a diameter B. Here, the solder particles 1 shown in FIG. 6 and (a) of FIG. 7 have the flat portion 11 because the bottom 62a of the recesses 62 is flat, but when the bottom 62a of the recesses 62 has a shape other than a flat surface, the solder particles 1 have a surface having a different shape corresponding to the shape of the bottom 62a.

Examples of a method of melting the solder fine particles 111 accommodated in the recesses 62 include a method of heating the solder fine particles 111 to a melting point of the solder or higher. Due to the influence of an oxide film, even if heated to a temperature equal to or higher than the melting point, the solder fine particles 111 may not melt, may not wet and spread, or may not coalesce. Therefore, when the solder fine particles 111 are exposed to a reducing atmosphere, the oxide film on the surface the solder fine particles 111 is removed and heating is then performed at a temperature equal to or higher than the melting point of the solder fine particles 111, the solder fine particles 111 can be melted, wet and spread, and be coalesced. In addition, the solder fine particles 111 are preferably melted under a reducing atmosphere. When the solder fine particles 111 are heated to a temperature equal to or higher than the melting point of the solder fine particles 111 and a reducing atmosphere is created, the oxide film on the surface of the solder fine particles 111 is reduced, the solder fine particles 111 are efficiently and easily melted, wet and spread, and are coalesced.

The method of creating a reducing atmosphere is not particularly limited as long as the above effects are obtained, and for example, a method using hydrogen gas, hydrogen radicals, formic acid gas, or the like may be used. For example, the solder fine particles 111 can be melted under a reducing atmosphere using a hydrogen reduction furnace, a hydrogen radical reduction furnace, a formic acid reduction furnace, or a conveyor furnace or a consecutive series of such furnaces. In these devices, the furnace may include a heating device, a chamber filled with an inert gas (nitrogen, argon, etc.), a mechanism for evacuating the inside of the chamber and the like, and thereby a reducing gas is more easily controlled. In addition, when the inside of the chamber can be evacuated, after the solder fine particles 111 are melted and coalesced, voids can be removed due to a reduced pressure, and the solder particles 1 having superior connection stability can be obtained.

Profiles such as reducing and dissolving conditions for the solder fine particles 111, the temperature, and adjustment of the atmosphere in the furnace may be appropriately set in consideration of the melting point of the solder fine particles 111, the particle size, the size of the recess, and the material of the base material 60. For example, the base material 60 in which the solder fine particles 111 are filled into recesses is inserted into a furnace, the furnace is evacuated, a reducing gas is then introduced, the inside of the furnace is filled with a reducing gas, the oxide film on the surface of the solder fine particles 111 is removed, the reducing gas is then removed by evacuation, heating is then performed to a temperature equal to or higher than the melting point of the solder fine particles 111, the solder fine particles are dissolved and coalesced, the solder particles are formed in the recesses 62, the temperature in the furnace is then returned to room temperature after filling with nitrogen gas, and thus the solder particles 1 can be obtained. In addition, for example, the base material 60 in which the solder fine particles 111 are filled into recesses is inserted into a furnace, the furnace is evacuated, a reducing gas is then introduced, the inside of the furnace is filled with a reducing gas, the solder fine particles 111 are heated by a heater in the furnace, the oxide film on the surface of the solder fine particles 111 is removed, the reducing gas is then removed by evacuation, heating is then performed to a temperature equal to or higher than the melting point of the solder fine particles 111, the solder fine particles are dissolved and coalesced, the solder particles are formed in the recesses 62, the temperature in the furnace is then returned to room temperature after filling with nitrogen gas, and thus the solder particles 1 can be obtained. When the solder fine particles are heated under a reducing atmosphere, there are advantages that the reducing power increases and the oxide film on the surface of the solder fine particles is easily removed.

In addition, for example, the base material 60 in which the solder fine particles 111 are filled into recesses is inserted into a furnace, the furnace is evacuated, a reducing gas is then introduced, the inside of the furnace is filled with a reducing gas, the base material 60 are heated to a temperature equal to or higher than the melting point of the solder fine particles 111 by a heater in the furnace, the oxide film on the surface of the solder fine particles 111 is removed by reduction, and at the same time, the solder fine particles are dissolved and coalesced, the solder particles are formed in the recesses 62, the reducing gas is removed by evacuation, and additionally, the number of voids in the solder particles is reduced, the temperature in the furnace is then returned to room temperature after filling with nitrogen gas, and thus the solder particles 1 can be obtained. In this case, since it is easy to adjust the increase and decrease of the temperature in the furnace once, there is an advantage that processing can be performed in a short time.

A step in which the inside of the furnace is made into a reducing atmosphere again, and the oxide film on the surface that has not been completely removed is removed after the solder particles are formed in the recesses 62 may be additionally performed. Thereby, it is thus possible to reduce the amount of residue such as remaining unfused solder fine particles and a part of the unfused remaining oxide film.

When an atmospheric pressure conveyor furnace is used, the base material 60 in which the solder fine particles 111 are filled into recesses is placed on a transport conveyor and is caused to pass through a plurality of zones consecutively, and thus the solder particles 1 can be obtained. For example, the base material 60 in which the solder fine particles 111 are filled into recesses is placed on a conveyor set at a certain speed and caused to pass through a zone filled with an inert gas such as nitrogen or argon with a temperature lower than the melting point of the solder fine particles 111 and subsequently pass through a zone in which a reducing gas such as formic acid gas with a temperature lower than the melting point of the solder fine particles 111 is provided, the oxide film on the surface of the solder fine particles 111 is removed, and subsequently the material is caused to pass through a zone filled with an inert gas such as nitrogen and argon with a temperature equal to or higher than the melting point of the solder fine particles 111, the solder fine particles 111 are melted and coalesced, and subsequently the material is caused to pass through a cooling zone filled with an inert gas such as nitrogen and argon, and thus the solder particles 1 can be obtained. For example, the base material 60 in which the solder fine particles 111 are filled into recesses is placed on a conveyor set at a certain speed and caused to pass through a zone filled with an inert gas such as nitrogen and argon with a temperature equal to or higher than the melting point of the solder fine particles 111, subsequently pass through a zone in which a reducing gas such as formic acid gas with a temperature equal to or higher than the melting point of the solder fine particles 111 is provided, the oxide film on the surface of the solder fine particles 111 is removed, and melting and coalescing are performed, subsequently the material is caused to pass through a cooling zone filled with an inert gas such as nitrogen and argon, and thus the solder particles 1 can be obtained. Since the above conveyor furnace can perform processing at atmospheric pressure, it is possible to continuously process a film-like material in a roll to roll method. For example, a continuous roll product of the base material 60 in which the solder fine particles 111 are filled into recesses is produced, a roller unwinding machine is installed on the inlet side of the conveyor furnace, a roller winding machine is installed on the exit side of the conveyor furnace, the base material 60 is transported at a certain speed and caused to pass through zones in the conveyor furnace, and thus the solder fine particles 111 filled into the recesses can be fused.

According to the preparation step to the fusing step, it is possible to form the solder particles 1 having a uniform size regardless of the material and shape of the solder fine particles 111. For example, indium-based solder can be precipitated by plating, but is unlikely to be precipitated in the form of particles and is hard to handle because it is soft. However, in the above method, it is possible to easily produce indium-based solder particles having a uniform particle diameter using indium-based solder fine particles as a raw material. In addition, since the formed solder particles 1 that are accommodated in the recesses 62 of the base material 60 can be handled, the solder particles 1 can be transported and stored without being deformed. In addition, since the formed solder particles 1 are simply accommodated in the recesses 62 of the base material 60, they can be easily removed, and the solder particles can be collected and subjected to a surface treatment and the like without being deformed.

In addition, the solder fine particles 111 may have a large variation in the particle size distribution or may have a distorted shape, and can be suitably used as a raw material as long as they can be accommodated in the recesses 62.

In addition, in the above method, in the base material 60, the shape of the recesses 62 can be freely designed according to lithography, machining, or the like. Since the size of the solder particles 1 depends on the amount of the solder fine particles 111 accommodated in the recesses 62, the size of the solder particles 1 can be freely designed according to designing of the recesses 62.

The solder particles 1 formed in the fusing step may be directly used in the transfer step, or the solder particles 1 accommodated in the recesses 62 of the base material 60 and having surfaces coated with a flux component may be used in the transfer step, or the solder particles 1 which are removed from the recesses 62 and having surfaces coated with a flux component, and then accommodated again in the recesses 62 may be used in the transfer step. In addition, here, the base material 60 used for forming the solder particles 1 may be directly used in the transfer step, but when a step of removing the solder particles 1 from the recesses 62 is included, the removed solder particles 1 that are contained in a base material different from the base material 60 may be used in the transfer step.

The transfer step is a step in which an insulating resin material 2a is brought into contact with the base material 60 in which the solder particles 1 are accommodated in the recesses 62 from the opening side of the recesses 62, and thereby a first resin layer 2b to which the solder particles 1 are transferred is obtained.

In the base material 60 shown in (a) of FIG. 8, one solder particle 1 is accommodated in each of the recesses 62. The layered insulating resin material 2a is caused to face the surface on the opening side of the recesses 62 of the base material 60, and the base material 60 and insulating resin material are brought close to each other (arrows A and B in (a) of FIG. 8). Here, the layered insulating resin material 2a is formed on a surface of a support 80. The support 80 may be a plastic film or a metal foil.

FIG. 8(b) shows a state after the transfer step and a state in which the surface on the opening side of the recesses 62 of the base material 60 is brought into contact with the insulating resin material 2a, and thus the solder particles 1 accommodated in the recesses 62 of the base material 60 are transferred to the insulating resin material 2a. When the transfer step is performed, the first resin layer 2b composed of the layered insulating resin material 2a and the plurality of solder particles 1 disposed at predetermined positions of the insulating resin material 2a is obtained. The surface of the first resin layer 2b is exposed to the plurality of solder particles 1. Here, in the production method, all of the plurality of solder particles 1 of which the flat portion 11 faces a second resin layer 2d are disposed in the anisotropic conductive film 10.

The layering step is a step in which the second resin layer 2d made of an insulating resin material is formed on a surface 2c of the first resin layer 2b on the side to which the solder particles 1 are transferred and thereby the anisotropic conductive film 10 is obtained.

FIG. 8(c) shows a state after the layering step and a state in which the second resin layer 2d is formed on the surface 2c of the first resin layer 2b so that the solder particles 1 are covered, and the support 80 is then removed. The second resin layer 2d may be formed by laminating an insulating film made of an insulating resin material on the first resin layer 2b or may be formed by covering the first resin layer 2b with a varnish containing an insulating resin material and then performing a curing treatment.

Next, a method for producing an anisotropic conductive film 10 according to a second embodiment will be described with reference to FIG. 9.

In the second embodiment, after the preparation step, the accommodation step and the fusing step are performed in the same manner as in the first embodiment, and in the transfer step, the insulating resin material is caused to enter the recesses 62, and the solder particles 1 are embedded in the first resin layer 2b.

In the base material 60 shown in (a) of FIG. 9, one solder particle 1 is accommodated in each of the recesses 62. The layered insulating resin material 2a is caused to face the surface on the opening side of the recesses 62 of the base material 60, and the base material 60 and the insulating resin material 2a are brought close to each other (arrows A and B in (a) of FIG. 9).

FIG. 9(b) shows a state after the transfer step and a state in which the surface on the opening side of the recesses 62 of the base material 60 is brought into contact with the insulating resin material 2a, and thus the solder particles 1 accommodated in the recesses 62 of the base material 60 are transferred to the insulating resin material 2a. When the transfer step is performed, the first resin layer 2b in which the plurality of solder particles 1 are disposed at predetermined positions is obtained. A plurality of convex parts 2e corresponding to the recesses 62 are formed on the side of the surface 2c of the first resin layer 2b, and the solder particles 1 are embedded in these convex parts 2e. In order to obtain such a first resin layer 2b, in the transfer step, the insulating resin material 2a is caused to enter the recesses 62. Specifically, the base material 60 and the insulating resin material 2a are pressurized in the lamination direction (directions indicated by arrows A and B in (a) of FIG. 9), and thus the insulating resin material 2a may be caused to enter the recesses 62. In addition, when the transfer step is performed under a reduced pressure atmosphere, the insulating resin material 2a easily enters the recesses 62. In addition, in FIG. 9, the transfer step is performed using the layered insulating resin material 2a, but a varnish containing an insulating resin material can be applied to the recesses 62 and to the surface of the base material 60, and cured to obtain the first resin layer 2b.

FIG. 9(c) shows a state after the layering step and a state in which the second resin layer 2d is formed on the surface 2c of the first resin layer 2b and the support 80 is then removed. The second resin layer 2d may be formed by laminating an insulating film made of an insulating resin material on the first resin layer 2b or may be formed by covering the first resin layer 2b with a varnish containing an insulating resin material and then performing a curing treatment.

Here, in the production method, all of the plurality of solder particles 1 of which the flat portion 11 faces the second resin layer 2d are disposed in an anisotropic conductive film 10. When a method in which the solder particles 1 formed in the fusing step are removed temporarily and subjected to a treatment such as coating with a flux component, and disposed again in the recesses 62 is used, directions of the flat portions 11 of the plurality of solder particles 1 may be different from each other. (a) of FIG. 10 shows a state in which the solder particles 1 that have removed temporarily are disposed again in the recesses 62. When the transfer step and the layering step are performed in such a state, the plurality of solder particles 1 of which directions of the flat portions 11 do not match are disposed in the anisotropic conductive film 10. (b) of FIG. 10 is a diagram showing a state in which the plurality of solder particles 1 of which directions of the flat portions 11 do not match are disposed in the anisotropic conductive film 10.

<Connection Structure>

FIG. 11 is a cross-sectional view schematically showing an enlarged part of a connection structure 50A according to the present embodiment. That is, FIG. 11 schematically shows a state in which an electrode 32 of a first circuit member 30 and an electrode 42 of a second circuit member 40 are electrically connected via a solder layer 70 formed by fusion. In this specification, as described above, "fusion" means a state in which at least a part of an electrode is bonded by the solder particles 1 melted by heat, and then subjected to a solidification step, and thus the solder is bonded to the surface of the electrode. The first circuit member 30 includes a first circuit substrate 31 and the first electrode 32 disposed on a surface 31a. The second circuit member 40 includes a second circuit substrate 41 and the second electrode 42 arranged on a surface 41a. An insulating resin layer 55 filled between the circuit members 30 and 40 maintains a state in which the first circuit member 30 and the second circuit member 40 are adhered and maintains a state in which the first electrode 32 and the second electrode 42 are electrically connected.

Specific examples of one of the circuit members 30 and 40 include chip components such as an IC chip (semiconductor chip), a resistor chip, a capacitor chip, and a driver IC; and a rigid type package substrate. These circuit members include a circuit electrode, and generally include a large number of circuit electrodes. Specific other examples for the circuit members 30 and 40 include wiring substrates such as a flexible tape substrate having a metal wiring, a flexible printed wiring board, and a glass substrate on which indium tin oxide (ITO) is deposited.

Specific examples of the first electrode 32 or the second electrode 42 include copper, copper/nickel, copper/nickel/gold, copper/nickel/palladium, copper/nickel/palladium/gold, copper/nickel/gold, copper/palladium, copper/palladium/gold, copper/tin, copper/silver, and indium tin oxide electrodes. The first electrode 32 or the second electrode 42 can be formed by electroless plating, electroplating or sputtering.

FIG. 12 is a cross-sectional view schematically showing a connection structure 50B which is a modification example of the connection structure 50A shown in FIG. 11. In the connection structure 50B, the solder layer 70 is partially fused to the electrode 32 of the first circuit member 30 and the electrode 42 of the second circuit member 40.

FIG. 13 is a cross-sectional view schematically showing a connection structure 50C which is a modification example of the connection structure 50A shown in FIG. 11. FIG. 13 shows a case in which the first electrode 32 and the second electrode 42 are made of copper, and particularly a cross section of an electrode part after being left at a high temperature. A layer 71 made of an intermetallic compound is formed by being left at a high temperature.

FIG. 14 is a cross-sectional view schematically showing a connection structure 50D which is a modification example of the connection structure 50A shown in FIG. 11. FIG. 14 shows a case in which the first electrode 32 and the second electrode 42 are made of copper, and particularly a cross section of an electrode part after being left at a high temperature. The layer 71 made of an intermetallic compound is formed by being left at a high temperature. Comparing FIG. 13, FIG. 14 shows a case in which the layer 71 made of an intermetallic compound is formed to be thicker by being left at a high temperature and, when an impact such as a drop impact is applied, the reliability decreases.

FIG. 15 is a cross-sectional view schematically showing a connection structure 50E which is a modification example of the connection structure 50A shown in FIG. 11. FIG. 15 shows a case in which the first electrode 32 and the second electrode 42 are made of copper, and particularly a cross section of an electrode part after being left at a high temperature. The layer 71 made of an intermetallic compound is formed by being left at a high temperature. Comparing FIG. 13, FIG. 15 shows a case in which the thickness of the solder layer 70 formed between the first electrode 32 and the second electrode 42 is thinner.

FIG. 16 is a cross-sectional view schematically showing a connection structure 50F which is a modification example of the connection structure 50A shown in FIG. 11. FIG. 16 shows a case in which the first electrode 32 and the second electrode 42 are made of copper and a cross section of an electrode part after additionally being left at a high temperature in FIG. 15. The layer 71 made of an intermetallic compound is formed by being left at a high temperature. This case shows that the solder layer is completely changed to an intermetallic compound and the layer 71 having a thin thickness and made of an intermetallic compound is formed. Comparing FIG. 13, FIG. 16 shows that, even if the thickness of the original solder layer formed between the first electrode 32 and the second electrode 42 is thin and the solder layer is completely changed to an intermetallic compound, the layer 71 made of an intermetallic compound is thin. Generally, in the case of the layer of the intermetallic compound is thick, when an impact such as a drop impact is applied, the reliability tends to decrease. However, when the solder layer is completely changed to an intermetallic compound and exists as a thin layer, even if a drop impact is applied, it is possible to maintain high reliability. The thickness of the layer 71 of the intermetallic compound is preferably 0.1 to 10.0 μm, more preferably 0.3 to 8.0 μm, and still more preferably 0.5 to 6.0 μm.

<Method for Producing Connection Structure>

A method for producing a connection structure will be described with reference to (a) of FIG. 17 and (b) of FIG. 17. These figures are cross-sectional views schematically showing an example of a process of forming the connection structure 50A shown in FIG. 11. First, the anisotropic conductive film 10 shown in FIG. 1 is prepared in advance and is arranged so that the first circuit member 30 and the second circuit member 40 face each other (FIG. 17(a)). In this case, the first electrode 32 of the first circuit member 30 and the second electrode 42 of the second circuit member 40 are installed so that they face each other. Then, pressurizing is performed in a thickness direction (directions indicated by an arrow A and an arrow B in (a) of FIG. 17) of a laminate of these members. When pressurizing is performed in directions indicated by the arrow A and the arrow B, at least heating is performed at a temperature (for example, 130 to 260° C.) higher than the melting point of the solder particles 1 as a whole, and all of the solder particles 1 are melted and gather between the first electrode 32 and the second electrode 42, the solder layer 70 is formed and then cooled, the solder layer 70 is thus fixed between the first electrode 32 and the second electrode 42, and the first electrode 32 and the second electrode 42 are electrically connected.

In the case of the insulating film 2 is made of, for example, a thermosetting resin, and heating is performed as a whole when pressurizing is performed in directions indicated by the arrow A and the arrow B, the thermosetting resin can be cured. Thereby, the insulating resin layer 55 made of a cured product of a thermosetting resin is formed between the circuit members 30 and 40.

FIG. 18 is a cross-sectional view schematically showing a modification example of the method for producing the connection structure 50A shown in FIG. 17. In the production method according to this modification example, while some of the solder particles 1 remain in the insulating resin layer 55 without contributing to fusion of the electrodes 32 and 42, since the solder particles 1 are simply disposed at specific positions in the anisotropic conductive film 10, that is, the density of the solder particles 1 is sufficiently low, high insulation reliability can be maintained.

FIG. 19 is a cross-sectional view schematically showing a modification example of a method for producing the connection structure 50A shown in FIG. 17. In the production method according to this modification example, substantially all of the solder particles 1 form the solder layer 70, and the first electrode 32 of the first circuit member 30 and the second electrode 42 of the second circuit member 40 are fused. When disposition of the solder particles 1 in the anisotropic conductive film 10 is designed in advance, it is possible to reduce the amount of the remaining solder particles 1 as much as possible without contributing to fusion. Thereby, it is possible to further improve the reliability of insulation of the connection structure.

FIG. 20, FIG. 21, FIG. 22 and FIG. 23 are diagrams schematically showing a relationship between positions of the solder particles 1 of the anisotropic conductive film 10 and positions of the first electrode 32 before pressurizing and heating are performed.

Examples of devices to which the connection structures according to the above embodiments and modification examples thereof are applied include liquid crystal displays, personal computers, mobile phones, smartphones, and tablets.

While preferred embodiments of the present invention have been described above, the present invention is not limited to the above embodiments.

EXAMPLES

The present invention will be described below in more detail with reference to examples, but the present invention is not limited to these examples.

<Production Example 1>

(Step a1) Classification of solder fine particles 100 g of Sn—Bi solder fine particles (Type 8 commercially available from 5N Plus, a melting point of 139° C.) were immersed in distilled water and ultrasonically dispersed and then left, and the solder fine particles suspended in the supernatant were collected. This operation was repeated, and 10 g of the solder fine particles were collected. The average particle diameter of the obtained solder fine particles was 1.0 μm, and the C.V. value was 42%.

(Step b1) Disposition in base material

A base material (polyimide film, a thickness of 100 μm) having a plurality of recesses with an opening diameter of 1.2 μmφ, a bottom diameter of 1.0 μmφ, and a depth of 1.0 μm (when the opening part was viewed from the top, the bottom diameter of 1.0 μmφ corresponded to the opening diameter of 1.2 μmφ at the center) was prepared. The plurality of recesses were regularly arranged at intervals of 1.0 μm. The solder fine particles (with an average particle diameter of 1.0 μm and a C.V. value of 42%) obtained in Step a1 were disposed in the recesses of the base material. Here, the surface side on which the recesses of the base material were formed was rubbed with a fine adhesive roller, excess solder fine particles were removed, and a base material in which the solder fine particles were disposed only in the recesses was obtained.

(Step c1) Formation of solder particles

The base material in which the solder fine particles were disposed in the recesses in Step b1 was put into a hydrogen reduction furnace (vacuum soldering device commercially available from Shinko Seiki Co., Ltd.), the furnace was evacuated, hydrogen gas was introduced into the furnace, and the inside of the furnace was filled with hydrogen. Then, the temperature in the furnace was kept at 280° C. for 20 minutes, the furnace was then evacuated again, nitrogen was introduced to return to atmospheric pressure, the temperature in the furnace was then lowered to room temperature, and thereby solder particles were formed.

(Step d1) Collection of solder particles

When the base material that had undergone Step c1 was tapped from the back side of the recess, the solder particles were collected from the recess. The obtained solder particles were evaluated according to the following method.

(Evaluation of Solder Particles)

The obtained solder particles were placed on a conductive tape fixed to a surface of a pedestal for SEM observation, the pedestal for SEM observation was tapped on a stainless steel plate with a thickness of 5 mm, and the solder particles spread evenly on the conductive tape. Then, compressed nitrogen gas was sprayed onto the surface of the conductive tape and the solder particles were fixed as a single layer on the conductive tape. The diameters of 300 solder particles were measured using the SEM, and the average particle diameter and the C.V. value were calculated. The results are shown in Table 2.

Production Examples 2 to 12

Solder particles were produced, collected and evaluated in the same manner as in Production Example 1 except that the size of the recess was changed as shown in Table 1. The results are shown in Table 2.

Production Example 13

Solder particles were produced, collected and evaluated in the same manner as in Production Example 1 except that the following Step c2 was performed in place of Step c1. The results are shown in Table 2.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 14 to 24

Solder particles were produced, collected and evaluated in the same manner as in Production Example 13 except that the size of the recess was changed as shown in Table 1. The results are shown in Table 2.

<Production Example 25>

Solder particles were produced, collected and evaluated in the same manner as in Production Example 1 except that the following Step c3 was performed in place of Step c1. The results are shown in Table 2.

(Step c3) Formation of solder particles

The base material in which the solder fine particles were disposed in the recesses in Step b1 was put into a formic acid reduction furnace, the furnace was evacuated, a formic acid gas was then introduced into the furnace, and the inside of the furnace was filled with a formic acid gas. Then, the temperature in the furnace was adjusted to 130° C. and maintained for 5 minutes. Then, the formic acid gas in the furnace was removed by evacuation, heating was performed to 180° C., nitrogen was then introduced into the furnace to return to atmospheric pressure, the temperature in the furnace was then lowered to room temperature, and thereby solder particles were formed.

Production Examples 26 to 36

Solder particles were produced, collected and evaluated in the same manner as in Production Example 25 except that the size of the recess was changed as shown in Table 1. The results are shown in Table 2.

<Production Example 37>

Solder particles were produced, collected and evaluated in the same manner as in Production Example 1 except that the following Step c4 was performed in place of Step c1. The results are shown in Table 2.

(Step c4) Formation of solder particles

The base material in which the solder fine particles were disposed in the recesses in Step b1 was put into a formic acid conveyor reflow furnace (1913MK commercially available from Heller Industries, Inc.), and caused to pass through a nitrogen zone, a nitrogen and formic acid gas mixture zone, and a nitrogen zone consecutively while it was transported by the conveyor. The material was caused to pass through the nitrogen and formic acid gas mixture zone in 5 minutes, and thereby solder particles were formed.

Production Examples 38 to 48

Solder particles were produced, collected and evaluated in the same manner as in Production Example 37 except that the size of the recess was changed as shown in Table 1. The results are shown in Table 2.

TABLE 1

| | | Production Example 1 | Production Example 2 | Production Example 3 | Production Example 4 | Production Example 5 | Production Example 6 | Production Example 7 | Production Example 8 | Production Example 9 | Production Example 10 | Production Example 11 | Production Example 12 |
|---|---|---|---|---|---|---|---|---|---|---|---|---|---|
| Opening diameter | μm | 1.2 | 1.7 | 2.3 | 3.3 | 4.3 | 5.3 | 6.3 | 11 | 15 | 26 | 33 | 40 |
| Bottom diameter | μm | 1 | 1.5 | 2 | 3 | 4 | 5 | 6 | 10 | 15 | 26 | 33 | 40 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

| | | Production Example 13 | Production Example 14 | Production Example 15 | Production Example 16 | Production Example 17 | Production Example 18 | Production Example 19 | Production Example 20 | Production Example 21 | Production Example 22 | Production Example 23 | Production Example 24 |
|---|---|---|---|---|---|---|---|---|---|---|---|---|---|
| Opening diameter | μm | 1.2 | 1.7 | 2.3 | 3.3 | 4.3 | 5.3 | 6.3 | 11 | 15 | 26 | 33 | 40 |
| Bottom diameter | μm | 1 | 1.5 | 2 | 3 | 4 | 5 | 6 | 10 | 15 | 26 | 33 | 40 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

| | | Production Example 25 | Production Example 26 | Production Example 27 | Production Example 28 | Production Example 29 | Production Example 30 | Production Example 31 | Production Example 32 | Production Example 33 | Production Example 34 | Production Example 35 | Production Example 36 |
|---|---|---|---|---|---|---|---|---|---|---|---|---|---|
| Opening diameter | μm | 1.2 | 1.7 | 2.3 | 3.3 | 4.3 | 5.3 | 6.3 | 11 | 15 | 26 | 33 | 40 |
| Bottom diameter | μm | 1 | 1.5 | 2 | 3 | 4 | 5 | 6 | 10 | 15 | 26 | 33 | 40 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

| | | Production Example 37 | Production Example 38 | Production Example 39 | Production Example 40 | Production Example 41 | Production Example 42 | Production Example 43 | Production Example 44 | Production Example 45 | Production Example 46 | Production Example 47 | Production Example 48 |
|---|---|---|---|---|---|---|---|---|---|---|---|---|---|
| Opening diameter | μm | 1.2 | 1.7 | 2.3 | 3.3 | 4.3 | 5.3 | 6.3 | 11 | 15 | 26 | 33 | 40 |
| Bottom diameter | μm | 1 | 1.5 | 2 | 3 | 4 | 5 | 6 | 10 | 15 | 26 | 33 | 40 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

TABLE 2

| | | Production Example 1 | Production Example 2 | Production Example 3 | Production Example 4 | Production Example 5 | Production Example 6 | Production Example 7 | Production Example 8 | Production Example 9 | Production Example 10 | Production Example 11 | Production Example 12 |
|---|---|---|---|---|---|---|---|---|---|---|---|---|---|
| Average particle diameter | μm | 1 | 1.5 | 2 | 3 | 4 | 5 | 6 | 10 | 15 | 20 | 25 | 30 |
| C.V. value | % | 19 | 16 | 14 | 10 | 7.9 | 7.8 | 6.6 | 5.2 | 4.4 | 4.2 | 3.9 | 3.3 |

| | | Production Example 13 | Production Example 14 | Production Example 15 | Production Example 16 | Production Example 17 | Production Example 18 | Production Example 19 | Production Example 20 | Production Example 21 | Production Example 22 | Production Example 23 | Production Example 24 |
|---|---|---|---|---|---|---|---|---|---|---|---|---|---|
| Average particle diameter | μm | 0.9 | 1.3 | 1.8 | 2.7 | 3.8 | 4.8 | 6 | 9 | 14 | 19 | 24 | 29 |
| C.V. value | % | 10 | 10 | 9.6 | 9.3 | 7.9 | 7.8 | 6.6 | 5.2 | 4.4 | 4.2 | 3.9 | 3.3 |

TABLE 2-continued

|  |  | Production Example 25 | Production Example 26 | Production Example 27 | Production Example 28 | Production Example 29 | Production Example 30 | Production Example 31 | Production Example 32 | Production Example 33 | Production Example 34 | Production Example 35 | Production Example 36 |
|---|---|---|---|---|---|---|---|---|---|---|---|---|---|
| Average particle diameter | μm | 1 | 1.5 | 2 | 3 | 4 | 5 | 6 | 10 | 15 | 20 | 25 | 30 |
| C.V. value | % | 16 | 15 | 12 | 9.5 | 7.9 | 7.4 | 6.6 | 5.2 | 4.4 | 4.2 | 3.9 | 3.3 |

|  |  | Production Example 37 | Production Example 38 | Production Example 39 | Production Example 40 | Production Example 41 | Production Example 42 | Production Example 43 | Production Example 44 | Production Example 45 | Production Example 46 | Production Example 47 | Production Example 48 |
|---|---|---|---|---|---|---|---|---|---|---|---|---|---|
| Average particle diameter | μm | 1 | 1.5 | 2 | 3 | 4 | 5 | 6 | 10 | 15 | 20 | 25 | 30 |
| C.V. value | % | 11 | 10 | 9.9 | 9.5 | 7.8 | 7.4 | 6.4 | 5.3 | 4.5 | 4.4 | 4.0 | 3.9 |

Example 1

(A) Production of Anisotropic Conductive Film
(Step e1) Production of Flux-Coated Solder Particles Solder particles were produced in the same method as in Production Example 13. 200 g of the obtained solder particles, 40 g of adipic acid, and 70 g of acetone were weighed out in a three-neck flask, and 0.3 g of dibutyl tin oxide that catalysts a dehydration condensation reaction between hydroxy groups on the surface of the solder particles and carboxylic groups of adipic acid was then added thereto and reacted at 60° C. for 4 hours. Then, the solder particles were collected by filtration. The collected solder particles, 50 g of adipic acid, 200 g of toluene, and 0.3 g of para-toluene sulfonic acid were weighed out in a three-neck flask and reacted at 120° C. for 3 hours while evacuating and refluxing. In this case, the reaction was performed while removing water generated by dehydration condensation using a Dean-Stark extraction device. Then, the solder particles were collected by filtration, washed with hexane and dried. The dried solder particles were crushed by an airflow type crusher, passed through a mesh with an ultrasonic sieve, and thereby flux-coated solder particles were obtained.

(Step f1) Disposition of Flux-Coated Solder Particles

A transfer mold (polyimide film, a thickness of 100 μm) having a plurality of recesses with an opening diameter of 1.2 μmφ, a bottom diameter of 1.0 μmφ, and a depth of 1.0 μm (when the opening part was viewed from the top, the bottom diameter of 1.0 μmφ corresponded to the opening diameter of 1.2 μmφ at the center) was prepared. Here, the plurality of recesses were regularly arranged at intervals of 1.0 μm. The flux-coated solder particles obtained in Step e1 were disposed in the recesses of the transfer mold.

(Step g1) Production of Adhesive Film 100 g of a phenoxy resin (product name "PKHC" commercially available from Union Carbide Corporation) and 75 g of an acrylic rubber (a copolymer containing 40 parts by mass of butyl acrylate, 30 parts by mass of ethyl acrylate, 30 parts by mass of acrylonitrile, and 3 parts by mass of glycidyl methacrylate, molecular weight: 850,000) were dissolved in 400 g of ethyl acetate to obtain a solution. 300 g of a liquid epoxy resin containing a microcapsule type latent curing agent (epoxy equivalent 185, product name "Novacure HX-3941" commercially available from Asahi Kasei Corporation) was added to the solution, and the mixture was stirred to obtain an adhesive solution. The obtained adhesive solution was applied to a separator (silicone-treated polyethylene terephthalate film, a thickness of 40 μm) using a roll coater, and heated at 90° C. for 10 minutes and dried, and adhesive films (insulating resin films) having a thickness of 4, 6, 8, 12 and 20 μm were prepared on the separator.

(Step h1) Transfer of Flux-Coated Solder Particles

The adhesive film formed on the separator and the transfer mold in which the flux-coated solder particles were disposed in Step f1 were arranged to face each other, and the flux-coated solder particles were transferred to the adhesive film.

(Step i1) Production of Anisotropic Conductive Film

The adhesive film produced in the same method as in Step g1 was brought into contact with a transfer surface of the adhesive film obtained in Step h1, and heated and pressurized at 50° C. and 0.1 MPa (1 kgf/cm$^2$), and an anisotropic conductive film in which the flux-coated solder particles were disposed in layers in a cross-sectional view of the film was obtained. Here, 4 μm was superimposed for a film with a thickness of 4 μm, and similarly, 6 μm was superimposed for a film with a thickness of 6 μm, 8 μm was superimposed for a film with a thickness of 8 μm, 12 μm was superimposed for a film with a thickness of 12 μm, and 20 μm was superimposed for a film with a thickness of 20 μm, and anisotropic conductive films having a thickness of 8 μm, 12 μm, 16 μm, 24 μm and 40 μm were produced.

(B) Production of Connection Structure
(Step j1) Preparation of Chip with Copper Bumps Five types of chips with copper bumps (1.7×1.7 mm, thickness: 0.5 mm) shown below were prepared.
  Chip C1 . . . area 30 μm×30 μm, space 30 μm, height: 10 μm, number of bumps 362
  Chip C2 . . . area 15 μm×15 μm, space 10 μm, height: 10 μm, number of bumps 362
  Chip C3 . . . area 10 μm×10 μm, space 10 μm, height: 7 μm, number of bumps 362
  Chip C4 . . . area 5 μm×5 μm, space 6 μm, height: 5 μm, number of bumps 362
  Chip C5 . . . area 3 μm×3 μm, space 3 μm, height: 5 μm, number of bumps 362

(Step k1) Preparation of Substrate with Copper Bumps

Five types of substrates with copper bumps (thickness: 0.7 mm) shown below were prepared.
  Substrate D1 . . . area 30 μm×30 μm, space 30 μm, height: 10 μm, number of bumps 362
  Substrate D2 . . . area 15 μm×15 μm, space 10 μm, height: 10 μm, number of bumps 362

Substrate D3 ... area 10 μm×10 μm, space 10 μm, height: 7 μm, number of bumps 362

Substrate D4 ... area 5 μm×5 μm, space 6 μm, height 5 μm, number of bumps 362

Substrate D5 ... area 3 μm×3 μm, space 3 μm, height: 5 μm, number of bumps 362

(Step I1)

Next, using the anisotropic conductive film produced in Step i1, a chip with copper bumps (1.7×1.7 mm, thickness: 0.5 mm) and a substrate with copper bumps (thickness: 0.7 mm) were connected according to the following procedures i) to iii) to obtain a connection structure.

i) A separator (silicone-treated polyethylene terephthalate film, a thickness of 40 μm) on one surface of the anisotropic conductive film (2×19 mm) was peeled off, and the anisotropic conductive film and the substrate with copper bumps were brought into contact with each other and bonded at 80° C. and 0.98 MPa (10 kgf/cm$^2$).

ii) The separator was peeled off, and the bumps of the chip with copper bumps and the bumps of the substrate with copper bumps were aligned.

iii) Heating and pressurizing were performed from above the chip under conditions of 180° C., 40 gf/bump, and 30 seconds, and thus connection was performed. A total of seven types of connection structures according to (1) to (7) were produced by combining the following (1) to (7) "chip/anisotropic conductive film/substrate"

(1) Chip C1/conductive film with a thickness of 40 μm/substrate D1
(2) Chip C1/conductive film with a thickness of 24 μm/substrate D1
(3) Chip C1/conductive film with a thickness of 16 μm/substrate D1
(4) Chip C2/conductive film with a thickness of 16 μm/substrate D2
(5) Chip C3/conductive film with a thickness of 12 μm/substrate D3
(6) Chip C4/conductive film with a thickness of 8 μm/substrate D4
(7) Chip C5/conductive film with a thickness of 8 μm/substrate D5

Examples 2 to 12

An anisotropic conductive film and a connection structure were produced in the same method as in Example 1 except that the solder particles produced in the same method as in Production Examples 14 to 24 were used and a transfer mold having the same shape as the base material used in production of the solder particles of Production Examples 14 to 24 was used as a transfer mold.

Comparative Example 1

An anisotropic conductive film and a connection structure were produced in the same method as in Example 1 except that Sn—Bi solder particles ("Type-4" commercially available from Mitsu Mining & Smelting Co., Ltd., an average particle diameter of 26 μm and a C.V. value of 25%) were used as solder particles.

Comparative Example 2

A solder particles-containing anisotropic conductive paste containing the following components in the following parts by mass was produced.

(Polymer): 12 parts by mass
(Thermosetting compound): 29 parts by mass
(High dielectric constant curing agent): 20 parts by mass
(Thermosetting agent): 11.5 parts by mass
(Flux): 2 parts by mass
(Solder particles) 34 parts by mass
(Polymer):

72 parts by mass of bisphenol F (containing 4,4'-methylene bisphenol, 2,4'-methylene bisphenol and 2,2'-methylene bisphenol at a mass ratio of 2:3:1), 70 parts by mass of 1,6-hexanediol diglycidyl ether, and 30 parts by mass of a bisphenol F type epoxy resin ("EPICLON EXA-830CRP" commercially available from DIC) were put into a three-neck flask and dissolved at 150° C. under a nitrogen flow. Then, 0.1 parts by mass of tetra n-butyl sulfonium bromide as an addition reaction catalyst for hydroxy groups and epoxy groups was added, and an addition polymerization reaction was performed at 150° C. for 6 hours under a nitrogen flow to obtain a reaction product (polymer).

(Thermosetting compound): resorcinol type epoxy compound, "EX-201" commercially available from Nagase ChemteX Corporation (High dielectric constant curing agent): pentaerythritol tetrakis(3-mercaptobutyrate)

(Thermosetting agent): "Karenz MT PE1" commercially available from Showa Denko K.K.

(Flux): adipic acid, commercially available from Wako Pure Chemical Corporation (Solder particles):

200 g of SnBi solder particles ("ST-3" commercially available from Mitsu Mining & Smelting Co., Ltd.), 40 g of adipic acid, and 70 g of acetone were weighed out in a three-neck flask, and 0.3 g of dibutyl tin oxide as a dehydration condensation catalyst for hydroxy groups on the surface of solder particle bodies and carboxylic groups of adipic acid was then added thereto and reacted at 60° C. for 4 hours. Then, the solder particles were collected by filtration. The collected solder particles, 50 g of adipic acid, 200 g of toluene, and 0.3 g of para-toluene sulfonic acid were weighed out in a three-neck flask, and reacted at 120° C. for 3 hours while evacuating and refluxing. In this case, the reaction was performed while removing water generated by dehydration condensation using a Dean-Stark extraction device. Then, the solder particles were collected by filtration, washed with hexane and dried. Then, the obtained solder particles were crushed with a ball mill and a sieve was then selected so that a predetermined CV value was obtained. The average particle diameter of the obtained SnBi solder particles was 4 μm and the CV value was 32%.

A chip with copper bumps and a substrate with copper bumps were prepared in the same manner as in Example 1. The solder particles-containing anisotropic conductive paste was disposed above the substrate with copper bumps and the chip with copper bumps was additionally disposed thereon. The bumps of the chip with copper bumps and the bumps of the substrate with copper bumps were aligned, heating and pressurizing were performed from above the chip under conditions of 180° C., 4 gf/bump, and 30 seconds, and thus connection was performed. A total of seven types of connection structures according to (1) to (7) were produced by combining the following (1) to (7).

(1) Chip C1/solder particles-containing anisotropic conductive paste with a thickness of 40 μm (on copper bumps)/substrate D1,
(2) Chip C1/solder particles-containing anisotropic conductive paste with a thickness of 24 μm (on copper bumps)/substrate D1, (3) Chip C1/solder particles-containing anisotropic conductive paste with a thickness of 16 μm (on copper bumps)/substrate D1,
(4) Chip C2/solder particles-containing anisotropic conductive paste with a thickness of 16 μm (on copper bumps)/substrate D2,
(5) Chip C3/solder particles-containing anisotropic conductive paste with a thickness of 12 μm (on copper bumps)/substrate D3,
(6) Chip C4/solder particles-containing anisotropic conductive paste with a thickness of 8 μm (on copper bumps)/substrate D4, and
(7) Chip C5/solder particles-containing anisotropic conductive paste with a thickness of 8 μm (on copper bumps)/substrate D5 were connected in combination to obtain the following connection structures (1) to (7).

[Evaluation of Connection Structure]

A conduction resistance test and an insulation resistance test were performed on a part of the obtained connection structure as follows.

(Conduction Resistance Test-Moisture Absorption and Heat Resistance Test)

Regarding the conduction resistance between the chip with copper bumps (bumps)/the substrate with copper bumps (bumps), the initial value of the conduction resistance and the value after the moisture absorption and heat resistance test (being left under conditions of a temperature of 85° C. and a humidity of 85% for 100, 500, and 1,000 hours) were measured for 20 samples, and the average value thereof was calculated. The conduction resistance was evaluated from the obtained average value according to the following criteria. The results are shown in Table 3. Here, when the following criterion A or B was satisfied after the moisture absorption and heat resistance test was performed for 1,000 hours, the conduction resistance was evaluated as favorable.

A: Average value of the conduction resistance was less than 2 Ω
B: Average value of the conduction resistance was 2Ω or more and less than 5 Ω
C: Average value of the conduction resistance was 5Ω or more and less than 10 Ω
D: Average value of the conduction resistance was 10Ω or more and less than 20 Ω
E: Average value of the conduction resistance was 20Ω or more (Conduction Resistance Test/High Temperature Endurance Test)

Regarding the conduction resistance between the chip with copper bumps (bumps)/the substrate with copper bumps (bumps), the samples were measured before being left at a high temperature and after the high temperature endurance test (being left under conditions of a temperature of 100° C. for 100, 500, and 1,000 hours). Here, after being left at a high temperature, a drop impact was applied and the conduction resistance of the sample after the drop impact was measured. For the drop impact, the connection structure was screwed and fixed to a metal plate and dropped from a height of 50 cm. After being dropped, the DC resistance value was measured at solder bonding parts (4 points) on a chip corner in which the impact was greatest, and evaluation was performed assuming that breakage had occurred when the measured value increased to 5 or more times the initial resistance. Here, the measurement was performed at 4 points for 20 samples, for a total of 80 points. The results are shown in Table 4. When the following criterion A or B was satisfied after 20 drops, the solder connection reliability was evaluated as favorable.

A: After 20 drops, no solder connecting parts having a value increased to 5 or more times the initial resistance was observed at any of the 80 points.
B: After 20 drops, a solder connecting part having a value increased to 5 or more times the initial resistance was observed at 1 point or more and 5 points or less.
C: After 20 drops, a solder connecting part having a value increased to 5 or more times the initial resistance was observed at 6 points or more and 20 points or less.
D: After 20 drops, a solder connecting part having a value increased to 5 or more times the initial resistance was observed at 21 points or more.

(Insulation Resistance Test)

Regarding the insulation resistance between chip electrodes, the initial value of the insulation resistance and the value after the migration test (being left under conditions of a temperature of 60° C., a humidity of 90%, and 20 V application for 100, 500, 1,000 hours) were measured for 20 samples, and a proportion of samples having an insulation resistance value of $10^9 Ω$ or more with respect to all 20 samples was calculated. The insulation resistance was evaluated from the obtained proportion according to the following criteria. The results are shown in Table 5. Here, when the following criterion A or B was satisfied after the moisture absorption and heat resistance test was performed for 1,000 hours, the insulation resistance was evaluated as favorable.

A: Proportion with an insulation resistance value of $10^9 Ω$ or more was 100%
B: Proportion with an insulation resistance value of $10^9 Ω$ or more was 90% or more and less than 100%
C: Proportion with an insulation resistance value of $10^9 Ω$ or more was 80% or more and less than 90%
D: Proportion with an insulation resistance value of $10^9 Ω$ or more was 50% or more and less than 80%
E: Proportion with an insulation resistance value of $10^9 Ω$ or more was less than 50%

TABLE 3

| | | | | Example 1 Production Example 13 | Example 2 Production Example 14 | Example 3 Production Example 15 | Example 4 Production Example 16 | Example 5 Production Example 17 | Example 6 Production Example 18 | Example 7 Production Example 19 | Example 8 Production Example 20 |
|---|---|---|---|---|---|---|---|---|---|---|---|
| | | Connection structure | Solder particles | | | | | | | | |
| Conduction resistance | Moisture absorption and heat resistance test | (1) | Initial | | | | | | | | |
| | | | After 100 hours | | | | | | | | |
| | | | After 500 hours | | | | | | | | |
| | | | After 1,000 hours | | | | | | | | |
| | | (2) | Initial | | | | | | | | A |
| | | | After 100 hours | | | | | | | | B |
| | | | After 500 hours | | | | | | | | B |
| | | | After 1,000 hours | | | | | | | | B |

TABLE 3-continued

| | | | | | Example 9 Production Example 21 | Example 10 Production Example 22 | Example 11 Production Example 23 | Example 12 Production Example 24 | Comparative Example 1 | Comparative Example 2 |
|---|---|---|---|---|---|---|---|---|---|---|
| | | (3) | Initial | | A | A | A | A | A | |
| | | | After 100 hours | | B | B | A | A | A | A |
| | | | After 500 hours | | B | B | A | A | A | A |
| | | | After 1,000 hours | | B | B | A | A | A | A |
| | | (4) | Initial | | A | A | A | A | A | A |
| | | | After 100 hours | | B | A | A | A | A | A |
| | | | After 500 hours | | B | A | A | A | A | A |
| | | | After 1,000 hours | | B | A | A | A | A | A |
| | | (5) | Initial | A | A | A | A | A | A | A |
| | | | After 100 hours | B | B | A | A | A | A | A |
| | | | After 500 hours | B | B | A | A | A | A | A |
| | | | After 1,000 hours | B | B | A | A | A | A | A |
| | | (6) | Initial | B | A | A | A | A | A | A |
| | | | After 100 hours | B | B | A | A | A | A | A |
| | | | After 500 hours | B | B | A | A | A | A | A |
| | | | After 1,000 hours | B | B | A | A | A | A | A |
| | | (7) | Initial | B | A | A | A | A | A | A |
| | | | After 100 hours | B | A | A | A | A | A | A |
| | | | After 500 hours | B | A | A | A | A | A | A |
| | | | After 1,000 hours | B | A | A | A | A | A | A |

| | | Connection structure | Solder particles | | Example 9 Production Example 21 | Example 10 Production Example 22 | Example 11 Production Example 23 | Example 12 Production Example 24 | Comparative Example 1 | Comparative Example 2 |
|---|---|---|---|---|---|---|---|---|---|---|
| Conduction resistance | Moisture absorption and heat resistance test | (1) | Initial | | | A | A | A | A | |
| | | | After 100 hours | | | A | A | A | A | |
| | | | After 500 hours | | | A | A | A | A | |
| | | | After 1,000 hours | | | A | A | A | A | |
| | | (2) | Initial | | A | A | A | A | | |
| | | | After 100 hours | | A | A | A | A | | |
| | | | After 500 hours | | A | A | A | A | | |
| | | | After 1,000 hours | | A | A | A | A | | |
| | | (3) | Initial | | A | | | | | A |
| | | | After 100 hours | | A | | | | | B |
| | | | After 500 hours | | A | | | | | B |
| | | | After 1,000 hours | | A | | | | | B |
| | | (4) | Initial | | A | | | | | A |
| | | | After 100 hours | | A | | | | | B |
| | | | After 500 hours | | A | | | | | B |
| | | | After 1,000 hours | | A | | | | | B |
| | | (5) | Initial | | | | | | | A |
| | | | After 100 hours | | | | | | | B |
| | | | After 500 hours | | | | | | | B |
| | | | After 1,000 hours | | | | | | | C |
| | | (6) | Initial | | | | | | | A |
| | | | After 100 hours | | | | | | | B |
| | | | After 500 hours | | | | | | | C |
| | | | After 1,000 hours | | | | | | | C |
| | | (7) | Initial | | | | | | | C |
| | | | After 100 hours | | | | | | | C |
| | | | After 500 hours | | | | | | | D |
| | | | After 1,000 hours | | | | | | | E |

TABLE 4

| | | Connection structure | Solder particles | Example 1 Production Example 13 | Example 2 Production Example 14 | Example 3 Production Example 15 | Example 4 Production Example 16 | Example 5 Production Example 17 | Example 6 Production Example 18 | Example 7 Production Example 19 | Example 8 Production Example 20 |
|---|---|---|---|---|---|---|---|---|---|---|---|
| Conduction resistance | High temperature endurance test | (1) | Initial | | | | | | | | |
| | | | After 100 hours | | | | | | | | |
| | | | After 500 hours | | | | | | | | |
| | | | After 1,000 hours | | | | | | | | |
| | | (3) | Initial | | | A | A | A | A | A | A |
| | | | After 100 hours | | | B | A | A | A | A | A |
| | | | After 500 hours | | | B | A | A | A | A | A |
| | | | After 1,000 hours | | | B | A | A | A | A | A |

TABLE 4-continued

| | | | | | | | | | | |
|---|---|---|---|---|---|---|---|---|---|---|
| | (6) | Initial | A | A | A | A | A | A | A |
| | | After 100 hours | B | A | A | A | A | A | A |
| | | After 500 hours | B | A | A | A | A | A | A |
| | | After 1,000 hours | B | A | A | A | A | A | A |

| | Connection structure | Solder particles | | Example 9 Production Example 21 | Example 10 Production Example 22 | Example 11 Production Example 23 | Example 12 Production Example 24 | Comparative Example 1 | Comparative Example 2 |
|---|---|---|---|---|---|---|---|---|---|
| Conduction resistance | High temperature endurance test | (1) | Initial | | A | A | A | A | |
| | | | After 100 hours | | A | A | A | A | |
| | | | After 500 hours | | A | A | A | A | |
| | | | After 1,000 hours | | A | A | A | A | |
| | | (3) | Initial | A | | | | | A |
| | | | After 100 hours | A | | | | | B |
| | | | After 500 hours | A | | | | | B |
| | | | After 1,000 hours | A | | | | | B |
| | | (6) | Initial | | | | | | B |
| | | | After 100 hours | | | | | | C |
| | | | After 500 hours | | | | | | D |
| | | | After 1,000 hours | | | | | | D |

TABLE 5

| | | Connection structure | Solder particles | Example 1 Production Example 13 | Example 2 Production Example 14 | Example 3 Production Example 15 | Example 4 Production Example 16 | Example 5 Production Example 17 | Example 6 Production Example 18 | Example 7 Production Example 19 | Example 8 Production Example 20 |
|---|---|---|---|---|---|---|---|---|---|---|---|
| Insulation resistance | Moisture absorption and heat resistance test | (1) | Initial | | | | | | | | |
| | | | After 100 hours | | | | | | | | |
| | | | After 500 hours | | | | | | | | |
| | | | After 1,000 hours | | | | | | | | |
| | | (2) | Initial | | | | | | | | A |
| | | | After 100 hours | | | | | | | | A |
| | | | After 500 hours | | | | | | | | A |
| | | | After 1,000 hours | | | | | | | | A |
| | | (3) | Initial | | | A | A | A | A | A | A |
| | | | After 100 hours | | | A | A | A | A | A | A |
| | | | After 500 hours | | | A | A | A | A | A | A |
| | | | After 1,000 hours | | | A | A | A | A | A | A |
| | | (4) | Initial | | | A | A | A | A | A | A |
| | | | After 100 hours | | | A | A | A | A | A | A |
| | | | After 500 hours | | | A | A | A | A | A | A |
| | | | After 1,000 hours | | | A | A | A | A | A | A |
| | | (5) | Initial | A | A | A | A | A | A | A | A |
| | | | After 100 hours | A | A | A | A | A | A | A | B |
| | | | After 500 hours | A | A | A | A | A | A | A | B |
| | | | After 1,000 hours | A | A | A | A | A | A | A | B |
| | | (6) | Initial | A | A | A | A | A | A | A | |
| | | | After 100 hours | A | A | A | A | A | B | | |
| | | | After 500 hours | A | A | A | A | A | B | | |
| | | | After 1,000 hours | A | A | A | A | A | B | | |
| | | (7) | Initial | A | A | A | A | | | | |
| | | | After 100 hours | A | A | A | B | | | | |
| | | | After 500 hours | A | A | A | B | | | | |
| | | | After 1,000 hours | A | A | A | B | | | | |

TABLE 5-continued

| | | | Example 9 Production Example 21 | Example 10 Production Example 22 | Example 11 Production Example 23 | Example 12 Production Example 24 | Comparative Example 1 | Comparative Example 2 |
|---|---|---|---|---|---|---|---|---|
| Insulation resistance | Moisture absorption and heat resistance test | (1) Initial | | A | A | A | C | |
| | | After 100 hours | | A | B | B | C | |
| | | After 500 hours | | A | B | B | D | |
| | | After 1,000 hours | | A | B | B | D | |
| | | (2) Initial | A | A | A | | D | |
| | | After 100 hours | A | A | B | | D | |
| | | After 500 hours | A | A | B | | D | |
| | | After 1,000 hours | A | A | B | | E | |
| | | (3) Initial | A | | | | | C |
| | | After 100 hours | A | | | | | C |
| | | After 500 hours | A | | | | | C |
| | | After 1,000 hours | A | | | | | D |
| | | (4) Initial | A | | | | | D |
| | | After 100 hours | B | | | | | D |
| | | After 500 hours | B | | | | | E |
| | | After 1,000 hours | B | | | | | E |
| | | (5) Initial | | | | | | D |
| | | After 100 hours | | | | | | D |
| | | After 500 hours | | | | | | D |
| | | After 1,000 hours | | | | | | E |
| | | (6) Initial | | | | | | E |
| | | After 100 hours | | | | | | E |
| | | After 500 hours | | | | | | E |
| | | After 1,000 hours | | | | | | E |
| | | (7) Initial | | | | | | E |
| | | After 100 hours | | | | | | E |
| | | After 500 hours | | | | | | E |
| | | After 1,000 hours | | | | | | E |

<Evaluation of Solder Particles>

(Step e1) to (Step h1) were performed in the same manner as in Example 1 except that the solder particles obtained in Production Example 1 were used, and an adhesive film to which the solder particles were transferred was obtained. This adhesive film was cut to 10 cm×10 cm, Pt sputtering was performed on a surface on which the solder particles were disposed, and observation was then performed using an SEM. 300 solder particles were observed, the average diameter B (average particle diameter) of the solder particles, the average diameter A of the flat portion, the roundness, and A/B and Y/X were calculated. In addition, the same measurement was performed using the solder particles of Production Examples 2 to 12. The results are shown in Table 6. Roundness: ratio r/R of radii of two concentric circles (a radius r of a minimum circumscribed circle, and a radius R of a maximum inscribed circle) of solder particles A/B: a ratio of the diameter A of the flat portion to the diameter B of solder particles Y/X: a ratio of Y to X when distances between opposite sides were set as X and Y (where Y<X) and a quadrangle circumscribing a projected image of a solder particle was created by two pairs of parallel lines

TABLE 6

| | | Production Example 1 | Production Example 2 | Production Example 3 | Production Example 4 | Production Example 5 | Production Example 6 | Production Example 7 | Production Example 8 | Production Example 9 | Production Example 10 | Production Example 11 | Production Example 12 |
|---|---|---|---|---|---|---|---|---|---|---|---|---|---|
| Average diameter B | μm | 1 | 1.5 | 2 | 3 | 4 | 5 | 6 | 10 | 15 | 20 | 25 | 30 |
| Diameter A of flat portion | μm | 0.2 | 0.3 | 0.4 | 0.5 | 0.6 | 0.7 | 0.8 | 1.4 | 2.0 | 3.6 | 4.5 | 5.1 |
| Roundness | | 0.93 | 0.93 | 0.93 | 0.93 | 0.93 | 0.93 | 0.93 | 0.93 | 0.93 | 0.93 | 0.93 | 0.93 |
| A/B | | 0.2 | 0.2 | 0.2 | 0.17 | 0.15 | 0.14 | 0.13 | 0.14 | 0.13 | 0.18 | 0.18 | 0.17 |
| Y/X | | 0.94 | 0.92 | 0.92 | 0.93 | 0.93 | 0.91 | 0.91 | 0.92 | 0.9 | 0.87 | 0.84 | 0.82 |

Here, (a) of FIG. 24 and (b) of FIG. 24 are diagrams showing an SEM image of the solder particles formed in Production Example 17, and FIG. 25 is a diagram showing an SEM image of the solder particles used in Comparative Example 1.

In addition, (a) of FIG. 26 and (b) of FIG. 26 are diagrams showing an SEM image of the solder particles 1 that are uniformly disposed so that the flat portions 11 face the same surface side. That is, (b) of FIG. 8 is a diagram showing the solder particles 1 when viewed from the side of the surface 2c of the first resin layer. More specifically, in this figure, after Step c1 in Production Example 17 was performed, the insulating resin material 2a was brought into contact with the surface on the opening side of the recesses 62 containing the solder particles 1, the solder particles 1 were transferred to the surface 2c of the first resin layer, and the solder particles 1 were observed from the side of the surface 2c of the first resin layer. In this figure, it was confirmed that the solder particles 1 in which directions of the flat portions 11 were aligned could be disposed on the surface of the resin layer.

<Production Example 49>

Solder particles were produced, collected and evaluated in the same manner as in Production Example 1 except that, in Step b1, a base material having a cross-sectional shape (a recess shape similar to that of (b) of FIG. 4) shown in FIG. 27, that is, a plurality of recesses with a bottom diameter a of 0.6 μm, an opening diameter b1 of 1.0 μm, and an opening diameter b2 of 1.2 μm (when the opening part was viewed from the top, the bottom diameter a of 0.6 μmφ corresponded to the opening diameter b2 of 1.2 μmφ at the center) was used, and the following Step c2 was performed in place of Step c1. The results are shown in Table 8.

(Step c2) Formation of solder particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 50 to 60

Solder particles were produced, collected and evaluated in the same manner as in Production Example 49 except that the size of the recess was changed as shown in Table 7. The results are shown in Table 8.

Production Example 61

Solder particles were produced, collected and evaluated in the same manner as in Production Example 1 except that, in Step b1, a base material having a cross-sectional shape shown in (e) of FIG. 4, that is, a plurality of recesses having an opening part of 1.2 μm and having an inverted conical shape whose diameter decreased from the opening part to the bottom was used, and the following Step c2 was performed in place of Step c1. The results are shown in Table 8.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 62 to 72

Solder particles were produced, collected and evaluated in the same manner as in Production Example 61 except that the size of the recess was changed as shown in Table 7. The results are shown in Table 8.

Production Example 73

Solder particles were produced, collected and evaluated in the same manner as in Production Example 1 except that, in Step b1, a base material having a cross-sectional shape shown in (h) of FIG. 4, that is, a plurality of recesses having an opening part of 1.2 μm, and a bottom having a continuous curved surface in which the continuous curved surface was convex from the opening part in a depth direction was used, and the following Step c2 was performed in place of Step c1. The results are shown in Table 8. Here, the depth in this case was a distance to a point at which the vertical line drawn from the line parallel to the surface of the base material on which the opening part was positioned intersected the deepest position of the continuous curved surface of the bottom.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 74 to 84

Solder particles were produced, collected and evaluated in the same manner as in Production Example 61 except that the size of the recess was changed as shown in Table 7. The results are shown in Table 8.

Examples 13 to 24

An anisotropic conductive film and a connection structure were produced in the same method as in Example 1 except that the solder particles produced in the same method as in Production Examples 49 to 60 were used and a transfer mold having the same shape as the base material used in production of the solder particles of Production Examples 49 to 60 was used as a transfer mold. The results are shown in Tables 9 to 11.

Examples 25 to 36

An anisotropic conductive film and a connection structure were produced in the same method as in Example 1 except that the solder particles produced in the same method as in Production Example 61 to 72 were used and a transfer mold having the same shape as the base material used in production of the solder particles of Production Examples 61 to 72 was used as a transfer mold. The results are shown in Tables 12 to 14.

Examples 37 to 48

An anisotropic conductive film and a connection structure were produced in the same method as in Example 1 except that the solder particles produced in the same method as in Production Examples 73 to 84 were used and a transfer mold having the same shape as the base material used in production of the solder particles of Production Examples 73 to 84 was used as a transfer mold. The results are shown in Tables 15 to 17.

It was confirmed that the solder particles obtained in Production Example 49 to Production Example 60 exhibited the same performance as the solder particles obtained in Production Example 13 to Production Example 24. In addition, the solder particles obtained in Production Example 49 to Production Example 60 had a shape having a flat portion on a part as in Production Example 13 to Production Example 24.

It was confirmed that the solder particles obtained in Production Example 61 to Production Example 72 exhibited the same performance as the solder particles obtained in Production Example 13 to Production Example 24. In addition, it was confirmed that the solder particles obtained in Production Example 61 to Production Example 72 had a pseudo-conical shape in which the cross-sectional diameter continuously changed.

It was confirmed that the solder particles obtained in Production Example 73 to Production Example 84 exhibited the same performance as the solder particles obtained in Production Example 13 to Production Example 24. In addition, it was confirmed that the solder particles obtained in Production Example 73 to Production Example 84 had a pseudo-spherical shape. Here, this shape had an advantage that, when electrodes were connected to each other using a resin adhesive film, the resin was able to be easily removed when a pressure was applied, and the electrodes and the solder particles easily came in contact with each other to obtain a stable connection.

TABLE 7

|  |  | Production Example 49 | Production Example 50 | Production Example 51 | Production Example 52 | Production Example 53 | Production Example 54 | Production Example 55 | Production Example 56 | Production Example 57 | Production Example 58 | Production Example 59 | Production Example 60 |
|---|---|---|---|---|---|---|---|---|---|---|---|---|---|
| Opening diameter b2 | μm | 1.2 | 1.7 | 2.3 | 3.3 | 4.3 | 5.3 | 6.3 | 12 | 18 | 30 | 38 | 48 |
| Opening diameter b1 | μm | 1 | 1.5 | 2 | 3 | 4 | 5 | 6 | 10 | 15 | 25 | 30 | 40 |
| Bottom diameter a | μm | 0.6 | 0.8 | 1.2 | 1.6 | 2 | 2 | 4 | 6 | 7 | 14 | 17 | 25 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

|  |  | Production Example 61 | Production Example 62 | Production Example 63 | Production Example 64 | Production Example 65 | Production Example 66 | Production Example 67 | Production Example 68 | Production Example 69 | Production Example 70 | Production Example 71 | Production Example 72 |
|---|---|---|---|---|---|---|---|---|---|---|---|---|---|
| Opening diameter b | μm | 1.2 | 1.7 | 2.3 | 3.3 | 4.3 | 5.3 | 6.3 | 12 | 18 | 30 | 38 | 48 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

|  |  | Production Example 73 | Production Example 74 | Production Example 75 | Production Example 76 | Production Example 77 | Production Example 78 | Production Example 79 | Production Example 80 | Production Example 81 | Production Example 82 | Production Example 83 | Production Example 84 |
|---|---|---|---|---|---|---|---|---|---|---|---|---|---|
| Opening diameter b | μm | 1.2 | 1.7 | 2.3 | 3.3 | 4.3 | 5.3 | 6.3 | 12 | 18 | 30 | 38 | 48 |
| Depth | μm | 1 | 1.5 | 2 | 3 | 4 | 5 | 6 | 10 | 15 | 15 | 15 | 15 |
| Interval | μm | 1 | 1.5 | 2 | 3 | 4 | 5 | 6 | 10 | 15 | 20 | 25 | 30 |

TABLE 8

|  |  | Production Example 49 | Production Example 50 | Production Example 51 | Production Example 52 | Production Example 53 | Production Example 54 | Production Example 55 | Production Example 56 | Production Example 57 | Production Example 58 | Production Example 59 | Production Example 60 |
|---|---|---|---|---|---|---|---|---|---|---|---|---|---|
| Average particle diameter | μm | 1.1 | 1.5 | 2 | 3 | 4 | 5 | 6 | 10 | 15 | 20 | 25 | 30 |
| C.V. value | % | 15 | 15 | 14 | 10 | 7.9 | 7.8 | 6.6 | 5.2 | 4.4 | 4.2 | 3.9 | 3.3 |

|  |  | Production Example 61 | Production Example 62 | Production Example 63 | Production Example 64 | Production Example 65 | Production Example 66 | Production Example 67 | Production Example 68 | Production Example 69 | Production Example 70 | Production Example 71 | Production Example 72 |
|---|---|---|---|---|---|---|---|---|---|---|---|---|---|
| Average particle diameter | μm | 0.9 | 1.3 | 1.8 | 2.7 | 3.8 | 4.8 | 6 | 9 | 14 | 19 | 24 | 29 |
| C.V. value | % | 19 | 17 | 16 | 13 | 12 | 11 | 9.3 | 8.8 | 7.8 | 6.9 | 6.1 | 5.5 |

TABLE 8-continued

| | | Production Example 73 | Production Example 74 | Production Example 75 | Production Example 76 | Production Example 77 | Production Example 78 | Production Example 79 | Production Example 80 | Production Example 81 | Production Example 82 | Production Example 83 | Production Example 84 |
|---|---|---|---|---|---|---|---|---|---|---|---|---|---|
| Average particle diameter | μm | 1 | 1.5 | 2 | 3 | 4 | 5 | 6 | 10 | 15 | 20 | 25 | 30 |
| C.V. value | % | 13 | 13 | 10 | 9.1 | 7.5 | 7.1 | 6.3 | 5 | 4.2 | 4.1 | 3.7 | 3.2 |

TABLE 9

| | | Connection structure | Solder particles | | Example 13 Production Example 49 | Example 14 Production Example 50 | Example 15 Production Example 51 | Example 16 Production Example 52 | Example 17 Production Example 53 | Example 18 Production Example 54 |
|---|---|---|---|---|---|---|---|---|---|---|
| Conduction resistance | Moisture absorption and heat resistance test | (1) | Initial | | | | | | | |
| | | | After 100 hours | | | | | | | |
| | | | After 500 hours | | | | | | | |
| | | | After 1,000 hours | | | | | | | |
| | | (2) | Initial | | | | | | | |
| | | | After 100 hours | | | | | | | |
| | | | After 500 hours | | | | | | | |
| | | | After 1,000 hours | | | | | | | |
| | | (3) | Initial | | | | A | A | A | A |
| | | | After 100 hours | | | | B | B | A | A |
| | | | After 500 hours | | | | B | B | A | A |
| | | | After 1,000 hours | | | | B | B | A | A |
| | | (4) | Initial | | | | A | A | A | A |
| | | | After 100 hours | | | | B | A | A | A |
| | | | After 500 hours | | | | B | A | A | A |
| | | | After 1,000 hours | | | | B | A | A | A |
| | | (5) | Initial | | A | A | A | A | A | A |
| | | | After 100 hours | | B | B | A | A | A | A |
| | | | After 500 hours | | B | B | A | A | A | A |
| | | | After 1,000 hours | | B | B | A | A | A | A |
| | | (6) | Initial | | B | A | A | A | A | A |
| | | | After 100 hours | | B | B | A | A | A | A |
| | | | After 500 hours | | B | B | A | A | A | A |
| | | | After 1,000 hours | | B | B | A | A | A | A |
| | | (7) | Initial | | B | A | A | A | A | A |
| | | | After 100 hours | | B | A | A | A | A | A |
| | | | After 500 hours | | B | A | A | A | A | A |
| | | | After 1,000 hours | | B | A | A | A | A | A |

| | | Connection structure | Solder particles | | Example 19 Production Example 55 | Example 20 Production Example 56 | Example 21 Production Example 57 | Example 22 Production Example 58 | Example 23 Production Example 59 | Example 24 Production Example 60 |
|---|---|---|---|---|---|---|---|---|---|---|
| Conduction resistance | Moisture absorption and heat resistance test | (1) | Initial | | | | | A | A | A |
| | | | After 100 hours | | | | | A | A | A |
| | | | After 500 hours | | | | | A | A | A |
| | | | After 1,000 hours | | | | | A | A | A |
| | | (2) | Initial | | A | A | A | A | | |
| | | | After 100 hours | | B | A | A | A | | |
| | | | After 500 hours | | B | A | A | A | | |
| | | | After 1,000 hours | | B | A | A | A | | |
| | | (3) | Initial | | A | A | A | | | |
| | | | After 100 hours | | A | A | A | | | |
| | | | After 500 hours | | A | A | A | | | |
| | | | After 1,000 hours | | A | A | A | | | |
| | | (4) | Initial | | A | A | A | | | |
| | | | After 100 hours | | A | A | A | | | |
| | | | After 500 hours | | A | A | A | | | |
| | | | After 1,000 hours | | A | A | A | | | |
| | | (5) | Initial | | A | A | | | | |
| | | | After 100 hours | | A | A | | | | |
| | | | After 500 hours | | A | A | | | | |
| | | | After 1,000 hours | | A | A | | | | |
| | | (6) | Initial | | A | | | | | |
| | | | After 100 hours | | A | | | | | |
| | | | After 500 hours | | A | | | | | |
| | | | After 1,000 hours | | A | | | | | |

TABLE 9-continued

| | | | |
|---|---|---|---|
| (7) | Initial | A | |
| | After 100 hours | A | |
| | After 500 hours | A | |
| | After 1,000 hours | A | |

TABLE 10

| | | | | Example 13 Production Example 49 | Example 14 Production Example 50 | Example 15 Production Example 51 | Example 16 Production Example 52 | Example 17 Production Example 53 | Example 18 Production Example 54 |
|---|---|---|---|---|---|---|---|---|---|
| Conduction resistance | High temperature endurance test | (1) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | B | A | A | A |
| | | | After 500 hours | | | B | A | A | A |
| | | | After 1,000 hours | | | B | A | A | A |
| | | (6) | Initial | A | A | A | A | A | A |
| | | | After 100 hours | B | A | A | A | A | A |
| | | | After 500 hours | B | A | A | A | A | A |
| | | | After 1,000 hours | B | A | A | A | A | A |

| | | | | Example 19 Production Example 55 | Example 20 Production Example 56 | Example 21 Production Example 57 | Example 22 Production Example 58 | Example 23 Production Example 59 | Example 24 Production Example 60 |
|---|---|---|---|---|---|---|---|---|---|
| Conduction resistance | High temperature endurance test | (1) | Initial | | | | A | A | A |
| | | | After 100 hours | | | | A | A | A |
| | | | After 500 hours | | | | A | A | A |
| | | | After 1,000 hours | | | | A | A | A |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (6) | Initial | A | | | | | |
| | | | After 100 hours | A | | | | | |
| | | | After 500 hours | A | | | | | |
| | | | After 1,000 hours | A | | | | | |

TABLE 11

| | | | | Example 13 Production Example 49 | Example 14 Production Example 50 | Example 15 Production Example 51 | Example 16 Production Example 52 | Example 17 Production Example 53 | Example 18 Production Example 54 |
|---|---|---|---|---|---|---|---|---|---|
| Insulation resistance | Moisture absorption and heat resistance test | (1) | Initial | | | | | | |
| | | | After 100 hours | | | | | | |
| | | | After 500 hours | | | | | | |
| | | | After 1,000 hours | | | | | | |
| | | (2) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | A | A | A | A |
| | | | After 500 hours | | | A | A | A | A |
| | | | After 1,000 hours | | | A | A | A | A |
| | | (4) | Initial | | | A | A | A | A |
| | | | After 100 hours | | | A | A | A | A |
| | | | After 500 hours | | | A | A | A | A |
| | | | After 1,000 hours | | | A | A | A | A |
| | | (5) | Initial | A | A | A | A | A | A |
| | | | After 100 hours | A | A | A | A | A | A |
| | | | After 500 hours | A | A | A | A | A | A |
| | | | After 1,000 hours | A | A | A | A | A | A |
| | | (6) | Initial | A | A | A | A | A | A |
| | | | After 100 hours | A | A | A | A | A | B |
| | | | After 500 hours | A | A | A | A | A | B |
| | | | After 1,000 hours | A | A | A | A | A | B |

TABLE 11-continued

| | | | | | | | | | |
|---|---|---|---|---|---|---|---|---|---|
| | | (7) | Initial | A | A | A | A | | |
| | | | After 100 hours | A | A | A | B | | |
| | | | After 500 hours | A | A | A | B | | |
| | | | After 1,000 hours | A | A | A | B | | |

| | Connection structure | Solder particles | | Example 19 Production Example 55 | Example 20 Production Example 56 | Example 21 Production Example 57 | Example 22 Production Example 58 | Example 23 Production Example 59 | Example 24 Production Example 60 |
|---|---|---|---|---|---|---|---|---|---|
| Insulation resistance | Moisture absorption and heat resistance test | (1) | Initial | | | | A | A | A |
| | | | After 100 hours | | | | A | B | B |
| | | | After 500 hours | | | | A | B | B |
| | | | After 1,000 hours | | | | A | B | B |
| | | (2) | Initial | | A | A | A | A | |
| | | | After 100 hours | | A | A | A | B | |
| | | | After 500 hours | | A | A | A | B | |
| | | | After 1,000 hours | | A | A | A | B | |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (4) | Initial | A | A | A | | | |
| | | | After 100 hours | A | A | B | | | |
| | | | After 500 hours | A | A | B | | | |
| | | | After 1,000 hours | A | A | B | | | |
| | | (5) | Initial | A | A | | | | |
| | | | After 100 hours | A | B | | | | |
| | | | After 500 hours | A | B | | | | |
| | | | After 1,000 hours | A | B | | | | |
| | | (6) | Initial | A | | | | | |
| | | | After 100 hours | | | | | | |
| | | | After 500 hours | | | | | | |
| | | | After 1,000 hours | | | | | | |
| | | (7) | Initial | | | | | | |
| | | | After 100 hours | | | | | | |
| | | | After 500 hours | | | | | | |
| | | | After 1,000 hours | | | | | | |

TABLE 12

| | Connection structure | Solder particles | | Example 25 Production Example 61 | Example 26 Production Example 62 | Example 27 Production Example 63 | Example 28 Production Example 64 | Example 29 Production Example 65 | Example 30 Production Example 66 |
|---|---|---|---|---|---|---|---|---|---|
| Conduction resistance | Moisture absorption and heat resistance test | (1) | Initial | | | | | | |
| | | | After 100 hours | | | | | | |
| | | | After 500 hours | | | | | | |
| | | | After 1,000 hours | | | | | | |
| | | (2) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | B | B | A | A |
| | | | After 500 hours | | | B | B | A | A |
| | | | After 1,000 hours | | | B | B | A | A |
| | | (4) | Initial | | | A | A | A | A |
| | | | After 100 hours | | | B | A | A | A |
| | | | After 500 hours | | | B | A | A | A |
| | | | After 1,000 hours | | | B | A | A | A |
| | | (5) | Initial | A | A | A | A | A | A |
| | | | After 100 hours | B | B | A | A | A | A |
| | | | After 500 hours | B | B | A | A | A | A |
| | | | After 1,000 hours | B | B | A | A | A | A |
| | | (6) | Initial | B | A | A | A | A | A |
| | | | After 100 hours | B | B | A | A | A | A |
| | | | After 500 hours | B | B | A | A | A | A |
| | | | After 1,000 hours | B | B | A | A | A | A |
| | | (7) | Initial | B | A | A | A | A | A |
| | | | After 100 hours | B | A | A | A | A | A |
| | | | After 500 hours | B | A | A | A | A | A |
| | | | After 1,000 hours | B | A | A | A | A | A |

TABLE 12-continued

| | Connection structure | Solder particles | | Example 31 Production Example 67 | Example 32 Production Example 68 | Example 33 Production Example 69 | Example 34 Production Example 70 | Example 35 Production Example 71 | Example 36 Production Example 72 |
|---|---|---|---|---|---|---|---|---|---|
| Conduction resistance | Moisture absorption and heat resistance test | (1) | Initial | | | | A | A | A |
| | | | After 100 hours | | | | A | A | A |
| | | | After 500 hours | | | | A | A | A |
| | | | After 1,000 hours | | | | A | A | A |
| | | (2) | Initial | | A | A | A | A | |
| | | | After 100 hours | | B | A | A | A | |
| | | | After 500 hours | | B | A | A | A | |
| | | | After 1,000 hours | | B | A | A | A | |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (4) | Initial | A | A | A | | | |
| | | | After 100 hours | A | A | A | | | |
| | | | After 500 hours | A | A | A | | | |
| | | | After 1,000 hours | A | A | A | | | |
| | | (5) | Initial | A | A | | | | |
| | | | After 100 hours | A | A | | | | |
| | | | After 500 hours | A | A | | | | |
| | | | After 1,000 hours | A | A | | | | |
| | | (6) | Initial | A | | | | | |
| | | | After 100 hours | A | | | | | |
| | | | After 500 hours | A | | | | | |
| | | | After 1,000 hours | A | | | | | |
| | | (7) | Initial | A | | | | | |
| | | | After 100 hours | A | | | | | |
| | | | After 500 hours | A | | | | | |
| | | | After 1,000 hours | A | | | | | |

TABLE 13

| | Connection structure | Solder particles | | Example 25 Production Example 61 | Example 26 Production Example 62 | Example 27 Production Example 63 | Example 28 Production Example 64 | Example 29 Production Example 65 | Example 30 Production Example 66 |
|---|---|---|---|---|---|---|---|---|---|
| Conduction resistance | High temperature endurance test | (1) | Initial | | | | | | |
| | | | After 100 hours | | | | | | |
| | | | After 500 hours | | | | | | |
| | | | After 1,000 hours | | | | | | |
| | | (3) | Initial | | | | A | A | A |
| | | | After 100 hours | | | | B | A | A |
| | | | After 500 hours | | | | B | A | A |
| | | | After 1,000 hours | | | | B | B | A |
| | | (6) | Initial | B | A | A | A | A | A |
| | | | After 100 hours | B | A | A | A | A | A |
| | | | After 500 hours | B | B | B | A | A | A |
| | | | After 1,000 hours | B | B | B | B | A | A |

| | Connection structure | Solder particles | | Example 31 Production Example 67 | Example 32 Production Example 68 | Example 33 Production Example 69 | Example 34 Production Example 70 | Example 35 Production Example 71 | Example 36 Production Example 72 |
|---|---|---|---|---|---|---|---|---|---|
| Conduction resistance | High temperature endurance test | (1) | Initial | | | | A | A | A |
| | | | After 100 hours | | | | A | A | A |
| | | | After 500 hours | | | | A | A | A |
| | | | After 1,000 hours | | | | A | A | A |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (6) | Initial | A | | | | | |
| | | | After 100 hours | A | | | | | |
| | | | After 500 hours | A | | | | | |
| | | | After 1,000 hours | A | | | | | |

TABLE 14

| Connection structure | Solder particles | | | Example 25 Production Example 61 | Example 26 Production Example 62 | Example 27 Production Example 63 | Example 28 Production Example 64 | Example 29 Production Example 65 | Example 30 Production Example 66 |
|---|---|---|---|---|---|---|---|---|---|
| Insulation resistance | Moisture absorption and heat resistance test | (1) | Initial | | | | | | |
| | | | After 100 hours | | | | | | |
| | | | After 500 hours | | | | | | |
| | | | After 1,000 hours | | | | | | |
| | | (2) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | A | A | A | A |
| | | | After 500 hours | | | A | A | A | A |
| | | | After 1,000 hours | | | A | A | A | A |
| | | (4) | Initial | | | A | A | A | A |
| | | | After 100 hours | | | A | A | A | A |
| | | | After 500 hours | | | A | A | A | A |
| | | | After 1,000 hours | | | A | A | A | A |
| | | (5) | Initial | A | A | A | A | A | A |
| | | | After 100 hours | A | A | A | A | A | A |
| | | | After 500 hours | A | A | A | A | A | A |
| | | | After 1,000 hours | A | A | A | A | A | A |
| | | (6) | Initial | A | A | A | A | A | A |
| | | | After 100 hours | A | A | A | A | A | B |
| | | | After 500 hours | A | A | A | A | A | B |
| | | | After 1,000 hours | A | A | A | A | A | B |
| | | (7) | Initial | A | A | A | A | | |
| | | | After 100 hours | A | A | A | B | | |
| | | | After 500 hours | A | A | A | B | | |
| | | | After 1,000 hours | A | A | A | B | | |

| Connection structure | Solder particles | | | Example 31 Production Example 67 | Example 32 Production Example 68 | Example 33 Production Example 69 | Example 34 Production Example 70 | Example 35 Production Example 71 | Example 36 Production Example 72 |
|---|---|---|---|---|---|---|---|---|---|
| Insulation resistance | Moisture absorption and heat resistance test | (1) | Initial | | | | A | A | A |
| | | | After 100 hours | | | | A | B | B |
| | | | After 500 hours | | | | A | B | B |
| | | | After 1,000 hours | | | | A | B | B |
| | | (2) | Initial | | A | A | A | A | |
| | | | After 100 hours | | A | A | A | B | |
| | | | After 500 hours | | A | A | A | B | |
| | | | After 1,000 hours | | A | A | A | B | |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (4) | Initial | A | A | A | | | |
| | | | After 100 hours | A | A | B | | | |
| | | | After 500 hours | A | A | B | | | |
| | | | After 1,000 hours | A | A | B | | | |
| | | (5) | Initial | A | A | | | | |
| | | | After 100 hours | A | B | | | | |
| | | | After 500 hours | A | B | | | | |
| | | | After 1,000 hours | A | B | | | | |
| | | (6) | Initial | A | | | | | |
| | | | After 100 hours | | | | | | |
| | | | After 500 hours | | | | | | |
| | | | After 1,000 hours | | | | | | |
| | | (7) | Initial | | | | | | |
| | | | After 100 hours | | | | | | |
| | | | After 500 hours | | | | | | |
| | | | After 1,000 hours | | | | | | |

TABLE 15

| | | Connection structure | Solder particles | Example 37 Production Example 73 | Example 38 Production Example 74 | Example 39 Production Example 75 | Example 40 Production Example 76 | Example 41 Production Example 77 | Example 42 Production Example 78 |
|---|---|---|---|---|---|---|---|---|---|
| Conduction resistance | Moisture absorption and heat resistance test | (1) | Initial | | | | | | |
| | | | After 100 hours | | | | | | |
| | | | After 500 hours | | | | | | |
| | | | After 1,000 hours | | | | | | |
| | | (2) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | A | A | A | A |
| | | | After 500 hours | | | B | A | A | A |
| | | | After 1,000 hours | | | B | A | A | A |
| | | (4) | Initial | | | A | A | A | A |
| | | | After 100 hours | | | A | A | A | A |
| | | | After 500 hours | | | A | A | A | A |
| | | | After 1,000 hours | | | B | A | A | A |
| | | (5) | Initial | A | A | A | A | A | A |
| | | | After 100 hours | A | A | A | A | A | A |
| | | | After 500 hours | B | B | A | A | A | A |
| | | | After 1,000 hours | B | B | A | A | A | A |
| | | (6) | Initial | A | A | A | A | A | A |
| | | | After 100 hours | A | A | A | A | A | A |
| | | | After 500 hours | B | B | A | A | A | A |
| | | | After 1,000 hours | B | B | A | A | A | A |
| | | (7) | Initial | B | A | A | A | A | A |
| | | | After 100 hours | B | A | A | A | A | A |
| | | | After 500 hours | B | A | A | A | A | A |
| | | | After 1,000 hours | B | A | A | A | A | A |

| | | Connection structure | Solder particles | Example 43 Production Example 79 | Example 44 Production Example 80 | Example 45 Production Example 81 | Example 46 Production Example 82 | Example 47 Production Example 83 | Example 48 Production Example 84 |
|---|---|---|---|---|---|---|---|---|---|
| Conduction resistance | Moisture absorption and heat resistance test | (1) | Initial | | | | A | A | A |
| | | | After 100 hours | | | | A | A | A |
| | | | After 500 hours | | | | A | A | A |
| | | | After 1,000 hours | | | | A | A | A |
| | | (2) | Initial | | A | A | A | A | |
| | | | After 100 hours | | B | A | A | A | |
| | | | After 500 hours | | B | A | A | A | |
| | | | After 1,000 hours | | B | A | A | A | |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (4) | Initial | A | A | A | | | |
| | | | After 100 hours | A | A | A | | | |
| | | | After 500 hours | A | A | A | | | |
| | | | After 1,000 hours | A | A | A | | | |
| | | (5) | Initial | A | A | | | | |
| | | | After 100 hours | A | A | | | | |
| | | | After 500 hours | A | A | | | | |
| | | | After 1,000 hours | A | A | | | | |
| | | (6) | Initial | A | | | | | |
| | | | After 100 hours | A | | | | | |
| | | | After 500 hours | A | | | | | |
| | | | After 1,000 hours | A | | | | | |
| | | (7) | Initial | A | | | | | |
| | | | After 100 hours | A | | | | | |
| | | | After 500 hours | A | | | | | |
| | | | After 1,000 hours | A | | | | | |

TABLE 16

| | | Connection structure | Solder particles | Example 37 Production Example 73 | Example 38 Production Example 74 | Example 39 Production Example 75 | Example 40 Production Example 76 | Example 41 Production Example 77 | Example 42 Production Example 78 |
|---|---|---|---|---|---|---|---|---|---|
| Conduction resistance | High temperature endurance test | (1) | Initial | | | | | | |
| | | | After 100 hours | | | | | | |
| | | | After 500 hours | | | | | | |
| | | | After 1,000 hours | | | | | | |

TABLE 16-continued

| | | | | | Example 37 Production Example 73 | Example 38 Production Example 74 | Example 39 Production Example 75 | Example 40 Production Example 76 | Example 41 Production Example 77 | Example 42 Production Example 78 |
|---|---|---|---|---|---|---|---|---|---|---|
| | | (3) | Initial | | | | | A | A | A | A |
| | | | After 100 hours | | | | | A | A | A | A |
| | | | After 500 hours | | | | | A | A | A | A |
| | | | After 1,000 hours | | | | | B | A | A | A |
| | | (6) | Initial | | A | A | A | A | A | A |
| | | | After 100 hours | | A | A | A | A | A | A |
| | | | After 500 hours | | B | A | A | A | A | A |
| | | | After 1,000 hours | | B | A | A | A | A | A |

| | | Connection structure | Solder particles | | Example 43 Production Example 79 | Example 44 Production Example 80 | Example 45 Production Example 81 | Example 46 Production Example 82 | Example 47 Production Example 83 | Example 48 Production Example 84 |
|---|---|---|---|---|---|---|---|---|---|---|
| Conduction resistance | High temperature endurance test | (1) | Initial | | | | | A | A | A |
| | | | After 100 hours | | | | | A | A | A |
| | | | After 500 hours | | | | | A | A | A |
| | | | After 1,000 hours | | | | | A | A | A |
| | | (3) | Initial | | A | A | A | | | |
| | | | After 100 hours | | A | A | A | | | |
| | | | After 500 hours | | A | A | A | | | |
| | | | After 1,000 hours | | A | A | A | | | |
| | | (6) | Initial | | A | | | | | |
| | | | After 100 hours | | A | | | | | |
| | | | After 500 hours | | A | | | | | |
| | | | After 1,000 hours | | A | | | | | |

TABLE 17

| | | Connection structure | Solder particles | | Example 37 Production Example 73 | Example 38 Production Example 74 | Example 39 Production Example 75 | Example 40 Production Example 76 | Example 41 Production Example 77 | Example 42 Production Example 78 |
|---|---|---|---|---|---|---|---|---|---|---|
| Insulation resistance | Moisture absorption and heat resistance test | (1) | Initial | | | | | | | |
| | | | After 100 hours | | | | | | | |
| | | | After 500 hours | | | | | | | |
| | | | After 1,000 hours | | | | | | | |
| | | (2) | Initial | | | | | | | |
| | | | After 100 hours | | | | | | | |
| | | | After 500 hours | | | | | | | |
| | | | After 1,000 hours | | | | | | | |
| | | (3) | Initial | | | | | A | A | A | A |
| | | | After 100 hours | | | | | A | A | A | A |
| | | | After 500 hours | | | | | A | A | A | A |
| | | | After 1,000 hours | | | | | A | A | A | A |
| | | (4) | Initial | | | | | A | A | A | A |
| | | | After 100 hours | | | | | A | A | A | A |
| | | | After 500 hours | | | | | A | A | A | A |
| | | | After 1,000 hours | | | | | A | A | A | A |
| | | (5) | Initial | | A | A | A | A | A | A |
| | | | After 100 hours | | A | A | A | A | A | A |
| | | | After 500 hours | | A | A | A | A | A | A |
| | | | After 1,000 hours | | A | A | A | A | A | A |
| | | (6) | Initial | | A | A | A | A | A | A |
| | | | After 100 hours | | A | A | A | A | A | B |
| | | | After 500 hours | | A | A | A | A | A | B |
| | | | After 1,000 hours | | A | A | A | A | A | B |
| | | (7) | Initial | | A | A | A | A | | |
| | | | After 100 hours | | A | A | A | B | | |
| | | | After 500 hours | | A | A | A | B | | |
| | | | After 1,000 hours | | A | A | A | B | | |

| | | Connection structure | Solder particles | | Example 43 Production Example 79 | Example 44 Production Example 80 | Example 45 Production Example 81 | Example 46 Production Example 82 | Example 47 Production Example 83 | Example 48 Production Example 84 |
|---|---|---|---|---|---|---|---|---|---|---|
| Insulation resistance | Moisture absorption and heat resistance test | (1) | Initial | | | | | A | A | A |
| | | | After 100 hours | | | | | A | A | A |
| | | | After 500 hours | | | | | A | B | B |
| | | | After 1,000 hours | | | | | A | B | B |
| | | (2) | Initial | | A | A | A | A | | |
| | | | After 100 hours | | A | A | A | B | | |
| | | | After 500 hours | | A | A | A | B | | |
| | | | After 1,000 hours | | A | A | A | B | | |
| | | (3) | Initial | | A | A | A | | | |
| | | | After 100 hours | | A | A | A | | | |
| | | | After 500 hours | | A | A | A | | | |
| | | | After 1,000 hours | | A | A | A | | | |

TABLE 17-continued

|     |                 |   |   |   |
|-----|-----------------|---|---|---|
| (4) | Initial         | A | A | A |
|     | After 100 hours | A | A | B |
|     | After 500 hours | A | A | B |
|     | After 1,000 hours | A | A | B |
| (5) | Initial         | A | A |   |
|     | After 100 hours | A | B |   |
|     | After 500 hours | A | B |   |
|     | After 1,000 hours | A | B |   |
| (6) | Initial         | A |   |   |
|     | After 100 hours |   |   |   |
|     | After 500 hours |   |   |   |
|     | After 1,000 hours |   |   |   |
| (7) | Initial         |   |   |   |
|     | After 100 hours |   |   |   |
|     | After 500 hours |   |   |   |
|     | After 1,000 hours |   |   |   |

Production Examples 85 to 87

Solder particles were produced, collected and evaluated in the same manner as in Production Example 1 except that 10 g of Sn—Bi solder fine particles (Type 9 commercially available from 5N Plus, a melting point of 139° C., an average particle diameter of 3.0 μm, and a C.V. value of 32%) were used in Step a1, the recess shown in Table 18 was used in Step b1, and the following Step c2 was performed in place of Step c1. The results are shown in Table 19.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 88 to 90

Solder particles were produced, collected and evaluated in the same manner as in Production Example 1 except that 10 g of Sn—Bi solder fine particles (Type 10 commercially available from 5N Plus, a melting point of 139° C., an average particle diameter of 2.8 μm, and a C.V. value of 28%) were used in Step a1, the recess shown in Table 18 was used in Step b1, and the following Step c2 was performed in place of Step c1. The results are shown in Table 19.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Production Examples 91 to 93

100 g of In—Sn solder fine particles (Type 8 commercially available from 5N Plus, a melting point of 120° C.) were immersed in distilled water and ultrasonically dispersed and then left, the solder fine particles suspended in the supernatant were collected, and solder fine particles having an average particle diameter of 1.0 μm and a C.V. value of 40% were obtained. Solder particles were produced, collected and evaluated in the same manner as in Production Example 1 except that the solder fine particles (an average particle diameter of 1.0 μm and a C.V. value of 40%) were used in Step a1, the recess shown in Table 18 was used in Step b1, and the following Step c2 was performed in place of Step c1. The results are shown in Table 19.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was then introduced into the furnace, and the inside of the furnace was filled with hydrogen gas. Then, the temperature in the furnace was adjusted to 110° C. and hydrogen radicals were emitted for 5 minutes. Then, hydrogen gas in the furnace was removed by evacuation, heating was performed to 160° C., nitrogen was then introduced into the furnace to return to atmospheric pressure, the temperature in the furnace was then lowered to room temperature, and thereby solder particles were formed.

Production Examples 94 to 96

100 g of Sn—Ag—Cu solder fine particles (Type 8 commercially available from 5N Plus, a melting point of 219° C.) were immersed in distilled water and ultrasonically dispersed and then left, the solder fine particles suspended in the supernatant were collected, and solder fine particles having an average particle diameter of 1.0 µm and a C.V. value of 41% were obtained. Solder particles were produced, collected and evaluated in the same manner as in Production Example 1 except that the solder fine particles (an average particle diameter of 1.0 µm and a C.V. value of 41%) were used in Step a1, the recess shown in Table 18 was used in Step b1, and the following Step c2 was performed in place of Step c1. The results are shown in Table 19.

(Step c2) Formation of Solder Particles

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was then introduced into the furnace, and the inside of the furnace was filled with hydrogen gas. Then, the temperature in the furnace was adjusted to 150° C. and hydrogen radicals were emitted for 3 minutes. Then, hydrogen gas in the furnace was removed by evacuation, heating was performed to 240° C., nitrogen was then introduced into the furnace to return to atmospheric pressure, the temperature in the furnace was then lowered to room temperature, and thereby solder particles were formed.

Examples 49 to 51

An anisotropic conductive film and a connection structure were produced in the same method as in Example 1 except that the solder particles produced in the same method as in Production Examples 85 to 87 were used and a transfer mold having the same shape as the base material used in production of the solder particles of Production Examples 85 to 87 was used as a transfer mold. The results are shown in Tables 20 to 22.

Examples 52 to 54

An anisotropic conductive film and a connection structure were produced in the same method as in Example 1 except that the solder particles produced in the same method as in Production Examples 88 to 90 were used and a transfer mold having the same shape as the base material used in production of the solder particles of Production Examples 88 to 90 was used as a transfer mold. The results are shown in Tables 20 to 22.

Examples 55 to 57

An anisotropic conductive film and a connection structure were produced in the same method as in Example 1 except that the solder particles produced in the same method as in Production Examples 91 to 93 were used and a transfer mold having the same shape as the base material used in production of the solder particles of Production Example 91 to 93 was used as a transfer mold. The results are shown in Tables 20 to 22.

Examples 58 to 60

An anisotropic conductive film and a connection structure were produced in the same method as in Example 1 except that the solder particles produced in the same method as in Production Examples 94 to 96 were used, a transfer mold having the same shape as the base material used in production of the solder particles of Production Examples 94 to 96 was used as a transfer mold, and in Step 11, the main compression temperature was set to 230° C. The results are shown in Tables 20 to 22.

TABLE 18

| | | Production Example 85 | Production Example 86 | Production Example 87 | Production Example 88 | Production Example 89 | Production Example 90 | Production Example 91 | Production Example 92 | Production Example 93 | Production Example 94 | Production Example 95 | Production Example 96 |
|---|---|---|---|---|---|---|---|---|---|---|---|---|---|
| Opening diameter | µm | 4.3 | 11 | 40 | 4.3 | 11 | 40 | 4.3 | 11 | 40 | 4.3 | 11 | 40 |
| Bottom diameter | µm | 4 | 10 | 40 | 4 | 10 | 40 | 4 | 10 | 40 | 4 | 10 | 40 |
| Depth | µm | 4 | 10 | 15 | 4 | 10 | 15 | 4 | 10 | 15 | 4 | 10 | 15 |
| Interval | µm | 4 | 10 | 30 | 4 | 10 | 30 | 4 | 10 | 30 | 4 | 10 | 30 |

TABLE 19

| | | Production Example 85 | Production Example 86 | Production Example 87 | Production Example 88 | Production Example 89 | Production Example 90 | Production Example 91 | Production Example 92 | Production Example 93 | Production Example 94 | Production Example 95 | Production Example 96 |
|---|---|---|---|---|---|---|---|---|---|---|---|---|---|
| Average particle diameter | µm | 4 | 10 | 30 | 4 | 10 | 30 | 4 | 10 | 30 | 4 | 10 | 30 |
| C.V. value | % | 7.4 | 5 | 3.1 | 6.7 | 4.9 | 3 | 8.3 | 5.2 | 3.2 | 7.5 | 5.2 | 5.2 |

TABLE 20

| | | Connection structure | Solder particles | Example 49 Production Example 85 | Example 50 Production Example 86 | Example 51 Production Example 87 | Example 52 Production Example 88 | Example 53 Production Example 89 | Example 54 Production Example 90 |
|---|---|---|---|---|---|---|---|---|---|
| Conduction resistance | Moisture absorption and heat resistance test | (1) | Initial | | | | A | | A |
| | | | After 100 hours | | | | A | | A |
| | | | After 500 hours | | | | A | | A |
| | | | After 1,000 hours | | | | A | | A |
| | | (2) | Initial | | A | | | A | |
| | | | After 100 hours | | B | | | B | |
| | | | After 500 hours | | B | | | B | |
| | | | After 1,000 hours | | B | | | B | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |
| | | (7) | Initial | A | | | A | | |
| | | | After 100 hours | | | | | A | A |
| | | | After 500 hours | B | A | A | A | A | A |
| | | | After 1,000 hours | B | A | A | A | A | A |

| | | Connection structure | Solder particles | Example 55 Production Example 91 | Example 56 Production Example 92 | Example 57 Production Example 93 | Example 58 Production Example 94 | Example 59 Production Example 95 | Example 60 Production Example 96 |
|---|---|---|---|---|---|---|---|---|---|
| Conduction resistance | Moisture absorption and heat resistance test | (1) | Initial | | | | A | | A |
| | | | After 100 hours | | | | A | | A |
| | | | After 500 hours | | | | A | | A |
| | | | After 1,000 hours | | | | A | | A |
| | | (2) | Initial | | A | | | A | |
| | | | After 100 hours | | B | | | B | |
| | | | After 500 hours | | B | | | B | |
| | | | After 1,000 hours | | B | | | B | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |
| | | (7) | Initial | A | | | A | | |
| | | | After 100 hours | A | | | | | |
| | | | After 500 hours | A | | | | | |
| | | | After 1,000 hours | A | | | | | |

TABLE 21

| | | | | Example 49 Production Example 85 | Example 50 Production Example 86 | Example 51 Production Example 87 | Example 52 Production Example 88 | Example 53 Production Example 89 | Example 54 Production Example 90 |
|---|---|---|---|---|---|---|---|---|---|
| Conduction resistance | High temperature endurance test | (1) | Initial | | | | A | | A |
| | | | After 100 hours | | | | A | | A |
| | | | After 500 hours | | | | A | | A |
| | | | After 1,000 hours | | | | A | | A |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |

| | | | | Example 55 Production Example 91 | Example 56 Production Example 92 | Example 57 Production Example 93 | Example 58 Production Example 94 | Example 59 Production Example 95 | Example 60 Production Example 96 |
|---|---|---|---|---|---|---|---|---|---|
| Conduction resistance | High temperature endurance test | (1) | Initial | | | | A | | A |
| | | | After 100 hours | | | | A | | A |
| | | | After 500 hours | | | | A | | A |
| | | | After 1,000 hours | | | | A | | A |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |

TABLE 22

| | | | | Example 49 Production Example 85 | Example 50 Production Example 86 | Example 51 Production Example 87 | Example 52 Production Example 88 | Example 53 Production Example 89 | Example 54 Production Example 90 |
|---|---|---|---|---|---|---|---|---|---|
| Insulation resistance | Moisture absorption and heat resistance test | (1) | Initial | | | | A | | A |
| | | | After 100 hours | | | | B | | B |
| | | | After 500 hours | | | | B | | B |
| | | | After 1,000 hours | | | | B | | B |
| | | (2) | Initial | | A | | | A | |
| | | | After 100 hours | | A | | | A | |
| | | | After 500 hours | | A | | | A | |
| | | | After 1,000 hours | | A | | | A | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | B | | A | B | |
| | | | After 500 hours | A | B | | A | B | |
| | | | After 1,000 hours | A | B | | A | B | |
| | | (6) | Initial | A | | | A | | |
| | | | After 100 hours | A | | | A | | |
| | | | After 500 hours | A | | | A | | |
| | | | After 1,000 hours | A | | | A | | |

TABLE 22-continued

| | Connection structure | Solder particles | | Example 55 Production Example 91 | Example 56 Production Example 92 | Example 57 Production Example 93 | Example 58 Production Example 94 | Example 59 Production Example 95 | Example 60 Production Example 96 |
|---|---|---|---|---|---|---|---|---|---|
| Insulation resistance | Moisture absorption and heat resistance test | (1) | Initial | | | | A | | A |
| | | | After 100 hours | | | | B | | B |
| | | | After 500 hours | | | | B | | B |
| | | | After 1,000 hours | | | | B | | B |
| | | (2) | Initial | | A | | | A | |
| | | | After 100 hours | | A | | | A | |
| | | | After 500 hours | | A | | | A | |
| | | | After 1,000 hours | | A | | | A | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | B | | A | B | |
| | | | After 500 hours | A | B | | A | B | |
| | | | After 1,000 hours | A | B | | A | B | |
| | | (6) | Initial | A | | | A | | |
| | | | After 100 hours | A | | | A | | |
| | | | After 500 hours | A | | | A | | |
| | | | After 1,000 hours | A | | | A | | |

When the size of the recess was small (for example, a bottom of 2 to 3 μm), the C.V value of the obtained solder particles tended to be lower as the central particle diameter of the solder fine particles was smaller. This is thought to be caused by the fact that, as the central particle diameter of the solder fine particles was smaller, the filling rate in the recess was higher, and the filling variation among the plurality of recesses was lower.

Based on the above examples, according to the method of the present invention, it was confirmed that solder particles having a uniform particle diameter and different melting points were easily obtained by simply changing the composition of the solder fine particles.

In addition, various cross-sectional shapes of the recesses could be used. That is, the cross-sectional shape of the recess could be appropriately selected according to the final usage method and form of the solder particles. For example, in a case of the solder particles were dispersed in the resin and flowability was secured like an ink, it is considered preferable for the surface of the solder particles to have a continuous curved surface. On the other hand, in the case of the solder particles were dispersed in the film and the solder particles were brought into contact with electrodes in a compression step, when the solder particles had a flat portion, an impact on the electrode during contact could be alleviated and damage to the electrode could be prevented. In addition, the resin whose viscosity was lowered due to heating in the compression step flowed and moved on the electrode. However, when the particles had a flat portion, since an area in contact with the electrode tended to be large and the particles quickly wet and spread on the electrode when the oxide film was removed by the flux, there was also an advantage of movement due to the resin flow being restricted. The same phenomenon was observed in the resin paste.

In addition, when solder particles having a flat part in a part were transferred to the adhesive resin film or an adhesive resin was poured into a base material to form a film and the base material was then removed, in the film, directions of the flat parts of the solder particles could be aligned in substantially the same direction. When electrodes were compressed and mounted using a film containing such solder particles, a surface of the flat part was brought into contact with the electrode made of a very thin or weak material, and thus electrode damage could be minimized. In addition, for electrodes on which wetting and spreading were unlikely to occur, a flat part was in contact with the surface during compression, and thus there was an advantage that wetting and spreading were more likely to occur due to removal of the oxide film of the solder particles than the point contact of the spherical surface. In actual use, configurations and materials of electrodes to be connected were generally different from each other, and as in this specification, when directions of the flat parts of the solder particles were substantially aligned, there was an advantage that a disposition position of the adhesive resin film was selected according to the electrode material, and more reliable connection could be realized.

In addition, when the cross-sectional shape of the recess was conical toward the bottom as shown in (e) of FIG. 4, the obtained solder particles had no acute angle part due to surface tension of the solder but had a pseudo-conical shape whose cross-sectional diameter continuously changed. For example, since such particles could be aligned and disposed in the thickness direction of the adhesive film, there were advantages that, during compression and mounting, a thin cross section part of the solder particles improved a resin exclusion property, the solder particles easily came in contact with the electrodes, and a stable connection was obtained.

REFERENCE SIGNS LIST

1 Solder particles
2 Insulating film
2a Insulating resin material
2b First resin layer
2c Surface of first resin layer
2d Second resin layer
10 Anisotropic conductive film 30 First circuit member
31 First circuit substrate
32 First electrode
40 Second circuit member
41 Second circuit substrate
42 Second electrode
50A to 50F Connection structure
55 Insulating resin layer
60 Base material
62 Recess
70 Solder layer
71 Layer of intermetallic compound
111 Solder fine particles

The invention claimed is:

1. A method for producing an anisotropic conductive film, comprising:
   a preparation step in which a base material having a plurality of recesses and powdery solder fine particles are prepared;
   an accommodation step in which at least some of the powdery solder fine particles are accommodated in the recesses;
   a fusing step in which some of the powdery solder fine particles accommodated in the recesses are fused and the solder particles are formed inside the recesses;
   a transfer step in which an insulating resin material is brought into contact with an opening side of the recesses of the base material in which the solder particles are accommodated in the recesses and a first resin layer to which the solder particles are transferred is obtained; and
   a layering step in which a second resin layer formed of an insulating resin material is formed on a surface of the first resin layer on the side to which the solder particles are transferred and thereby the anisotropic conductive film is obtained.

2. The method for producing an anisotropic conductive film according to claim 1,
   wherein the solder particles formed in the fusing step have an average particle diameter of 1 μm to 30 μm and a C.V. value of 20% or less.

3. The method for producing an anisotropic conductive film according to claim 1,
   wherein the C.V. value of the solder fine particles prepared in the preparation step is more than 20%.

4. The method for producing an anisotropic conductive film according to claim 1,
   wherein the solder fine particles accommodated in the recesses are exposed to a reducing atmosphere before the fusing step.

5. The method for producing an anisotropic conductive film according to claim 1,
   wherein, in the fusing step, the solder fine particles accommodated in the recesses are fused under a reducing atmosphere.

6. The method for producing an anisotropic conductive film according to claim 1,
   wherein the solder fine particles prepared in the preparation step comprise at least one selected from the group consisting of tin, tin alloys, indium and indium alloys.

7. The method for producing an anisotropic conductive film according to claim 6,
   wherein the solder fine particles prepared in the preparation step comprise at least one selected from the group consisting of In—Bi alloys, In—Sn alloys, In—Sn—Ag alloys, Sn—Au alloys, Sn—Bi alloys, Sn—Bi—Ag alloys, Sn—Ag—Cu alloys and Sn—Cu alloys.

8. The method for producing an anisotropic conductive film according to claim 1,
   wherein the solder particles are exposed on the surface of the first resin layer obtained in the transfer step.

9. The method for producing an anisotropic conductive film according to claim 1,
   wherein, in the transfer step, the insulating resin material is caused to enter the recesses, and thus the solder particles are embedded on the side of the surface of the first resin layer.

10. The method for producing an anisotropic conductive film according to claim 1,
    wherein the transfer step includes a step in which the insulating resin material is cured after the solder particles are transferred.

11. The method for producing an anisotropic conductive film according to claim 1, further comprising
    a coating step in which surfaces of the solder particles formed in the fusing step are coated with a flux component.

12. A method for producing a connection structure, comprising:
    preparing a first circuit member comprising a first substrate and a first electrode provided on the first substrate;
    preparing a second circuit member comprising a second electrode that is electrically connected to the first electrode;
    disposing an anisotropic conductive film between a surface of the first circuit member having the first electrode and a surface of the second circuit member having the second electrode; and
    electrically connecting the first electrode to the second electrode via a solder and adhering the first circuit member to the second circuit member, by heating a laminate comprising the first circuit member, the anisotropic conductive film, and the second circuit member while pressurizing is performed in a thickness direction of the laminate,
    wherein the anisotropic conductive film is the anisotropic conductive film produced by the production method according to claim 1.

* * * * *